United States Patent
Furutani et al.

(10) Patent No.: US 9,439,289 B2
(45) Date of Patent: Sep. 6, 2016

(54) WIRING BOARD AND METHOD FOR MANUFACTURING THE SAME

(71) Applicant: IBIDEN CO., LTD., Ogaki-shi (JP)

(72) Inventors: Toshiki Furutani, Ogaki (JP);
Yukinobu Mikado, Ogaki (JP);
Toyotaka Shimabe, Ogaki (JP);
Shinobu Kato, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 528 days.

(21) Appl. No.: 13/687,016

(22) Filed: Nov. 28, 2012

(65) Prior Publication Data

US 2013/0182401 A1 Jul. 18, 2013

Related U.S. Application Data

(60) Provisional application No. 61/585,838, filed on Jan. 12, 2012.

(51) Int. Cl.

| H05K 1/02 | (2006.01) |
|---|---|
| H05K 1/18 | (2006.01) |
| H05K 3/10 | (2006.01) |
| H05K 3/30 | (2006.01) |
| H05K 1/11 | (2006.01) |

(Continued)

(52) U.S. Cl.
CPC .............. *H05K 1/186* (2013.01); *H01L 24/19* (2013.01); *H05K 1/0296* (2013.01); *H05K 1/111* (2013.01); *H05K 1/116* (2013.01); *H05K 1/185* (2013.01); *H05K 3/10* (2013.01); *H05K 3/30* (2013.01); *H05K 3/306* (2013.01); *H01L 2224/04105* (2013.01); *H01L 2224/32225* (2013.01); *H01L 2224/73267* (2013.01); *H01L 2224/92144* (2013.01); *H01L 2924/15153* (2013.01); *H05K 3/4697* (2013.01); *H05K 2201/10636* (2013.01); *Y02P 70/611* (2015.11); *Y10T 29/49146* (2015.01)

(58) Field of Classification Search
CPC ................. H05K 1/0296; H05K 2201/09481; H05K 2201/095; H05K 2201/09645; H05K 2201/09818; H05K 1/113; H05K 1/115; H05K 1/116; H05K 1/186; H05K 1/185; H05K 1/111; H01L 24/19
USPC ................. 361/761, 763, 766, 782, 790
See application file for complete search history.

(56) References Cited

U.S. PATENT DOCUMENTS 5,205,032 A * 4/1993 Kuroda et al. ................. 29/740
6,388,207 B1 * 5/2002 Figueroa et al. ............ 174/262

(Continued)

FOREIGN PATENT DOCUMENTS

| JP | 2001-007531 | 1/2001 |
| JP | 2003-152304 | 5/2003 |

OTHER PUBLICATIONS

U.S. Appl. No. 13/562,683, filed Jul. 31, 2012, Mikado, et al.

*Primary Examiner* — Hoa C Nguyen
*Assistant Examiner* — Christopher L Augustin
(74) *Attorney, Agent, or Firm* — Oblon, McClelland, Maier & Neustadt, L.L.P

(57) ABSTRACT

A wiring board includes a substrate which has multiple opening portions and one or more boundary portions separating the opening portions, multiple electronic devices positioned in the opening portions of the substrate, respectively, a conductive pattern formed on a surface of the boundary portion, and an insulation layer formed on the substrate and the conductive pattern on the boundary portion of the substrate such that the insulation layer covers the electronic devices in the opening portions of the substrate.

20 Claims, 48 Drawing Sheets

(51) Int. Cl.
    *H01L 23/00*    (2006.01)
    *H05K 3/46*    (2006.01)

(56)             References Cited

U.S. PATENT DOCUMENTS 6,876,554 B1 *   4/2005  Inagaki et al. ............. 361/763

2001/0010250 A1      8/2001  Kobayashi et al.
    2006/0118931 A1      6/2006  Ho et al.
    2006/0243478 A1 *   11/2006  Inagaki et al. ............. 174/255
    2009/0133913 A1 *    5/2009  Kushta et al. ............. 174/260
    2010/0078205 A1      4/2010  Sakai et al.
    2012/0024583 A1 *    2/2012  Lee et al. .................. 174/260
    2012/0142147 A1      6/2012  Sakai et al.
    2012/0287586 A1     11/2012  Mikado et al.

* cited by examiner

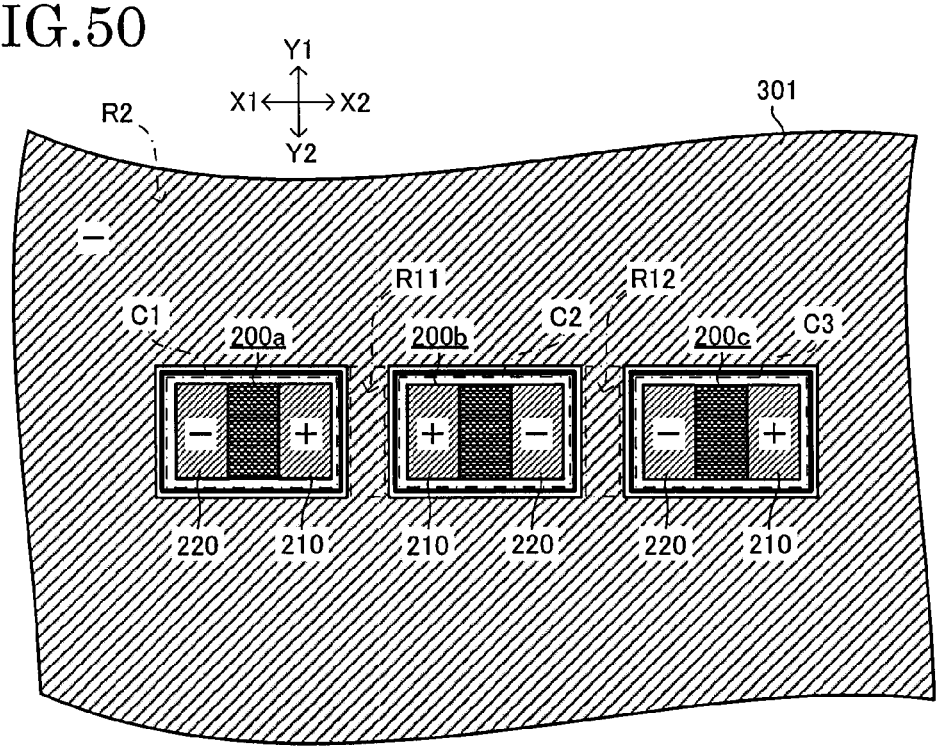
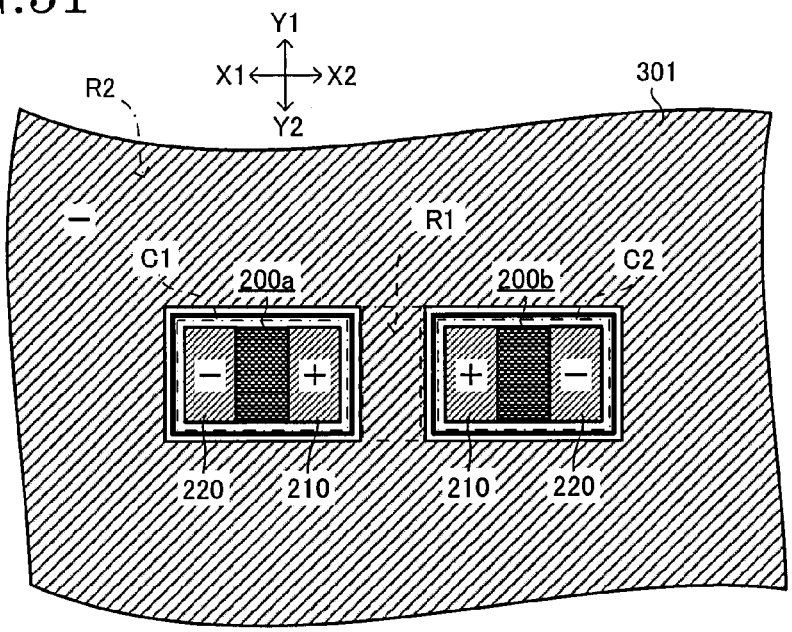

WIRING BOARD AND METHOD FOR MANUFACTURING THE SAME

CROSS-REFERENCE TO RELATED APPLICATIONS

The present application is based upon and claims the benefit of priority from U.S. Application No. 61/585,838, filed Jan. 12, 2012, the entire contents of which are incorporated herein by reference.

BACKGROUND OF THE INVENTION

1. Field of the Invention

The present invention relates to a wiring board and its manufacturing method.

2. Description of Background Art

Japanese Laid-Open Patent Publication No. 2003-152304 describes a wiring board which has a core substrate having an opening section, multiple electronic components accommodated in the opening section, and buildup layers formed on the core substrate and the electronic components. Japanese Laid-Open Patent Publication No. 2001-7531 describes a wiring board in which an assembly of chip capacitors made up of multiple chip capacitors (electronic components) is positioned in an opening section of a core substrate. Such an assembly of chip capacitors is formed with multiple chip capacitors which are integrated (encapsulated) by molding resin (epoxy resin). The contents of Japanese Laid-Open Patent Publication Nos. 2003-152304 and 2001-7531 are incorporated herein in this application.

SUMMARY OF THE INVENTION

According to one aspect of the present invention, a wiring board includes a substrate which has multiple opening portions and one or more boundary portions separating the opening portions, multiple electronic devices positioned in the opening portions of the substrate, respectively, a conductive pattern formed on a surface of the boundary portion, and an insulation layer formed on the substrate and the conductive pattern on the boundary portion of the substrate such that the insulation layer covers the electronic devices in the opening portions of the substrate.

According to another aspect of the present invention, a method for manufacturing a wiring board includes preparing a substrate, forming multiple opening portions in the substrate such that one or more boundary portions separating the opening portions is formed in the substrate, forming a conductive pattern on the boundary portion of the substrate, positioning multiple electronic devices in the opening portions, respectively, and forming an insulation layer on the substrate and the conductive pattern on the boundary portion of the substrate such that the insulation layer covers the electronic devices in the opening portions of the substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 46A, in yet another embodiment of the present invention, is a view showing an example in which a third opening portion faces both first and second opening portions with a second boundary portion placed in between;

FIG. 50, in yet another embodiment of the present invention, is a view showing an example in which opening portions for placing electronic devices are positioned linearly;

FIG. 51, in yet another embodiment of the present invention, is a view showing an example in which only two opening portions for placing electronic devices are formed;

DETAILED DESCRIPTION OF THE EMBODIMENTS

Figure 1:
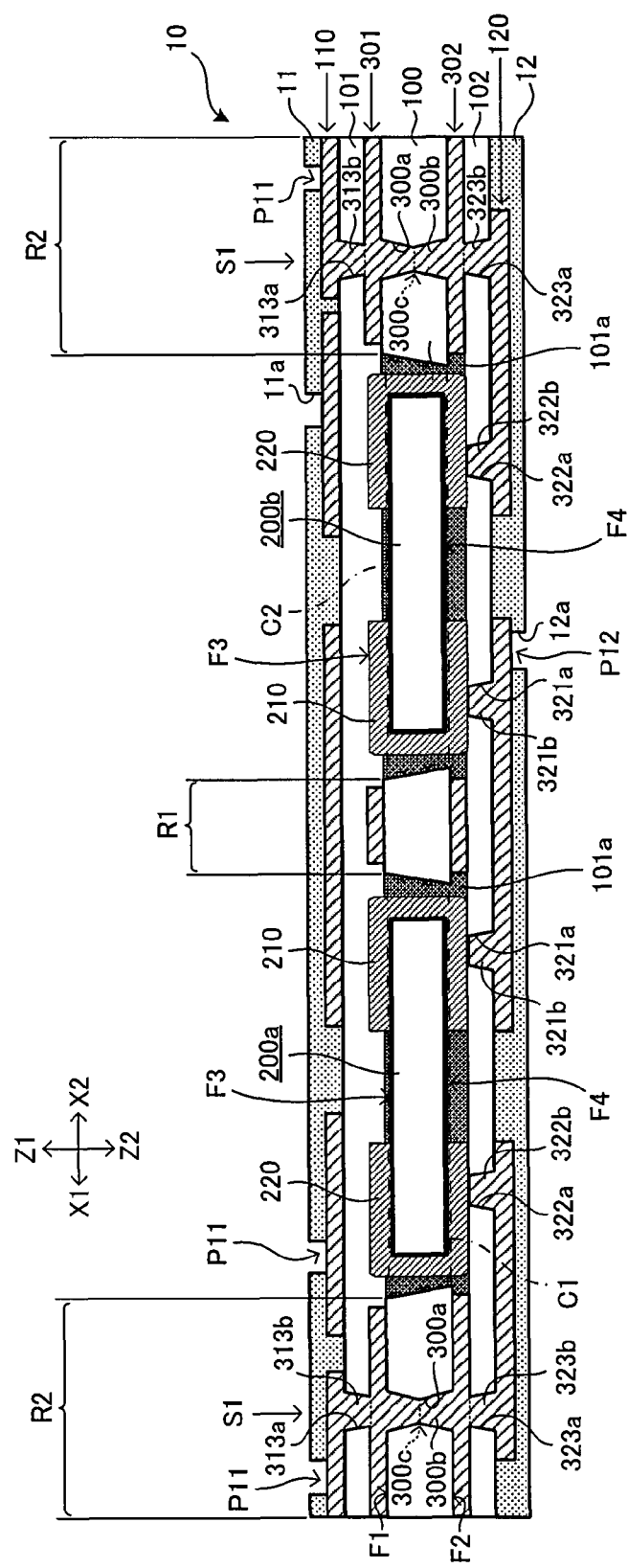
FIG. 1 is a cross-sectional view of a wiring board according to a first embodiment of the present invention.

The embodiments will now be described with reference to the accompanying drawings, wherein like reference numerals designate corresponding or identical elements throughout the various drawings.

In the following, arrows (Z1, Z2) in the drawings each indicate a lamination direction of a wiring board (or a thickness direction of the wiring board) corresponding to a direction along a normal line to main surfaces (upper and lower surfaces) of the wiring board. On the other hand, arrows (X1, X2) and (Y1, Y2) each indicate a direction perpendicular to lamination directions (or a direction to a side of each layer). The main surfaces of the wiring board are on the X-Y plane. Side surfaces of the wiring board are on the X-Z plane or the Y-Z plane.

Two main surfaces in opposing directions along a normal line are referred to as a first surface or a third surface (Z1-side surface) and as a second surface or a fourth surface (Z2-side surface). In a lamination direction, a side closer to the core is referred to as a lower layer, and a side farther from the core is referred to as an upper layer.

A conductive layer is a layer formed with one or multiple conductive patterns. A conductive layer may include a conductive pattern that forms an electrical circuit such as wiring (including ground), a pad, a land or the like. A conductive pattern may also include a planar conductive pattern or the like that does not form an electrical circuit.

Opening portions include notches, slits and so forth in addition to holes and grooves. Holes are not limited to penetrating holes, but include non-penetrating holes. Holes include via holes and through holes. In the following, the conductor formed in a via hole (on its wall surface or bottom surface) is referred to as a via conductor, and the conductor formed in a through hole (on its wall surface) is referred to as a through-hole conductor.

Plating includes wet plating such as electrolytic plating as well as dry plating such as PVD (physical vapor deposition) and CVD (chemical vapor deposition).

"Preparing" includes situations in which material and components are purchased and manufactured accordingly as well as situations in which finished products are purchased and used accordingly.

"An electronic device is positioned in an opening portion" includes situations where the entire electronic device is completely accommodated in the opening portion as well as situations where only part of the electronic device is positioned in the opening portion.

First Embodiment

Figure 2:
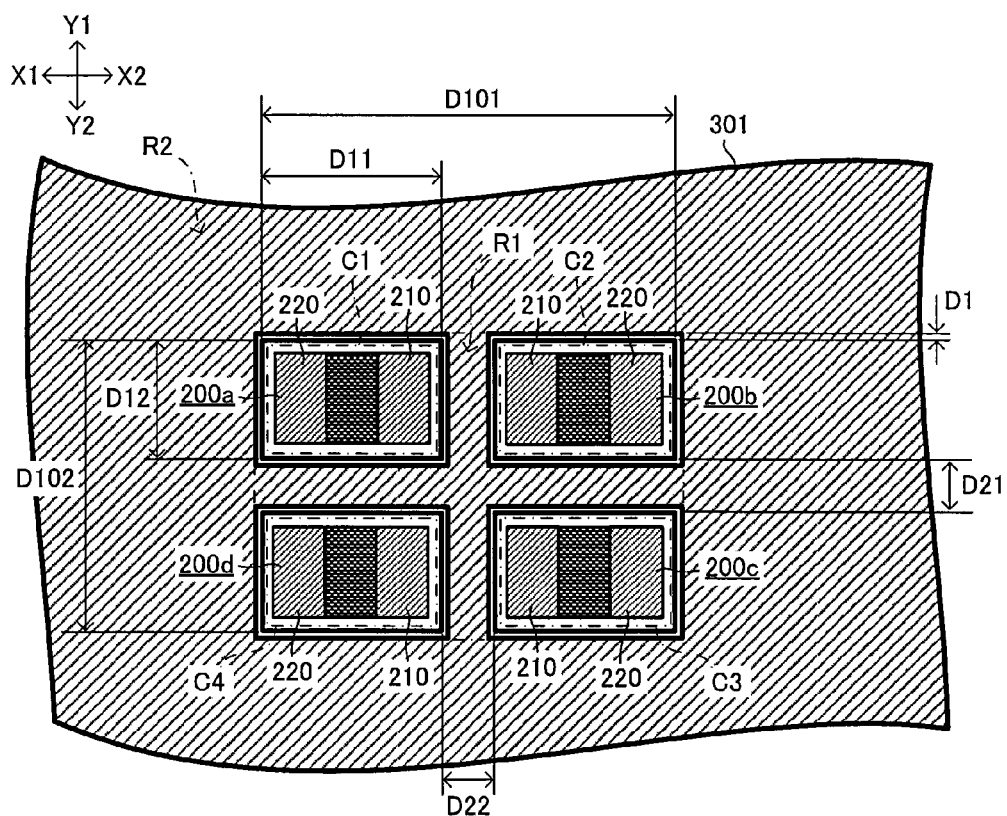
FIG. 2 is a plan view showing a core section of the wiring board according to the first embodiment of the present invention.

FIG. 1 is a cross-sectional view of a wiring board according to a first embodiment. FIG. 2 is a plan view showing a core section (especially, the section having built-in electronic devices) of a wiring board according to the first embodiment. The core section is formed with a core substrate (substrate 100) and conductive layers (conductive layers 301, 302) on both of its surfaces, and electronic devices (electronic components 200a~200d) positioned in opening portions of the core substrate (cavities C1~C4).

Wiring board 10 of the present embodiment has substrate 100 (insulative substrate), insulation layers (101, 102) (interlayer insulation layers), conductive layers (110, 120), electronic components (200a, 200b, 200c, 200d) and solder resists (11, 12) as shown in FIG. 1. Electronic components (200a, 200b, 200c, 200d) are each built into wiring board 10. Wiring board 10 of the present embodiment is a rigid wiring board. However, wiring board 10 may also be a flexible wiring board. The shape of wiring board 10 of the present embodiment is rectangular, for example. However, that is not the only option; for example, wiring board 10 may be in any other shape. Hereinafter, one of the upper and lower surfaces (two main surfaces) of substrate 100 is referred to as first surface (F1), and the other as second surface (F2). Also, regarding upper and lower surfaces (two main surfaces) of electronic components (200a~200d), those facing the same direction as first surface (F1) are each referred to as third surface (F3), and the others as fourth surface (F4).

Substrate 100 is insulative and becomes the core substrate of wiring board 10. Through holes (300a) are formed in substrate 100 (core substrate), and through-hole conductors (300b) are formed by filling conductor (copper plating, for example) in through holes (300a). Through-hole conductors (300b) are shaped like an hourglass, for example. Namely, through-hole conductor (300b) has narrowed portion (300c), and the width of through-hole conductor (300b) gradually decreases as it comes closer to narrowed portion (300c) from first surface (F1), while it comes closer to narrowed portion (300c) from second surface (F2). However, that is not the only option, and the shape of through-hole conductor (300b) is determined freely; for example, it may be substantially columnar.

Conductive layer 301 is formed on first surface (F1) of substrate 100, and conductive layer 302 is formed on second surface (F2) of substrate 100. Conductive layers (301, 302) each include a land of through-hole conductor (300b). Conductive layers (301, 302) are electrically connected to each other by through-hole conductor (300b).

Substrate 100 has cavity (C1) (first opening portion), cavity (C2) (second opening portion), cavity (C3) (third opening portion), cavity (C4) (fourth opening portion), boundary section (R1) and peripheral section (R2). Cavities (C1~C4) are each made of a hole that penetrates through substrate 100. Cavities (C1~C4) have substantially the same shape and dimensions as each other.

In the present embodiment, cavity (C1) and cavity (C2) are arrayed in direction X, cavity (C3) and cavity (C4) are arrayed in direction X, cavity (C1) and cavity (C4) are arrayed in direction Y, and cavity (C2) and cavity (C3) are arrayed in direction Y as shown in FIG. 2. In the present embodiment, the distance between cavity (C1) and cavity (C4) is substantially the same as the distance between cavity (C2) and cavity (C3), and the distance between cavity (C1) and cavity (C2) is also substantially the same as the distance between cavity (C3) and cavity (C4).

When cavities (C1~C4) are formed in substrate 100, boundary section (R1) in the shape of a grid is formed between cavities. The planar shape (X-Y plane) of boundary section (R1) is substantially in the shape of a cross. At the periphery of cavities (C1~C4), peripheral section (R2) is formed to be integrated with boundary section (R1). The substantially cruciform planar shape of boundary section (R1) is formed with a line having width (D21) in direction X (hereinafter referred to as line X) and a line having width (D22) in direction Y (hereinafter referred to as line Y), which intersect at substantially right angles.

Width (D21) corresponds to the distance between cavity (C1) (first opening portion) and cavity (C4) (fourth opening portion) or the distance between cavity (C2) (second opening portion) and cavity (C3) (third opening portion). Width (D22) corresponds to the distance between cavity (C1) (first opening portion) and cavity (C2) (second opening portion) or the distance between cavity (C3) (third opening portion) and cavity (C4) (fourth opening portion).

Figure 3:
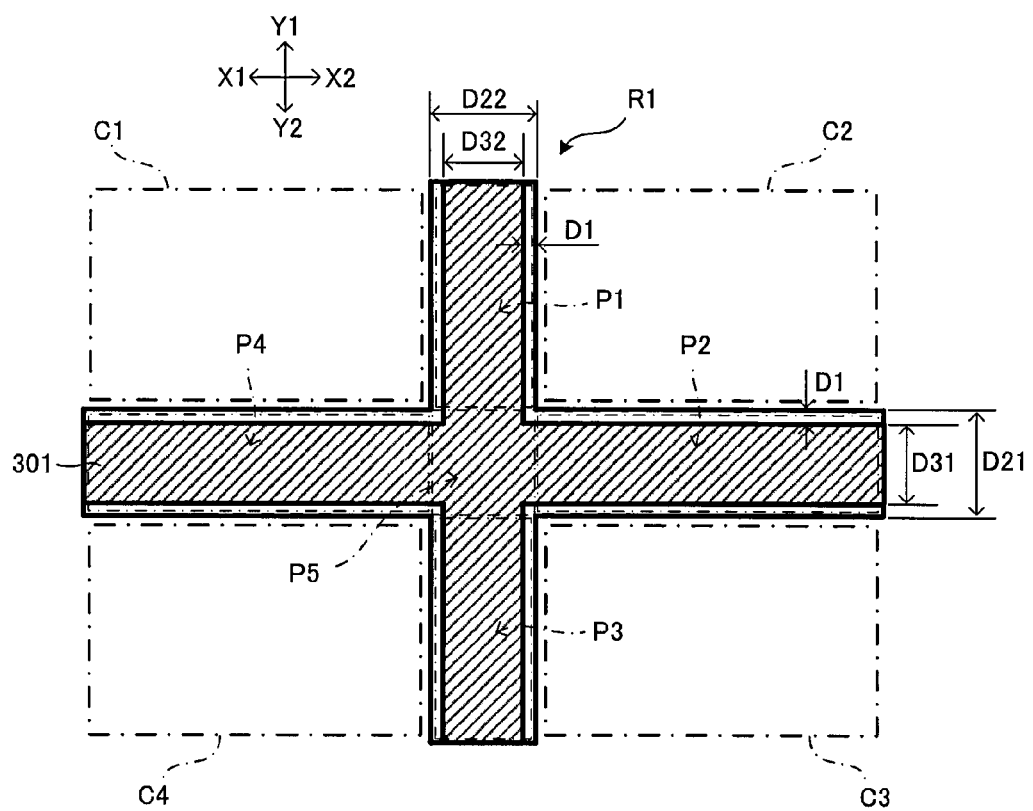
FIG. 3 is a magnified view showing the boundary section of the core section shown in FIG. 2.

FIG. 3 is a magnified view of boundary section (R1) of the core section shown in FIG. 2. FIGS. 2 and 3 show only the structure of the core section of wiring board 10 (especially the section of built-in electronic devices) seen from the first-surface (F1) side (or the third-surface (F3) side). The core section seen from the second-surface (F2) side (or the fourth-surface (F4) side) has substantially the same structure.

Boundary section (R1) is formed with first boundary portion (P1), second boundary portion (P2), third boundary portion (P3), fourth boundary portion (P4) and intersection (P5) as shown in FIG. 3. First boundary portion (P1), second boundary portion (P2), third boundary portion (P3) and fourth boundary portion (P4) are formed to be integrated with intersection (P5). Second boundary portion (P2) and fourth boundary portion (P4) each form line X, and first boundary portion (P1) and third boundary portion (P3) each form line Y. Line X and line Y intersect at intersection (P5). Conductive patterns on first boundary portion (P1) and third boundary portion (P3) each have a linear planar shape (X-Y plane) along direction Y, for example, and conductive patterns on second boundary portion (P2) and fourth boundary portion (P4) each have a linear planar shape (X-Y plane) along direction X, for example.

First boundary portion (P1) separates cavity (C1) (first opening portion) and cavity (C2) (second opening portion), second boundary portion (P2) separates cavity (C2) (second opening portion) and cavity (C3) (third opening portion), third boundary portion (P3) separates cavity (C3) (third opening portion) and cavity (C4) (fourth opening portion), and fourth boundary portion (P4) separates cavity (C4) (fourth opening portion) and cavity (C1) (first opening portion).

Cavity (C2) (second opening portion) faces cavity (C1) (first opening portion) with first boundary portion (P1) in between, while facing cavity (C3) (third opening portion) with second boundary portion (P2) in between. Cavity (C4) (fourth opening portion) faces cavity (C1) (first opening portion) with fourth boundary portion (P4) in between, while facing the third opening portion with third boundary portion (P3) in between.

A conductive pattern in substantially a cruciform shape is formed on boundary section (R1) having a substantially cruciform planar shape (X-Y plane). Such a substantially cruciform conductive pattern is included in conductive layer 301 or 302, for example (see FIG. 1). Since all the conductive patterns included in conductive layer 301 or 302 are formed simultaneously in the present embodiment, the thickness of a substantially cruciform conductive pattern on boundary section (R1) is substantially equal to the thickness of other conductive patterns included in conductive layer 301 or 302.

As shown in FIG. 2, a planar conductive pattern is formed on peripheral section (R2). Such a planar conductive pattern is formed on substantially the entire region of substrate 100, for example. Such a planar conductive pattern is included in conductive layer 301 or 302 (see FIG. 1). Since all the conductive patterns included in conductive layer 301 or 302 are formed simultaneously in the present embodiment, the thickness of a planar conductive pattern on peripheral section (R2) is substantially equal to the thickness of other conductive patterns included in conductive layer 301 or 302.

In the present embodiment, the substantially cruciform conductive pattern on boundary section (R1) is formed to be integrated with the planar conductive pattern on peripheral section (R2). In doing so, it is easier to enhance the strength of boundary section (R1). By forming a conductive pattern on boundary section (R1) to be integrated with the conductive pattern on peripheral section (R2), the resistance of the planar conductive pattern on peripheral section (R2) is thought to be reduced. However, the above is not the only option, and those conductive patterns may also be separated from each other.

As shown in FIG. 2, electronic component (200a) (first electronic device) is positioned in cavity (C1) (first opening portion), electronic component (200b) (second electronic device) is positioned in cavity (C2) (second opening portion), electronic component (200c) (third electronic device) is positioned in cavity (C3) (third opening portion), and electronic component (200d) (fourth electronic device) is positioned in cavity (C4) (fourth opening portion). Electronic components (200a~200d) are each positioned to a side (direction X or direction Y) of substrate 100 by being positioned in cavities (C1~C4). In the present embodiment, the positions of electronic components (200a~200d) (and their respective cavities (C1~C4)) on the X-Y plane correspond to each corner of a rectangle.

Electronic components (200a~200d) are the same type of electronic component as each other in the present embodiment. In particular, electronic components (200a~200d) are each a chip capacitor having electrodes which are formed to cover from the upper surface to a side surface to the lower surface (see FIGS. 4A~5B). The electronic components (chip capacitors) that form electronic components (200a~200d) (first through fourth electronic devices) work even if positioned in other positions (cavities). Since all the electronic devices (electronic components (200a~200d)) positioned in cavities (C1~C4) are the same type of electronic component in the present embodiment, it is sufficient to prepare one type of electronic component. Also, positioning electronic components in cavities is simplified, making it easier to manufacture the wiring board.

Figure 4A:
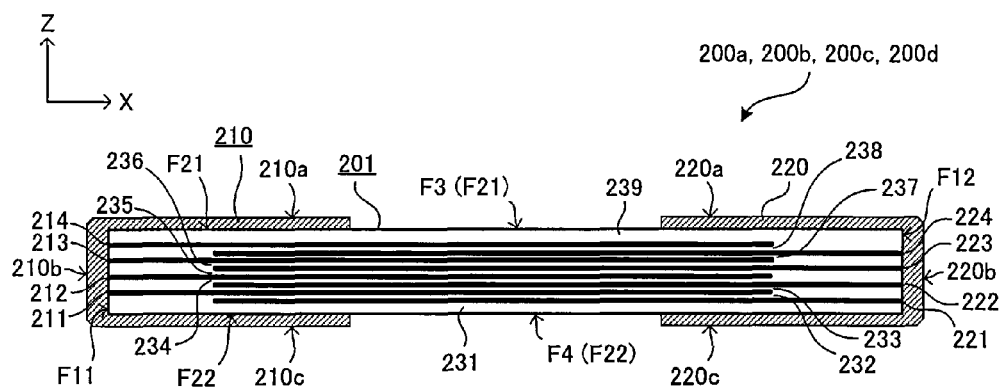
FIG. 4A is a view showing a first cross-sectional shape of a chip capacitor built into the wiring board according to the first embodiment of the present invention.
Figure 4B:
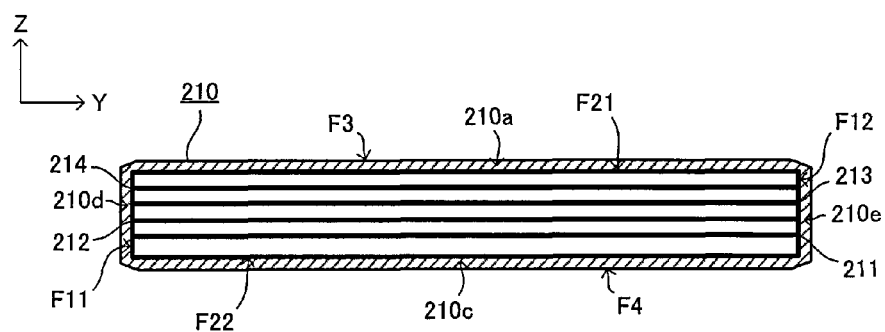
FIG. 4B is a view showing a second cross-sectional shape of a chip capacitor built into the wiring board according to the first embodiment of the present invention.
Figure 5A:
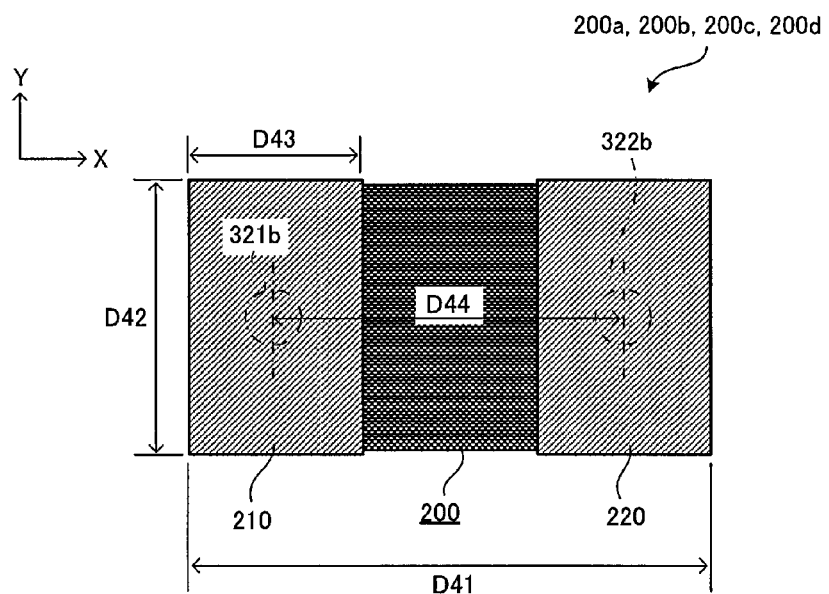
FIG. 5A is a plan view of a chip capacitor built into the wiring board according to the first embodiment of the present invention.
Figure 5B:
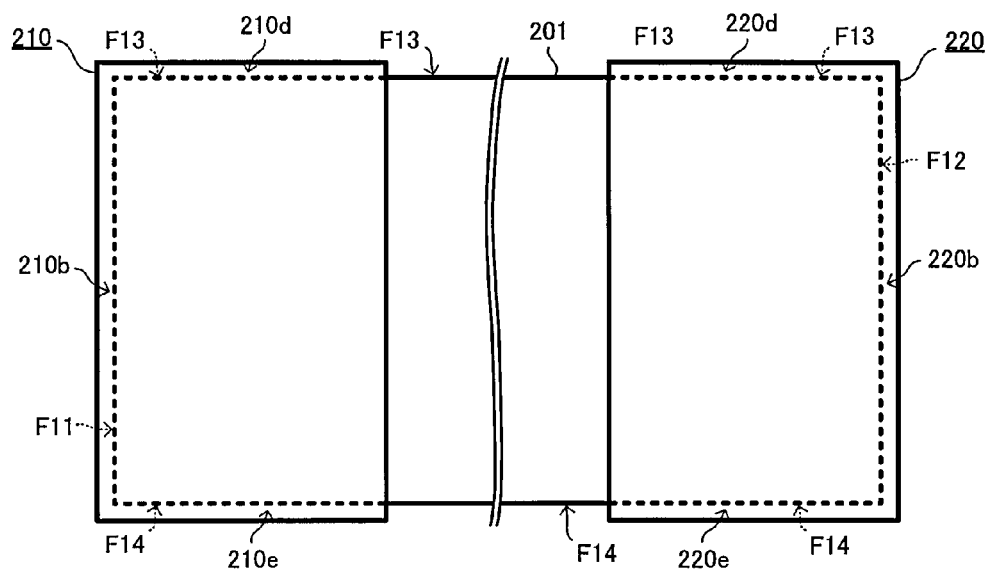
FIG. 5B is a view showing electrodes formed on side surfaces of each chip capacitor built into the wiring board according to the first embodiment of the present invention.

In the following, the structure of electronic components (200a~200d) (chip capacitors) to be built into wiring board 10 of the present embodiment is described with reference to FIGS. 4A~5B. FIG. 4A is a view showing a first cross-sectional shape (X-Z cross section) of electronic components (200a~200d). FIG. 4B is a view showing a second cross-sectional shape (Y-Z cross section) of electronic components (200a~200d). FIG. 5A is a plan view of electronic components (200a~200d). FIG. 5B is a view showing electrodes formed on side surfaces of electronic components (200a~200d).

Electronic components (200a~200d) are each a chip-type MLCC (multi-layer ceramic capacitor) and have capacitor body 201 and electrodes (210, 220) as shown in FIGS. 4A~5B, for example. Capacitor body 201 is formed by alternately laminating multiple dielectric layers (231~239), multiple conductive layers (211~214) and (221~224). Dielectric layers (231~239) are each made of ceramic, for example. Electrodes (210, 220) are formed on their respective end portions of capacitor body 201.

Electrodes (210, 220) each have a U-shaped cross-section (X-Z cross section) as shown in FIG. 4A. Electronic components (200a~200d) each have first side portion (210b) (first side electrode) of electrode 210 on first side surface (F11), and second side portion (220b) (second side electrode) of electrode 220 on second side surface (F12) which is opposite first side surface (F11). Capacitor body 201 is covered with electrodes (210, 220) from lower surface (F22) (the surface on the fourth-surface (F4) side) to first side surface (F11) or second side surface (F12) to upper surface (F21) (the surface on the third-surface (F3) side). Here, electrode 210 is formed with upper portion (210a) partially covering the upper surface of capacitor body 201, first side portion (210b) (first side electrode) covering the entire first side surface (F11) of capacitor body 201, and lower portion (210c) partially covering the lower surface of capacitor body 201. Also, electrode 220 is formed with upper portion (220a) partially covering the upper surface of capacitor body 201, second side portion (220b) (second side electrode) covering the entire second side surface (F12) of capacitor body 201, and lower portion (220c) partially covering the lower surface of capacitor body 201. In the present embodiment, upper portion (210a), first side portion (210b) and lower portion (210c) of electrode 210 are integrated, and upper portion (220a), second side portion (220b) and lower portion (220c) of electrode 220 are integrated.

As shown in FIG. 5B, regarding third side surface (F13) and fourth side surface (F14) on both sides of first side surface (F11), third side portion (210d) (third side electrode) of electrode 210 is positioned on third side surface (F13), and fourth side portion (210e) (fourth side electrode) of electrode 210 is positioned on fourth side surface (F14). Also, regarding third side surface (F13) and fourth side surface (F14) on both sides of second side surface (F12), fifth side portion (220d) of electrode 220 is positioned on third side surface (F13), and sixth side portion (220e) of electrode 220 is positioned on fourth side surface (F14). Third side portion (210d) and fourth side portion (210e) are each formed to be integrated with first side portion (210b) (first side electrode), and fifth side portion (220d) and sixth side portion (220e) are each formed to be integrated with second side portion (220b) (second side electrode).

The central portion of capacitor body 201 positioned between electrode 210 and electrode 220 is not covered by electrodes (210, 220) as shown in FIG. 5A, and dielectric layers (231, 239) (ceramic) are exposed. Thus, its strength is relatively low. However, when electronic components (200a~200d) are mounted on (built into) wiring board 10, since the central portion of capacitor body 201 is covered with insulator (101a) or the like (resin), capacitor body 201 is thought to be protected by insulator (101a) or the like.

As shown in FIG. 2, the opening shape of both ends of cavities (C1~C4) (first-surface (F1) side and second-surface (F2) side) is rectangular. In the present embodiment, the longitudinal direction of each electronic component (electronic device) and the direction in which electrodes (210, 220) are arrayed are the same, both in direction X. However, that is not the only option, and a pair of electrodes may be arrayed along the lateral direction of each electronic device.

As shown in FIGS. 2 and 5B, electrode 210 (especially first side portion (210b)) and electrode 220 (especially second side portion (220b)) of electronic component (200a) are arrayed in substantially a straight line (direction X, for example) with electrode 210 (especially first side portion (210b)) and electrode 220 (especially second side portion (220b)) of electronic component (200b) (second electronic device). In addition, electrode 210 (especially first side portion (210b)) of electronic component (200a) and electrode 210 (especially first side portion (210b)) of electronic component (200b) face each other and have substantially the same electric potential (see later-described FIGS. 7A and 7B, for example).

As shown in FIGS. 2 and 5B, electrode 210 (especially first side portion (210b)) and electrode 220 (especially second side portion (220b)) of electronic component (200c) are arrayed in substantially a straight line (direction X, for example) with electrode 210 (especially first side portion (210b)) and electrode 220 (especially second side portion (220b)) of electronic component (200d). In addition, electrode 210 (especially first side portion (210b)) of electronic component (200c) and electrode 210 (especially first side portion (210)) of electronic component (200d) face each other and have substantially the same electric potential (see later-described FIGS. 7A and 7B, for example).

As shown in FIGS. 2 and 5B, third side portion (210d) and fourth side portion (210e) of electrode 210 of electronic component (200a) are arrayed in substantially a straight line (direction Y, for example) with third side portion (210d) and fourth side portion (210e) of electrode 210 of electronic component (200d) (fourth electronic device). In addition, third side portion (210d) of electrode 210 of electronic component (200a) and fourth side portion (210e) of electrode 210 of electronic component (200d) face each other and have substantially the same electric potential (see later-described FIGS. 7A and 7B, for example).

As shown in FIGS. 2 and 5B, third side portion (210d) and fourth side portion (210e) of electrode 210 of electronic component (200b) are arrayed in substantially a straight line (direction Y, for example) with third side portion (210d) and fourth side portion (210e) of electrode 210 of electronic component (200c). In addition, fourth side portion (210e) of electrode 210 of electronic component (200b) and third side portion (210d) of electrode 210 of electronic component (200c) face each other and have substantially the same electric potential (see later-described FIGS. 7A and 7B, for example).

In the present embodiment, one electronic device (such as an electronic component) is positioned in one opening portion (cavity). Also, substantially the entire electronic device is completely accommodated in an opening portion in the present embodiment. However, that is not the only option, and only part of an electronic device may be positioned in an opening portion.

Figure 6A:
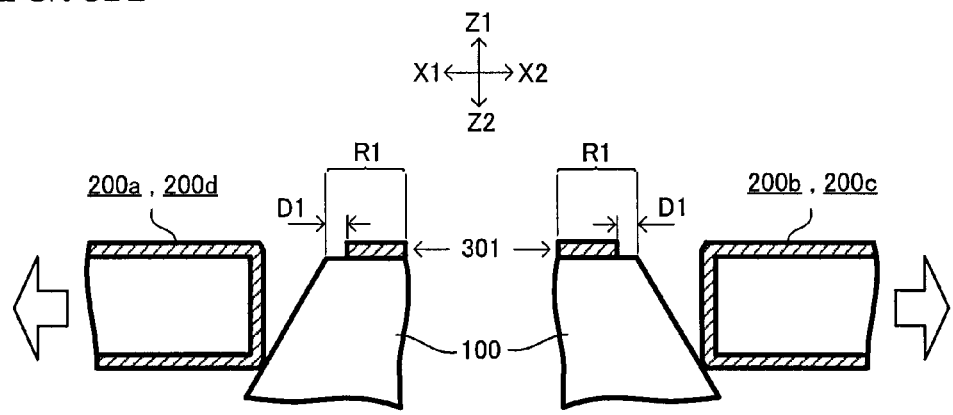
FIG. 6A is a view showing a state in which the movement of electronic devices is controlled by wall surfaces of the substrate (boundary section)
Figure 6B:
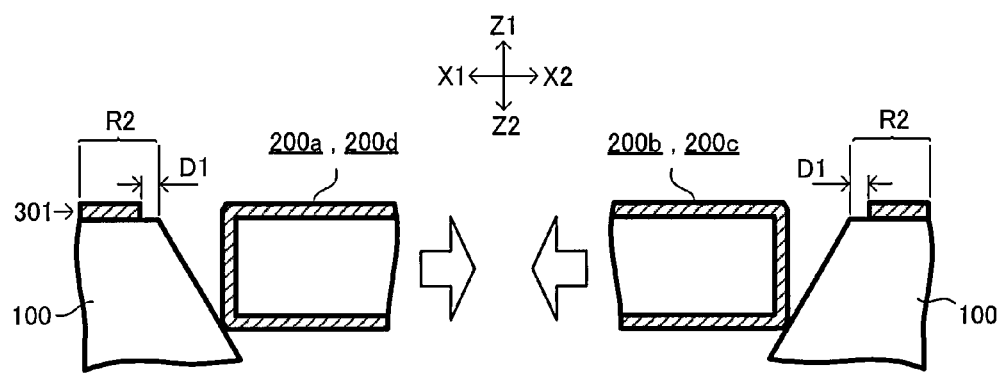
FIG. 6B is a view showing a state in which the movement of electronic devices is controlled by wall surfaces of the substrate (peripheral section)

In the present embodiment, electronic components (200a~200d) are surrounded by their respective wall surfaces of cavities (C1~C4) (cut surfaces of substrate 100 formed by a laser, die or the like). Wall surfaces of cavities (C1~C4) are each a tapered surface. Specifically, each wall surface of cavities (C1~C4) tapers so that the widths of cavities (C1~C4) gradually decrease from first surface (F1) toward second surface (F2) as shown in FIGS. 1, 6A and 6B. Accordingly, as shown in FIG. 6A or 6B, when electronic components (200a~200d) make a move to go outside cavities (C1~C4), such movement is regulated by the wall surfaces of boundary section (R1) or peripheral section (R2) of substrate 100 while force toward the inside of cavities (C1~C4) is exerted on electronic components (200a~200d) by the tilted wall surfaces of boundary section (R1) or peripheral section (R2). As a result, shifting of positions seldom occurs in electronic components (200a~200d).

Also, the opening area at one end (Z1 side) of each of cavities (C1~C4) is greater than the opening area at the other end (Z2 side). Accordingly, it is easy to place electronic components (200a~200d) into cavities (C1~C4) from the first-surface (F1) side (Z1 side) of substrate 100.

Figure 7A:
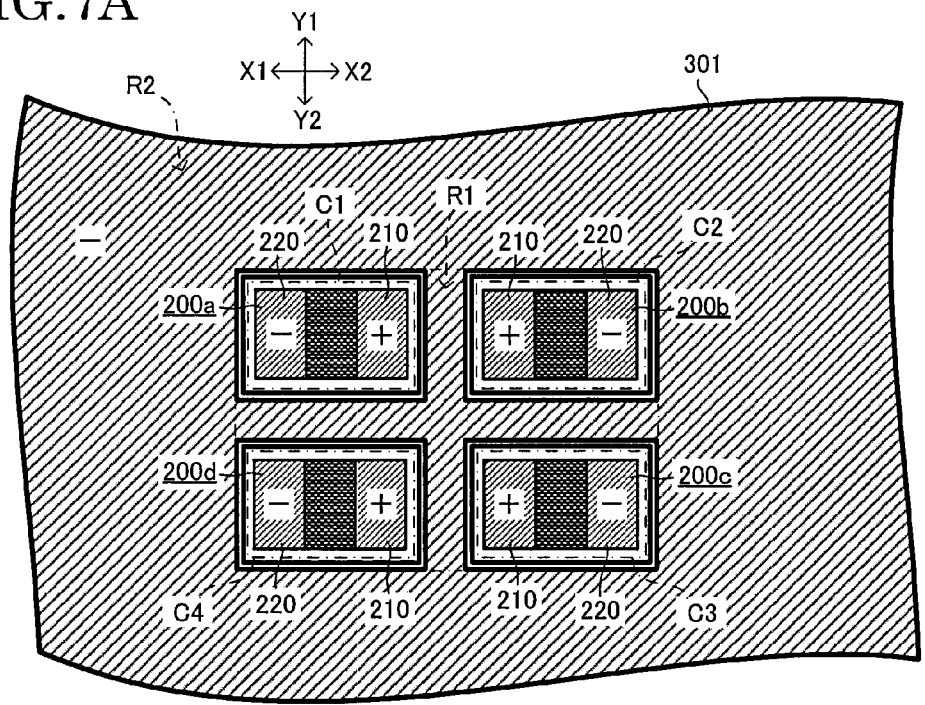
FIG. 7A is a view showing a first example of the polarities of the electrodes of chip capacitors built into the wiring board according to the first embodiment of the present invention.
Figure 7B:
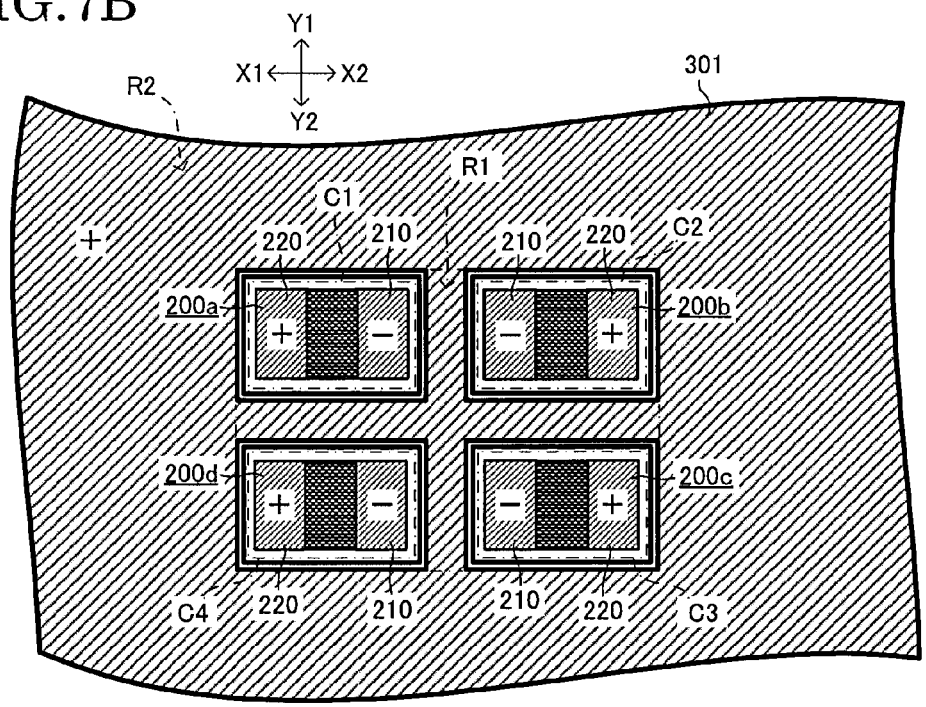
FIG. 7B is a view showing a second example of the polarities of the electrodes of chip capacitors built into the wiring board according to the first embodiment of the present invention.

In the present embodiment, electrode 210 is set as positive pole (+) and electrode 220 as negative pole (−) as shown in FIG. 7A, for example. However, since one end of direction X (such as the electrode 210 side) and the other end (such as the electrode 220 side) have symmetrical structures in electronic components (200a~200d) of the present embodiment as shown in FIGS. 4A~5B, even if the polarities of electrode 210 (first side electrode) and electrode 220 (second side electrode) are reversed as shown in FIG. 7B, for example, electronic components (200a~200d) operate. Therefore, it is not required to consider directions of electronic devices when they are positioned in cavities in wiring board 10 of the present embodiment.

In wiring board 10 of the present embodiment, opposing electrodes (210, 210) of adjacent electronic components (200a, 200b) and opposing electrodes (210, 210) of adjacent electronic components (200c, 200d) are set to have substantially the same electric potential.

Figure 8A:
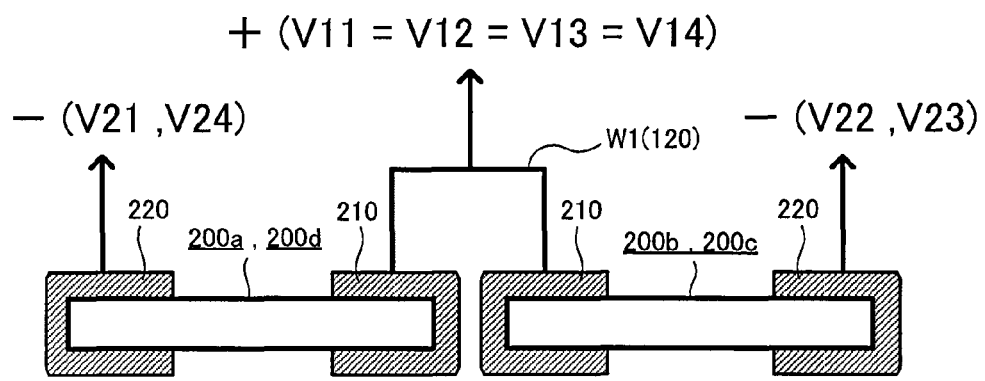
FIG. 8A, in the wiring board according to the first embodiment of the present invention, is a view illustrating an example in which opposing electrodes of adjacent electronic components are electrically connected to each other through wiring.

Specifically, as shown in FIG. 8A, electric potential (V11) at electrode 210 of electronic component (200a), electric potential (V12) at electrode 210 of electronic component (200b), electric potential (V13) at electrode 210 of electronic component (200c) and electric potential (V14) at electrode 210 of electronic component (200d) have the same polarity (positive pole) and their absolute values are substantially equal (V11=V12=V13=V14). Wiring board 10 of the present embodiment has wiring (W1) that electrically connects opposing side electrodes (electrodes (210, 210, 210, 210)) of electronic components (200a~200d)) to each other. In the present embodiment, wiring (W1) is made from conductive layer 120 (see FIG. 1). Wiring (W1) is electrically connected to a power source through die or the like.

Also, electrodes (220, 220, 220, 220) of electronic components (200a~200d) are electrically connected to a common or separate ground, for example. Accordingly, electric potential (V21) at electrode 220 of electronic component (200a), electric potential (V22) at electrode 220 of electronic component (200b), electric potential (V23) at electrode 220 of electronic component (200c) and electric potential (V24) at electrode 220 of electronic component (200d) each have substantially the same potential as ground. Also, in the present embodiment, the planar conductive pattern on peripheral section (R2) and substantially the cruciform conductive pattern on boundary section (R1) formed to be integrated with the planar conductive pattern are electrically connected to ground and have substantially the same electric potential as ground as shown in FIG. 7A, for example. The difference of electric potential between power source and ground is 6.3 V, for example. The planar conductive pattern on peripheral section (R2) and substantially the cruciform conductive pattern on boundary section (R1) formed to be integrated with the planar conductive pattern may be electrically connected to power source instead of ground.

Figure 8B:
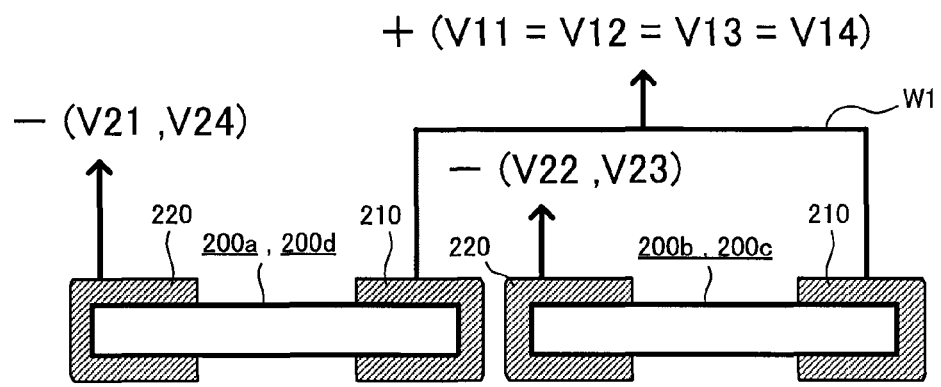
FIG. 8B, to compare with the electrode shown in FIG. 8A, is a view showing an example in which non-opposing electrodes of adjacent electronic components are electrically connected to each other through wiring.

In the present embodiment, since opposing electrodes of adjacent electronic devices are electrically connected to each other through wiring (W1) as shown in FIG. 8A, it is easier to reduce the length of wiring (W1), compared with the wiring board where non-opposing electrodes are electrically connected through wiring (W1) as shown in FIG. 8B.

Following is a preferred example of each measurement shown in FIGS. 2, 3, 5A, 6A and 6B.

In FIG. 2, length (D101) of line X in boundary section (R1) of substrate 100 (the width of boundary section (R1) in direction X) is approximately 2600 μm, for example, and length (D102) of line Y in boundary section (R1) of substrate 100 (the width of boundary section (R1) in direction Y) is approximately 1600 μm, for example.

In FIGS. 2 and 3, width (D21) of line X and width (D22) of line Y are each approximately 320 μm, for example, and width (D31) of the conductive pattern on second boundary portion (P2) (=the width of the conductive pattern on fourth boundary portion (P4)), and width (D32) of the conductive pattern on first boundary portion (P1) (=the width of the conductive pattern on third boundary portion (P3)) are each approximately 200 μm, for example.

In FIG. 2, each width (D11) of cavities (C1~C4) in a longitudinal direction (direction X) is approximately 1200 μm, for example, and each width (D12) of cavities (C1~C4) in a lateral direction (direction Y) is approximately 700 μm, for example.

Wiring board 10 of the present embodiment has a region in each periphery of cavities (C1~C4) where the substantially cruciform conductive pattern on boundary section (R1) and the planar conductive pattern on peripheral section (R2) are not formed. Specifically, as shown in FIGS. 2, 3, 6A and 6B, the substantially cruciform conductive pattern on boundary section (R1) and the planar conductive pattern on peripheral section (R2) are not formed in a region within distance (D1) from each of cavities (C1~C4) (its wall surface, in particular) both in direction X and direction Y. Accordingly, burrs are suppressed from occurring during the manufacturing process. Distance (D1) (=(D21−D31)/2= (D22−D32/2) is approximately 60 μm, for example. However, that is not the only option, and distance (D1) may be approximately 0 μm.

In FIG. 5A, each width (D41) of electronic components (200a~200d) in a longitudinal direction (direction X) is approximately 1000 μm, and each width (D42) of electronic components (200a~200d) in a lateral direction (direction Y) is approximately 500 μm.

In FIG. 5A, width (D43) of upper portion (210a) or lower portion (210c) of electrode 210 is approximately 280 μm. The measurements of electrode 220 are the same as those of electrode 210, for example.

Distance (pitch) (D44) between via conductor (321b) and via conductor (322b) is approximately 720 μm, for example.

The thickness of substrate 100 is approximately 100 μm, for example. Each thickness of electronic components (200a~200d) (thickness including electrodes) is approximately 150 um, for example. The thickness of wiring board 10 (thickness from solder resist 11 to solder resist 12) is approximately 290 μm, for example.

As shown in FIG. 1, insulation layer 101 is formed on first surface (F1) of substrate 100, on conductive layer 301 and on third surfaces (F3) of electronic components (200a~200d). Also, insulation layer 102 is formed on second surface (F2) of substrate 100, on conductive layer 302 and on fourth surfaces (F4) of electronic components (200a~200d).

Insulation layer 101 covers openings on one side (the first-surface (F1) side) of cavities (C1~C4) (holes), and insulation layer 102 covers openings on the other side (the second-surface (F2) side) of cavities (C1~C4) (holes). Conductive layer 110 is formed on insulation layer 101 and conductive layer 120 is formed on insulation layer 102. Conductive layers (110, 120) are outermost layers in the present embodiment. However, that is not the only option, and more interlayer insulation layers and conductive layers may further be laminated.

In the present embodiment, insulator (101a) is filled between electronic components (200a~200d) in their respective cavities and substrate 100. Insulator (101a) of the present embodiment is made of insulative material (resin, in particular) that forms insulation layers (101, 102) (in particular, resin insulation layers) over cavities. Insulation layers (101, 102) and insulator (101a) and the like surround electronic components (200a~200d) completely. Accordingly, electronic components (200a~200d) are protected by resin and secured at predetermined positions.

Solder resists (11, 12) are formed on conductive layers (110, 120) respectively. However, opening portions (11a, 12a) are respectively formed in solder resists (11, 12). Thus, a predetermined portion of conductive layer 110 (portion positioned at opening portion (11a)) is not covered by solder resist 11 and is exposed to become pad (P11). Also, a predetermined portion of conductive layer 120 (portion positioned at opening portion (12a)) becomes pad (P12). Pad (P11) is an external connection terminal for electrical connection with another wiring board, for example, and pad (P12) is an external connection terminal for mounting an electronic component, for example. However, those are not the only options, and pads (P11, P12) may be used in any other way.

In the present embodiment, an anticorrosion layer made of Ni/Au, for example, is formed on the surfaces of pads (P11, P12). Such an anticorrosion layer may be formed by electrolytic plating, sputtering or the like. Also, an OSP treatment is conducted to form an anticorrosion layer made of organic protective film. Furthermore, an anticorrosion layer is not always required, and it may be omitted unless necessary.

Holes (313a) (via holes) are formed in insulation layer 101, and holes (321a, 322a, 323a) (each a via hole) are formed in insulation layer 102. By filling conductor (such as copper plating) in holes (313a, 321a, 322a, 323a), the conductor in the holes becomes via conductors (313b, 321b, 322b, 323b) (each a filled via).

Via conductors (321b, 322b) are electrically connected to electrode 210 or 220 of electronic components (200a~200d) respectively from the second-surface (F2) side of substrate 100. Specifically, via conductors (321b) are electrically connected to electrodes 210 of electronic components (200a~200d) respectively, and via conductors (322b) are electrically connected to electrodes 220 of electronic components (200a~200d) respectively. As described, surfaces of only one side (fourth surfaces (F4)) of electronic components (200a~200d) are connected to via conductors in the present embodiment. Such a structure is referred to as a single-sided via structure.

Because of the above single-sided via structure, electrodes (210, 220) of electronic components (200a~200d) and conductive layer 120 on insulation layer 102 are electrically connected to each other through via conductors (321b) or (322b). Since electrical connections are formed in the inner layers in such a structure, it is effective for miniaturization.

Holes (313a, 323a) respectively reach through-hole conductor (300b), and via conductors (313b, 323b) are electrically connected to through-hole conductor (300b) from the first-surface (F1) side or the second-surface (F2) side of substrate 100. Via conductors (313b, 323b) are respectively positioned directly on (direction Z) through-hole conductor (300b). Then, conductive layer 301 on first surface (F1) of substrate 100 is electrically connected to conductive layer 110 on insulation layer 101 by via conductor (313b). Also, conductive layer 302 on second surface (F2) of substrate 100 is electrically connected to conductive layer 120 on insulation layer 102 by via conductor (323b).

In the present embodiment, via conductors (313b, 323b) and through-hole conductor (300b) are each a filled conductor, and stacked structure (S1) is formed by stacking those conductors in direction Z. Such stacked structure (51) is suitable for miniaturization or omitting wiring.

Substrate 100 is made by impregnating glass cloth (core material) with epoxy resin (hereinafter referred to as glass epoxy), for example. The core material has a smaller thermal expansion coefficient than the main material (epoxy resin in the present embodiment). As for such core materials, inorganic materials such as glass fiber (glass cloth or glass non-woven fabric, for example), aramid fiber (aramid non-woven fabric, for example) or silica filler are thought to be preferable. However, basically, the material for substrate 100 is not limited to a specific type. For example, epoxy resin may be substituted with polyester resin, bismaleimide triazine resin (BT resin), imide resin (polyimide), phenol resin, allyl polyphenylene ether resin (A-PPE resin) or the like. Substrate 100 may be formed with multiple layers of different materials.

Insulation layers (101, 102) of the present embodiment are each made by impregnating core material with resin. Since insulation layers (101, 102) are made of resin with core material, recesses are less likely to be formed in insulation layers (101, 102) even in a gap between an electronic device and a cavity, and line breaks in conductive patterns formed on insulation layers (101, 102) are suppressed. Insulation layers (101, 102) are made of glass epoxy, for example. However, that is not the only option, and insulation layers (101, 102) may be made of resin without core material. Basically, the material for insulation layers (101, 102) is determined freely. For example, instead of epoxy resin, polyester resin, bismaleimide triazine resin (BT resin), imide resin (polyimide), phenol resin, allyl polyphenylene ether resin (A-PPE resin) or the like may also be used. Each insulation layer may be formed with multiple layers of different materials.

Via conductors (313b, 321b, 322b, 323b) are each made of copper plating, for example. The shape of via conductor (313b) and others is a tapered column (truncated cone) tapering with a diameter that increases from the core section toward upper layers, for example. However, that is not the only option, and the shape of via conductors is not limited specifically.

Conductive layer 110 is made of copper foil (lower layer) and copper plating (upper layer), and conductive layer 120 is made of copper foil (lower layer) and copper plating (upper layer). Conductive layers (110, 120) include wiring that forms electrical circuits, lands, planar patterns and the like, for example.

The material for each conductive layer and each via conductor is not limited specifically as long as it is conductive. It may be metallic or non-metallic. Conductive layers and via conductors may each be formed with multiple layers made of different materials.

Multiple electronic devices are built into wiring board 10 of the present embodiment. Since one electronic device is positioned in one opening portion (cavity) in wiring board 10, the process to form an assembly of electronic devices is not required. In addition, since wiring for each electronic device can be formed after each electronic device has been positioned (secured in a cavity), it is easy to connect (electrically connect) each electronic device to separate circuits. Also, since multiple electronic devices built into the wiring board are not integrated, if one of the electronic devices is out of order, it is only required to replace that electronic device for all the electronic devices to work well.

To build multiple electronic devices into a wiring board using a structure where one electronic device is positioned in one cavity, the distance between cavities is required to be narrow. However, when the width of the boundary section between cavities (walls to divide cavities) becomes smaller, the strength tends to decrease, resulting in lowered reliability of electrical connections in the wiring board. For that matter, since a conductive pattern is formed on boundary section (R1) between cavities in wiring board 10 of the present embodiment, the strength of boundary section (R1) is improved. As a result, the reliability of electrical connections in the wiring board is enhanced. Also, since the width of boundary section (R1) is made smaller, it is easy to miniaturize the wiring board.

Conductive patterns (conductive layers (301, 302)) are formed on both surfaces of boundary section (R1) in wiring board 10 of the present embodiment. Thus, it is easier to enhance strength than in situations where a conductive pattern is formed only on one surface.

In wiring board 10 of the present embodiment, the substantially cruciform planar shape of boundary section (R1) is preferred to be formed by two lines which have a width approximately 0.05 mm or greater and approximately 2.00 mm or less and intersect substantially at right angles. Namely, width (D21) of line X and width (D22) of line Y (see FIGS. 2 and 3) are each preferred to be in the range of approximately 0.05 to approximately 2.00 mm. Setting the widths of boundary section (R1) in such a range is preferable for miniaturization of wiring boards, while enhancing the strength of boundary section (R1) and securing insulation between adjacent electronic components.

Figure 9:
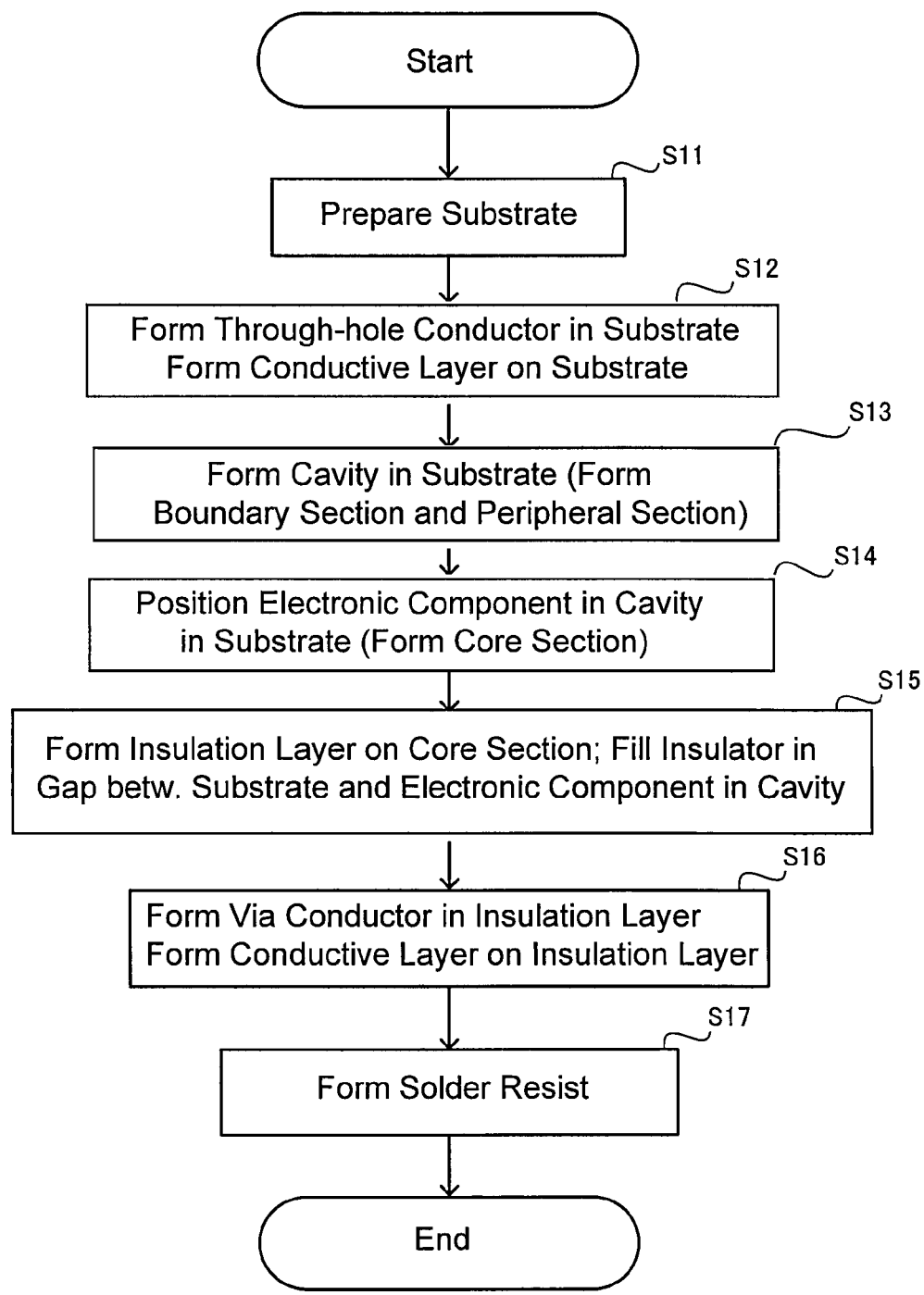
FIG. 9 is a flowchart showing a method for manufacturing a wiring board according to the first embodiment of the present invention.

In the following, a method for manufacturing wiring board 10 of the present embodiment is described. FIG. 9 is a flowchart to schematically show the contents and the order of the method for manufacturing wiring board 10 according to the present embodiment.

Figure 10:
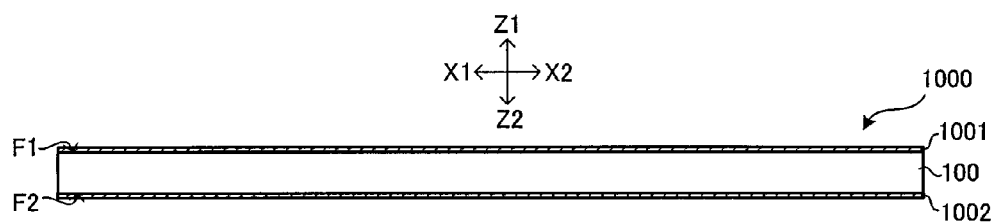
FIG. 10, in the manufacturing method shown in FIG. 9, is a view illustrating a step for preparing a substrate.

In step (S11) of FIG. 9, a substrate is prepared. Specifically, double-sided copper-clad laminate 1000 is prepared as a starting material as shown in FIG. 10. Double-sided copper-clad laminate 1000 is formed with substrate 100 (core substrate), metal foil 1001 (such as copper foil) formed on first surface (F1) of substrate 100 and metal foil 1002 (such as copper foil) formed on second surface (F2) of substrate 100. In the present embodiment, substrate 100 is glass epoxy that is completely cured at this stage.

In step (S12) of FIG. 9, through-hole conductors are formed in the substrate and conductive layers are formed on the substrate.

Figure 11A:
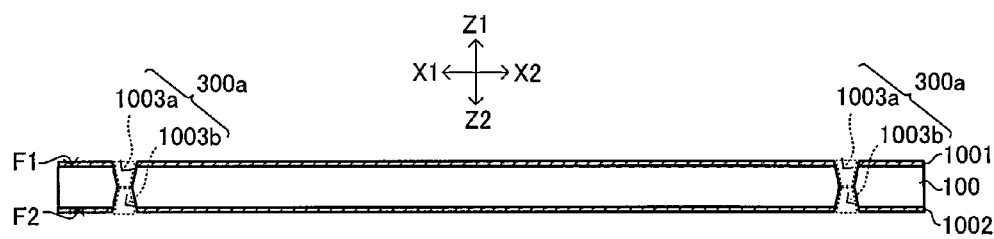
FIG. 11A, in the manufacturing method shown in FIG. 9, is a view illustrating a first step for forming through-hole conductors in the substrate and forming conductors on the substrate.

Specifically, using a $CO_2$ laser, for example, double-sided copper-clad laminate 1000 is irradiated from the first-surface (F1) side to form hole (1003a), and double-sided copper-clad laminate 1000 is irradiated from the second-surface (F2) side to form hole (1003b) as shown in FIG. 11A. Hole (1003a) and hole (1003b) are formed at substantially the same position on the X-Y plane, and are eventually connected to become through hole (300a) which penetrates through double-sided copper-clad laminate 1000. Through hole (300a) is shaped like an hourglass, for example. The boundary between hole (1003a) and hole (1003b) corresponds to narrowed portion (300c) (FIG. 1). Laser irradiation on first surface (F1) and laser irradiation on second surface (F2) may be performed simultaneously or separately, one at a time. After through hole (300a) is formed, desmearing is preferred to be conducted on through hole (300a). Unwanted conduction (short circuiting) is suppressed by desmearing. Also, to enhance the absorption efficiency of laser light, surfaces of metal foils (1001, 1002) may be blackened prior to laser irradiation. Here, through hole (300a) may be formed using a drill or through etching instead of using a laser. However, it is easier to achieve fine processing by using a laser.

Figure 11B:
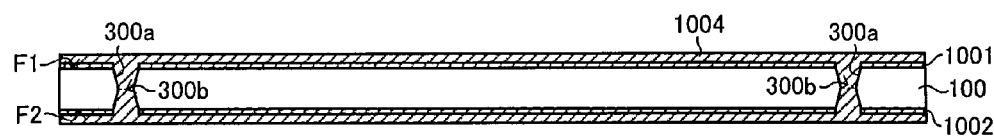
FIG. 11B is a view illustrating a second step subsequent to the step in FIG. 11A.

Copper plating 1004, for example is formed on metal foils (1001, 1002) and in through hole (300a) by using a panel plating method, for example, as shown in FIG. 11B. Specifically, electroless plating is first performed to form electroless plated film, and then electrolytic plating is performed using a plating solution with the electroless plated film as a seed so that plating 1004 is formed. Accordingly, through hole (300*a*) is filled with plating 1004 to form through-hole conductor (300*b*).

Conductive layers formed on first surface (F1) and second surface (F2) of substrate 100 are patterned using etching resist and an etching solution, for example. Specifically, conductive layers are covered by etching resist having patterns respectively corresponding to conductive layers (301, 302), and portions of each conductive layer not covered by the etching resist (portions exposed through opening portions of the etching resist) are etched away.

Figure 12A:
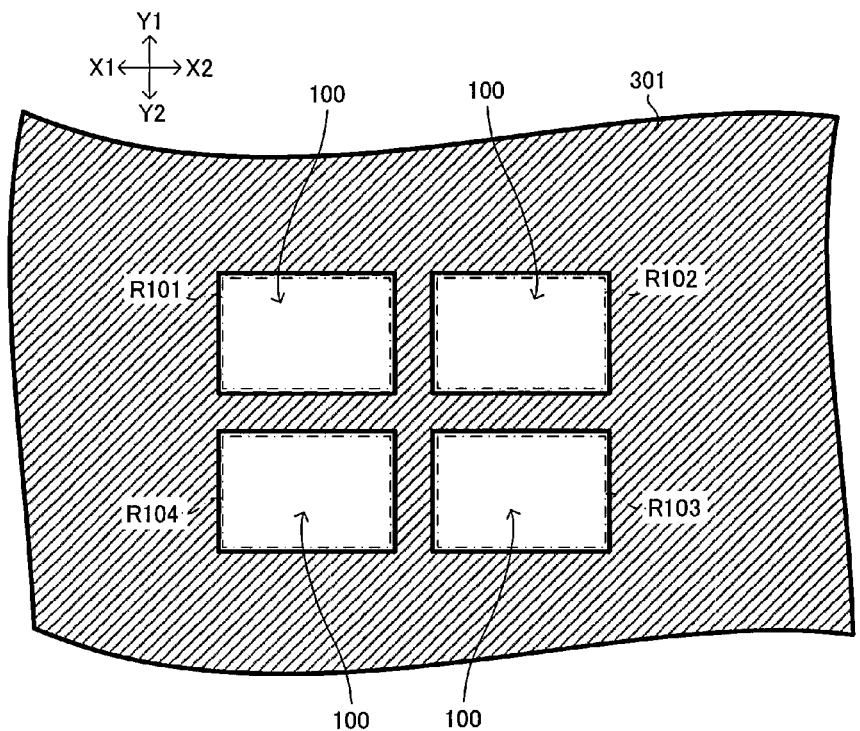
FIG. 12A, in the manufacturing method shown in FIG. 9, is a view showing a core section prior to forming cavities.
Figure 12B:
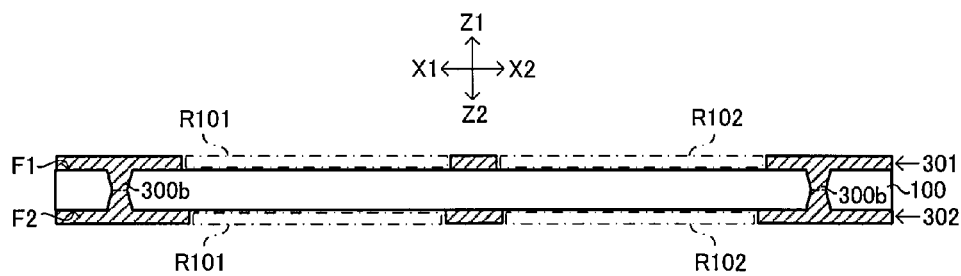
FIG. 12B is a cross-sectional view of the core section shown in FIG. 12A.

Accordingly, conductive layers (301, 302) are respectively formed on first surface (F1) and second surface (F2) of substrate 100 as shown in FIGS. 12A and 12B. Also, opening portions (R101~R104) respectively corresponding to cavities (C1~C4) are formed in conductive layers (301, 302). Opening portions (R101~R104) have opening shapes similar to those of cavities (C1~C4), for example, and opening portions (R101~R104) are set a little larger than cavities (C1~C4). Accordingly, a planar conductive pattern is formed on the outer side of the opening portions, and a substantially cruciform conductive pattern is formed on the inner side so as to be integrated with the outer planar conductive pattern. Conductive layers (301, 302) of the present embodiment are each triple-layered with copper foil (lower layer), electroless copper plating (middle layer) and electrolytic copper plating (upper layer), for example.

Dry etching may be conducted instead of wet etching. Also, it is thought to be preferable to roughen surfaces of conductive layers (301, 302) through etching or the like, if required. In addition, alignment marks may be formed in conductive layer 301 or 302 to be used in later steps (such as a step for positioning electronic components (200*a*~200*d*)).

Figure 13A:
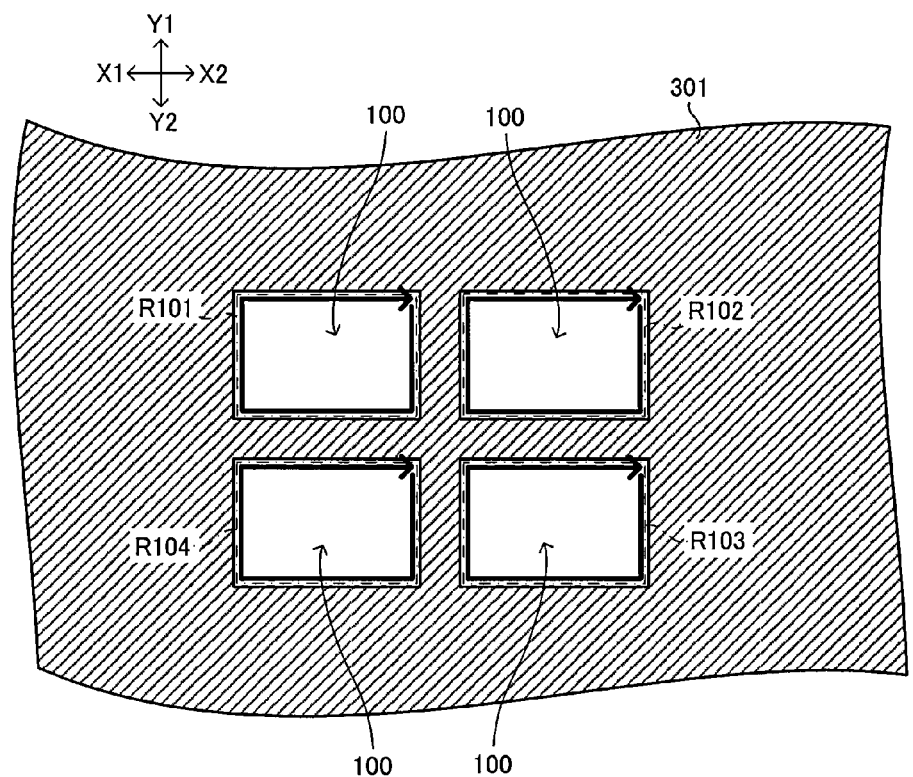
FIG. 13A, in the manufacturing method shown in FIG. 9, is a view illustrating a step for forming cavities in the substrate.
Figure 13B:
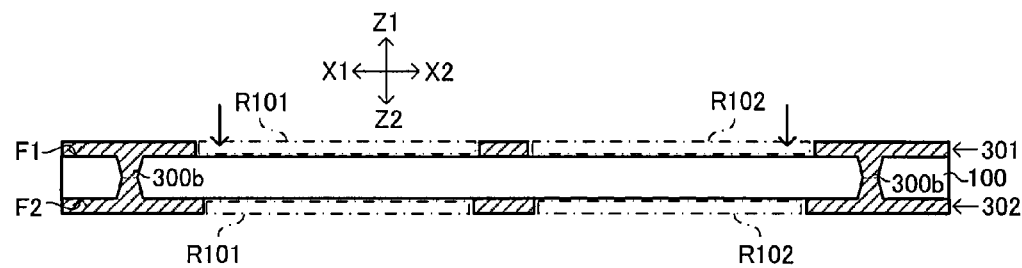
FIG. 13B is a cross-sectional view of the substrate shown in FIG. 13A.

In step (S13) of FIG. 9, opening portions (cavities) are formed by irradiating laser light on substrate 100 from the first-surface (F1) side as shown in FIGS. 13A and 13B (cross-sectional view of FIG. 13A), for example. Specifically, regions corresponding to cavities (C1~C4) in substrate 100 are removed from their surroundings by irradiating laser light to draw the shapes of cavities (C1~C4) (see FIG. 2) as shown in FIGS. 13A and 13B, for example. The laser irradiation angle is set substantially vertical to first surface (F1) of substrate 100, for example. However, the above is not the only option. For example, a laser may be irradiated from both sides of substrate 100, or a laser may be irradiated to make an oblique angle to main surfaces of substrate 100. Alternatively, other methods (router, drill, die or the like) may be used instead of a laser to form opening portions (cavities) in substrate 100.

During that time, if conductive layer 301 on substrate 100 is removed in advance to correspond to the shapes of cavities (C1~C4) (see FIG. 2) as shown in FIGS. 12A and 12B, the positions and shapes of cavities (C1~C4) become clear, making it easier to align laser irradiation.

Figure 14A:
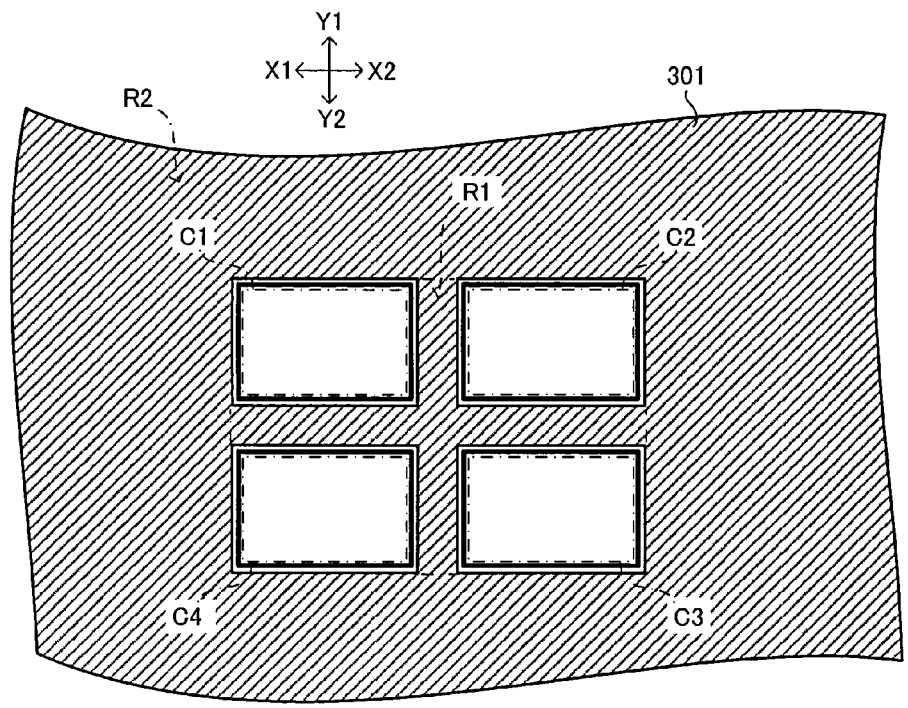
FIG. 14A, in the manufacturing method shown in FIG. 9, is a view showing the core section after cavities are formed.
Figure 14B:
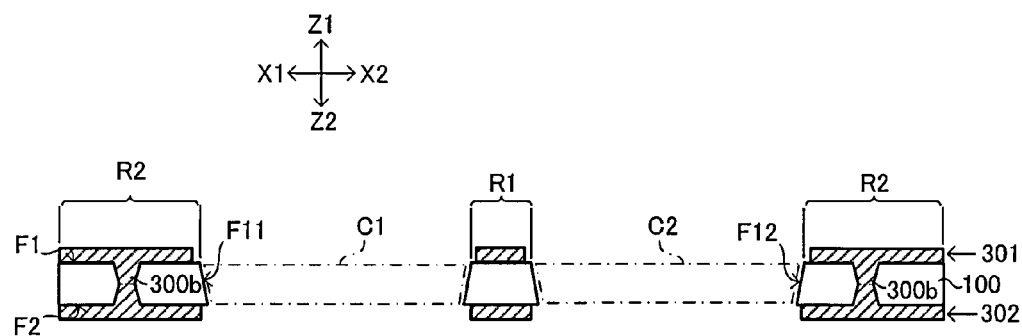
FIG. 14B is a cross-sectional view of the core section shown in FIG. 14A.

Cavities (C1~C4) are formed as shown in FIGS. 14A and 14B (cross-sectional view of FIG. 14A) by irradiating the above laser light. Accordingly, peripheral section (R2) is formed along with boundary section (R1) which is formed to be integrated with the peripheral section.

In the present embodiment, when laser light is irradiated on substrate 100 from the first-surface (F1) side, the amount of laser processing is reduced as the light proceeds toward the second-surface (F2) side. Thus, cavities (C1~C4) are formed with a width that decreases from first surface (F1) toward second surface (F2). As a result, cut surfaces of substrate 100 (wall surfaces of cavities (C1~C4)) are tapered.

Cavities (C1~C4) formed as above are each set as accommodation space for electronic components (200*a*~200*d*). Since cavities (C1~C4) are formed using a laser in the present embodiment, it is easy to obtain cavities (C1~C4) having tapered wall surfaces.

In step (S14) of FIG. 9, electronic components (200*a*~200*d*) are respectively positioned in cavities (C1~C4) of substrate 100.

Figure 15:
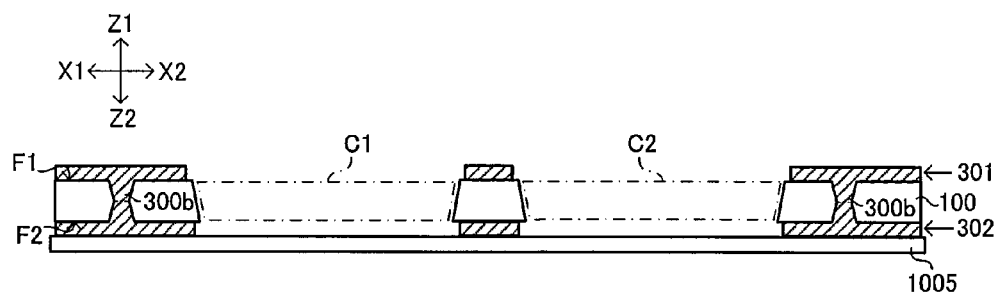
FIG. 15, in the manufacturing method shown in FIG. 9, is a view illustrating a step for attaching the core section with cavities (opening portions) to a carrier.

Specifically, carrier 1005 made of PET (polyethylene terephthalate), for example, is positioned on one side of substrate 100 (on second surface (F2)), for example, as shown in FIG. 15. In doing so, openings on one side of cavities (holes) (C1~C4) are covered with carrier 1005. In the present embodiment, carrier 1005 is made of an adhesive sheet (such as tape), and is adhesive on the substrate 100 side. Carrier 1005 is adhered to the second-surface (F2) side (conductive layer 302 or the like) of substrate 100 through lamination, for example.

Figure 16:
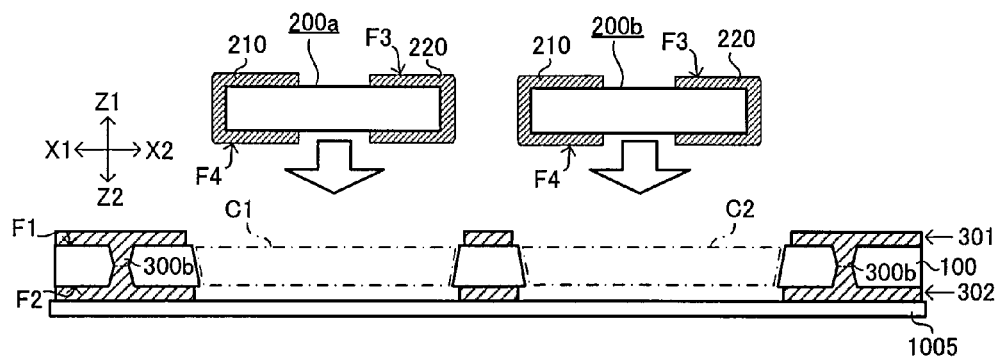
FIG. 16, in the manufacturing method shown in FIG. 9, is a view illustrating a first step for positioning electronic devices in cavities.
Figure 17:
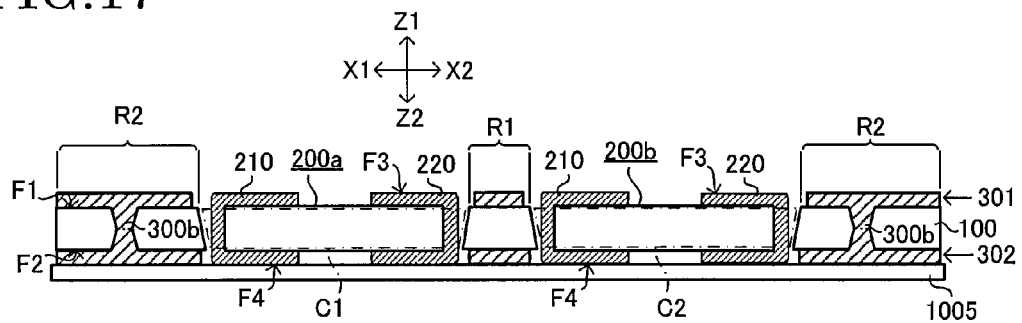
FIG. 17 is a view illustrating a second step subsequent to the step in FIG. 16.

Electronic components (200*a*~200*d*) are placed into cavities (C1~C4) from the side (Z1 side) opposite the covered openings of cavities (holes) (C1~C4) as shown in FIG. 16. Electronic components (200*a*~200*d*) are respectively placed into cavities (C1~C4) by a component mounter, for example. For example, electronic components (200*a*~200*d*) are each held on a vacuum chuck or the like, transported to the area above cavities (C1~C4) (Z1 side), lowered vertically from that area, and then placed into cavities (C1~C4). Accordingly, electronic components (200*a*~200*d*) are positioned on carrier 1005 (adhesive sheet) as shown in FIG. 17. As a result, the core section of wiring board 10 (FIG. 1) is completed.

In step (S15) of FIG. 9, insulation layers are formed on the core section, and insulator is filled between the substrate and electronic components in their respective cavities.

Figure 18:
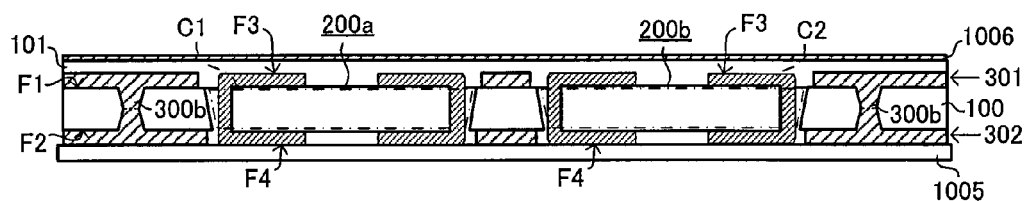
FIG. 18, in the manufacturing method shown in FIG. 9, is a view illustrating a step for forming a first interlayer insulation layer and a first metal foil on the substrate and on the electronic devices.
Figure 19:
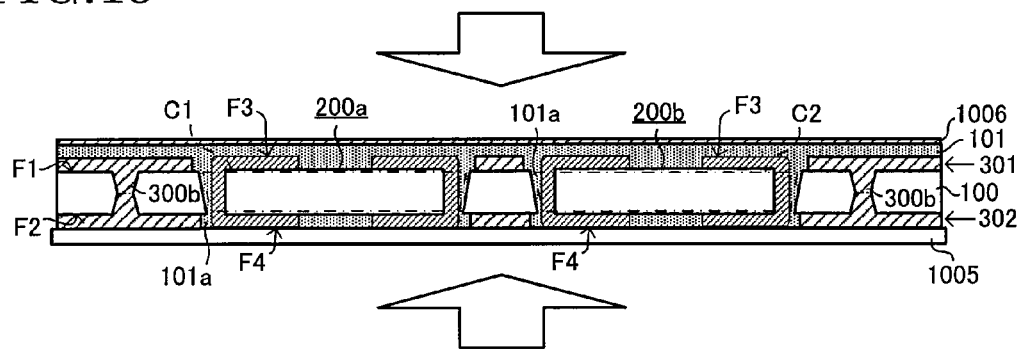
FIG. 19, in the manufacturing method shown in FIG. 9, is a view illustrating a pressing step.
Figure 20:
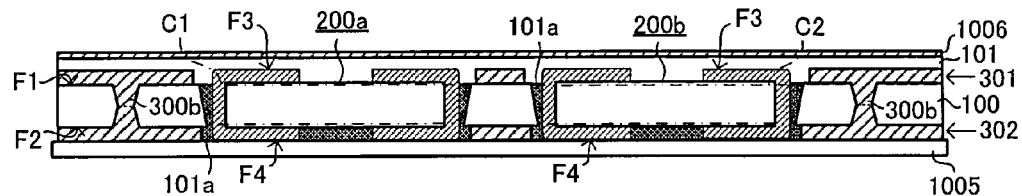
FIG. 20 is a view showing a state after the pressing in FIG. 19.

Specifically, as shown in FIG. 18, insulation layer 101 with metal foil 1006 (copper foil with resin, for example) is formed on the side opposite carrier 1005 (Z1 side), namely, on first surface (F1) of substrate 100 and third surfaces (F3) of electronic components (200*a*~200*d*). Insulation layer 101 is made of thermosetting glass-epoxy prepreg, for example. Then, by pressing semi-cured (B-stage) insulation layer 101 as shown in FIG. 19, resin flows out from insulation layer 101 into cavities (C1~C4). In doing so, as shown in FIG. 20, insulator (101*a*) (resin that forms insulation layer 101) is filled between electronic component (200*a*~200*d*) in cavities (C1~C4) and substrate 100.

When insulator (101*a*) is filled in cavities (C1~C4), the filler resin (insulator 101*a*) and electronic components (200*a*~200*d*) are preliminarily adhered. Specifically, the filler resin is heated to gain retention power to a degree that it can support electronic components (200*a*~200*d*). In doing so, electronic components (200*a*~200*d*) supported by carrier 1005 are now supported by the filler resin. Then, carrier 1005 is removed.

At this stage, insulator (101*a*) (filler resin) and insulation layer 101 are only semicured, and are not completely cured. However, that is not the only option, and insulator (101*a*) and insulation layer 101 may be completely cured at this stage, for example.

Figure 21:
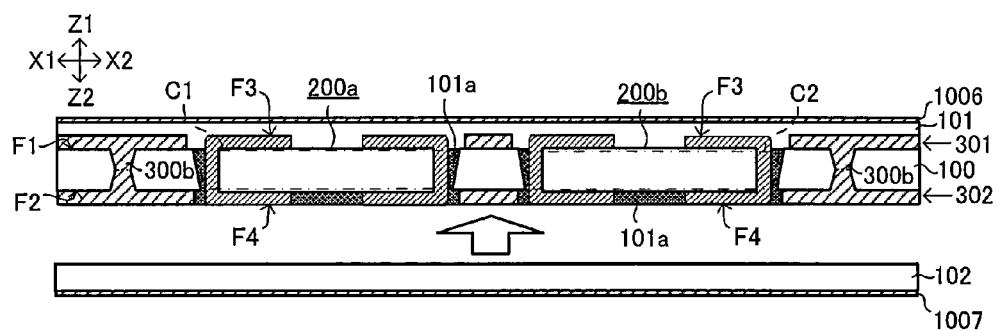
FIG. 21, in the manufacturing method shown in FIG. 9, is a view illustrating a step for forming a second interlayer insulation layer and a second metal foil on the substrate and on the electronic devices after the carrier is removed.

Insulation layer 102 with metal foil 1007 (copper foil with resin, for example) is formed on second surface (F2) of substrate 100 as shown in FIG. 21. Insulation layer 102 is made of thermosetting glass-epoxy prepreg, for example. Electrodes (210, 220) of electronic components (200a~200d) are each covered with insulation layer 102. Semicured (B-stage) insulation layer 102 is adhered to substrate 100 by pressing; for example, insulation layers (101, 102) are heated until completely cured. Since the adhesive sheet (carrier 1005) is removed and then the resin filled in cavities (C1~C4) is cured in the present embodiment, insulation layers (101, 102) are cured simultaneously. Also, since warping of substrate 100 is suppressed by curing insulation layers (101, 102) on both surfaces at the same time, it is easier to make substrate 100 thinner.

In step (S16) of FIG. 9, via conductors are formed in insulation layers of the core section, and conductive layers are formed on the insulation layers.

Figure 22:
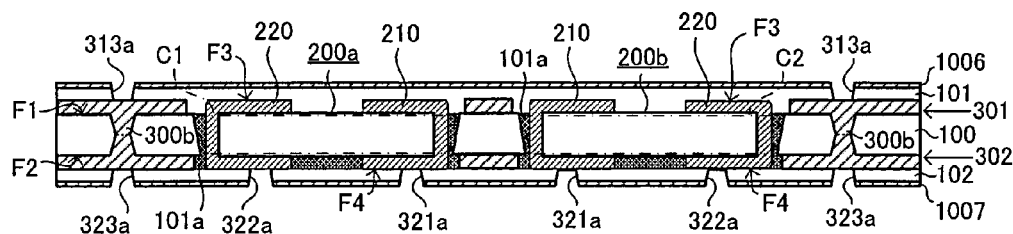
FIG. 22, in the manufacturing method shown in FIG. 9, is a view illustrating a first step for forming conductive layers on the first and second interlayer insulation layers and for electrically connecting each conductive layer and the electrodes of electronic devices to each other.

Specifically, using a laser, for example, holes (313a) (via holes) are formed in insulation layer 101 and metal foil 1006, and holes (321a~323a) (each a via hole) are formed in insulation layer 102 and metal foil 1007 as shown in FIG. 22. Holes (313a) penetrate through metal foil 1006 and insulation layer 101, and holes (321a~323a) each penetrate through metal foil 1007 and insulation layer 102. Then, holes (321a) reach electrodes 210 of electronic components (200a, 200b), and holes (322a) reach electrodes 220 of electronic components (200a, 200b). Also, holes (313a, 323a) respectively reach conductive layers (301, 302) directly on through-hole conductor (300b). Then, desmearing is conducted if required.

Figure 23:
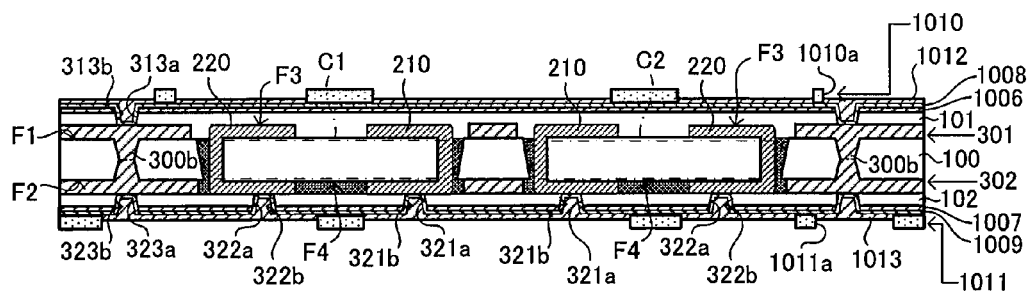
FIG. 23 is a view illustrating a second step subsequent to the step in FIG. 22.

Electroless copper-plated films (1008, 1009), for example, are formed on metal foils (1006, 1007) and in holes (313a, 321a~323a) by a chemical plating method, for example (see FIG. 23). Prior to electroless plating, a catalyst made of palladium or the like may be adsorbed on surfaces of insulation layers (101, 102) through immersion, for example.

Figure 24:
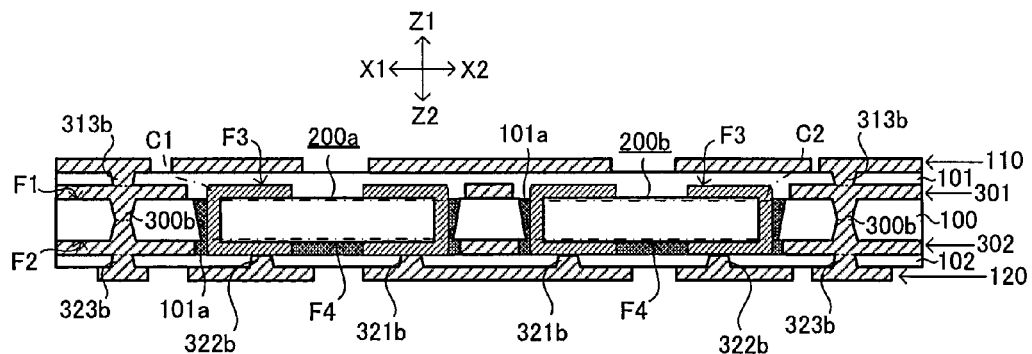
FIG. 24 is a view illustrating a third step subsequent to the step in FIG. 23.

Using a lithographic technique, printing or the like, plating resist 1010 with opening portions (1010a) is formed on the first-surface (F1) side main surface (on electroless plated film 1008), and plating resist 1011 with opening portions (1011a) is formed on the second-surface (F2) side main surface (on electroless plated film 1009) (see FIG. 23). Opening portions (1010a, 1011a) have a pattern respectively corresponding to conductive layers (110, 120) (FIG. 24).

As shown in FIG. 23, electrolytic copper platings (1012, 1013), for example, are respectively formed in opening portions (1010a, 1011a) of plating resists (1010, 1011) using a pattern plating method, for example. Specifically, copper as a plating material is connected to an anode, and electroless plated films (1008, 1009) as the material to be plated are connected to a cathode, and the substrate is immersed in a plating solution. Then, DC voltage is applied between both poles to flow electric current so that copper is deposited on surfaces of electroless plated films (1008, 1009). Accordingly, electroless plated films (1008, 1009) and electrolytic platings (1012, 1013) are filled in holes (313a, 321a~323a), and via conductors (313b, 321b~323b) made of copper plating, for example, are formed.

Then, using a predetermined removing solution, for example, plating resists (1010, 1011) are removed, and unnecessary electroless plated films (1008, 1009) and metal foils (1006, 1007) are removed. Accordingly, conductive layers (110, 120) are formed as shown in FIG. 24.

The seed layer for electrolytic plating is not limited to electroless plated film, and sputtered film or the like may also be used as a seed layer instead of electroless plated films (1008, 1009).

Then, in step (S17) of FIG. 9, solder resist 11 with opening portions (11a) is formed on insulation layer 101 and conductive layer 110, and solder resist 12 with opening portions (12a) is formed on insulation layer 102 and conductive layer 120 (see FIG. 1). Conductive layers (110, 120) are covered respectively with solder resists (11, 12) except for the portions positioned in opening portions (11a, 12a) (such as pads (P11, P12)). Solder resists (11, 12) are formed by screen printing, spray coating, roll coating, lamination or the like, for example.

By electrolytic plating, sputtering or the like, an anticorrosion layer made of Ni/Au film, for example, is formed on conductive layers (110, 120), in particular, on surfaces of pads (P11, P12) not covered with solder resists (11, 12) (see FIG. 1). Alternatively, an anticorrosion layer made of organic protective film may be formed by performing an OSP treatment.

Accordingly, a first buildup section made up of insulation layer 101 and conductive layer 110 is formed on first surface (F1) of substrate 100, and a second buildup section made up of insulation layer 102 and conductive layer 120 is formed on second surface (F2) of substrate 100. As a result, wiring board 10 of the present embodiment (FIG. 1) is completed. Then, electrical testing (to check capacitance, insulation or the like) is conducted on electronic components (200a~200d), if required.

The manufacturing method of the present embodiment includes the following: preparing substrate 100 (step (S11) of FIG. 9); in substrate 100, forming cavity (C1) (first opening portion) and cavity (C2) (second opening portion) which are separated by first boundary portion (P1), and forming a conductive pattern on first boundary portion (P1) (steps (S12, S13) of FIG. 9); positioning electronic component (200a) (first electronic device) in cavity (C1) and electronic component (200b) (second electronic device) in cavity (C2) (step (S14) of FIG. 9); forming insulation layer 101 on substrate 100, on the conductive pattern on first boundary portion (P1), on electronic component (200a) and on electronic component (200b) (step (S15) of FIG. 9); and forming conductive layer 110 on insulation layer 101 (step (S16) of FIG. 9).

The manufacturing method of the present embodiment is suitable for manufacturing wiring boards 10. Using such a manufacturing method, excellent wiring boards are thought to be obtained at low cost.

Figure 25:
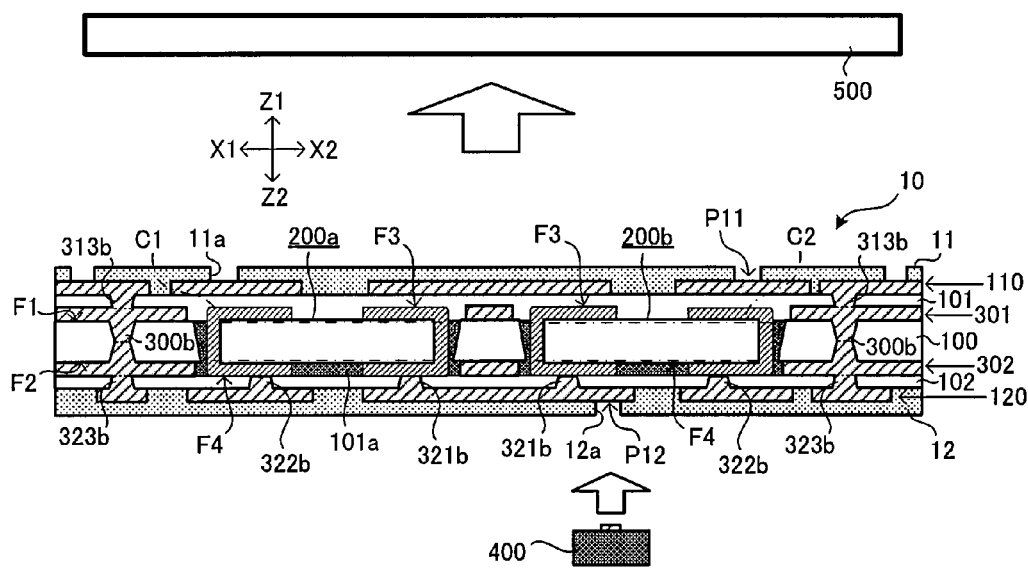
FIG. 25 is a view illustrating a step for mounting an electronic component or another wiring board on a surface of the wiring board according to the embodiment of the present invention.

Wiring board 10 of the present embodiment is electrically connected to another electronic component or another wiring board, for example. As shown in FIG. 25, for example, electronic component 400 (such as an IC chip) may be mounted on pads (P12) of wiring board 10 through soldering or the like. Also, other wiring board 500 (such as a motherboard) may be mounted on wiring board 10 through pads (P11). Wiring board 10 of the present embodiment may be used as a circuit board for mobile devices (cell phones or the like), for example.

Second Embodiment

A second embodiment of the present invention is described by focusing on differences from the above first embodiment. Here, elements the same as those shown in above FIG. 1 and the like are each given the same reference number, and descriptions of the common portions already described are simplified or omitted.

Figure 26:
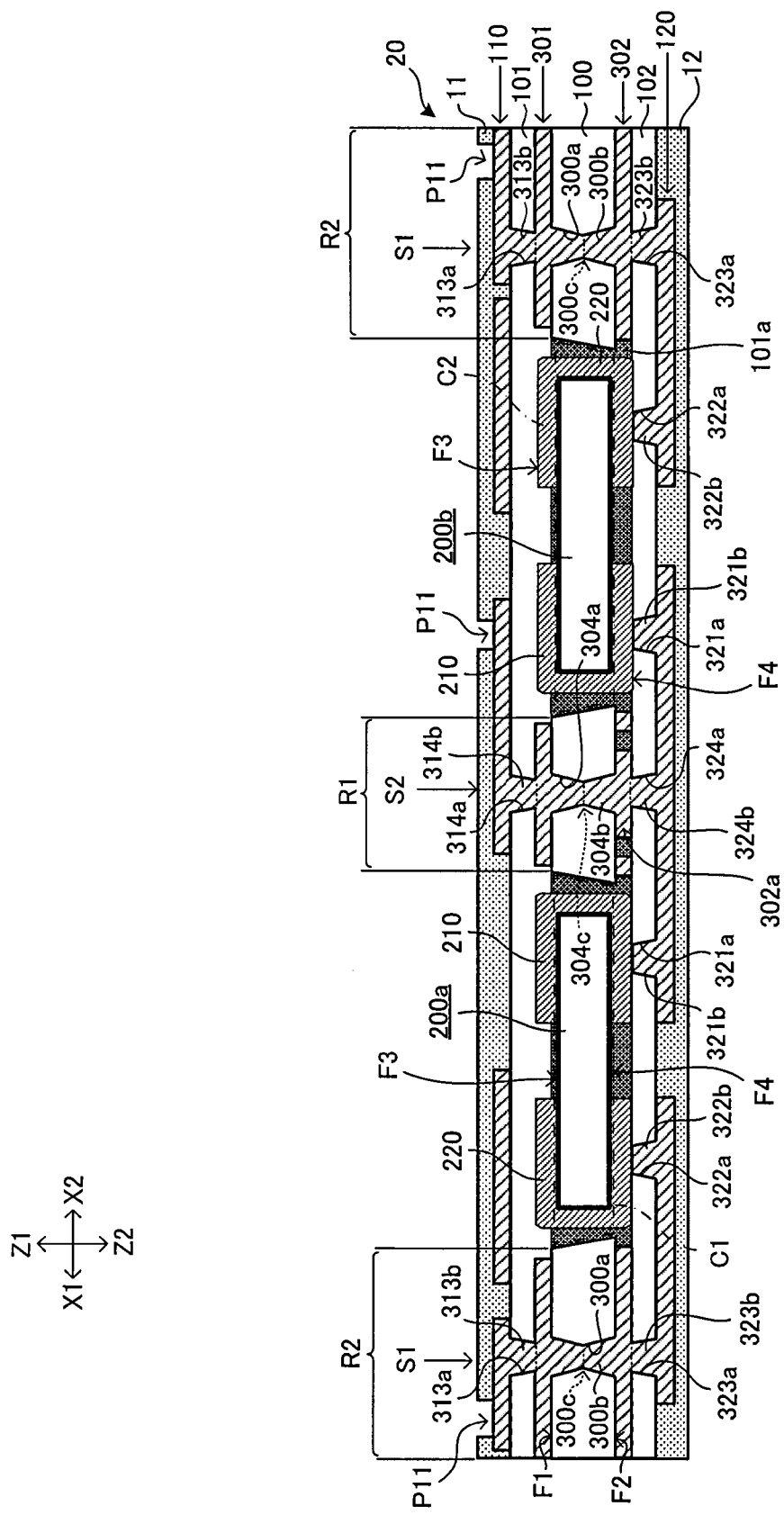
FIG. 26 is a cross-sectional view of a wiring board according to a second embodiment of the present invention.

Wiring board 20 of the present embodiment has through-hole conductors (304b) in boundary section (R1) of substrate 100 (core section) as shown in FIG. 26. Specifically, through holes (304a) that penetrate through substrate 100 are formed in boundary section (R1) of substrate 100, and through-hole conductors (304b) are formed by filling conductor (such as copper plating) in through holes (304a). Namely, through-hole conductors (304b) are filled conductors. Through-hole conductors (304b) are shaped like an hourglass, for example. Namely, through-hole conductor (304b) has narrowed portion (304c), and the width of through-hole conductor (304b) gradually decreases as it comes closer to narrowed portion (304c) from first surface (F1), while it comes closer to narrowed portion (304c) from second surface (F2). However, that is not the only option, and the shape of through-hole conductor (304b) is determined freely.

Holes (313a, 314a) (each a via hole) are formed in insulation layer 101, and holes (321a, 322a, 323a, 324a) (each a via hole) are formed in insulation layer 102. By filling conductor (such as copper plating) in holes (313a, 314a, 321a, 322a, 323a, 324a), the conductor in the holes respectively becomes via conductors (313b, 314b, 321b, 322b, 323b, 324b) (each a filled conductor).

In the present embodiment, insulation layer 101 on the first-surface (F1) side of substrate 100 has via conductor (314b) (first via conductor). Also, insulation layer 102 on the second-surface (F2) side of substrate 100 has via conductor (324b) (first via conductor). Via conductors (314b, 324b) are stacked on through-hole conductor (304b).

In the present embodiment, via conductors (314b, 324b) and through-hole conductor (304b) are each a filled conductor and form stacked structure (S2) by being stacked in direction Z. Such stacked structure (S2) is suitable for miniaturization or omitting wiring. Also, each stacked structure (S2) is electrically connected to electrodes 210 of electronic components (200a~200d). In doing so, wiring is shortened and it is easier to decrease loop inductance. In addition, in a single-sided structure (such as those where a via conductor is connected only to fourth surface (F4) of an electronic component), an electrode of an electronic component and a conductive layer (conductive layer 110, for example) formed on the side (such as third-surface (F3) side) positioned opposite the via conductor connected to the electrode of the electronic component are easier to be electrically connected through stacked structure (S2).

Via conductors (321b, 321b, 321b, 321b) connected to their respective electrodes 210 of electronic components (200a~200d) are formed in insulation layer 102. Each electrode 210 of electronic components (200a~200d) is electrically connected to through-hole conductor (304b) by way of via conductor (324b), conductive layer 120 and via conductor (321b).

Figure 27A:
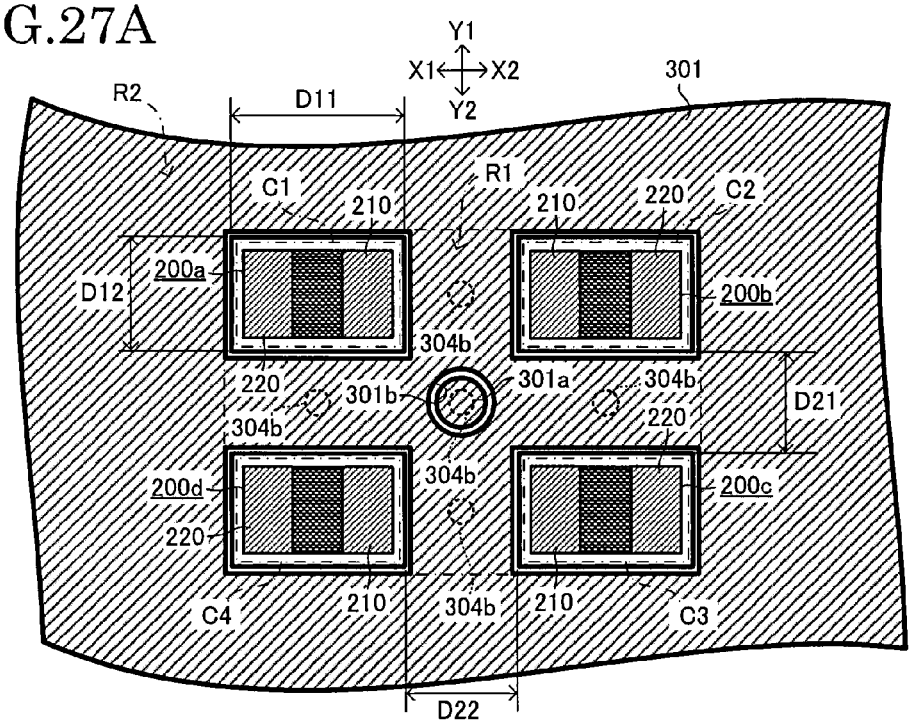
FIG. 27A is a plan view seen from the first-surface side of a core section of the wiring board according to the second embodiment of the present invention.
Figure 27B:
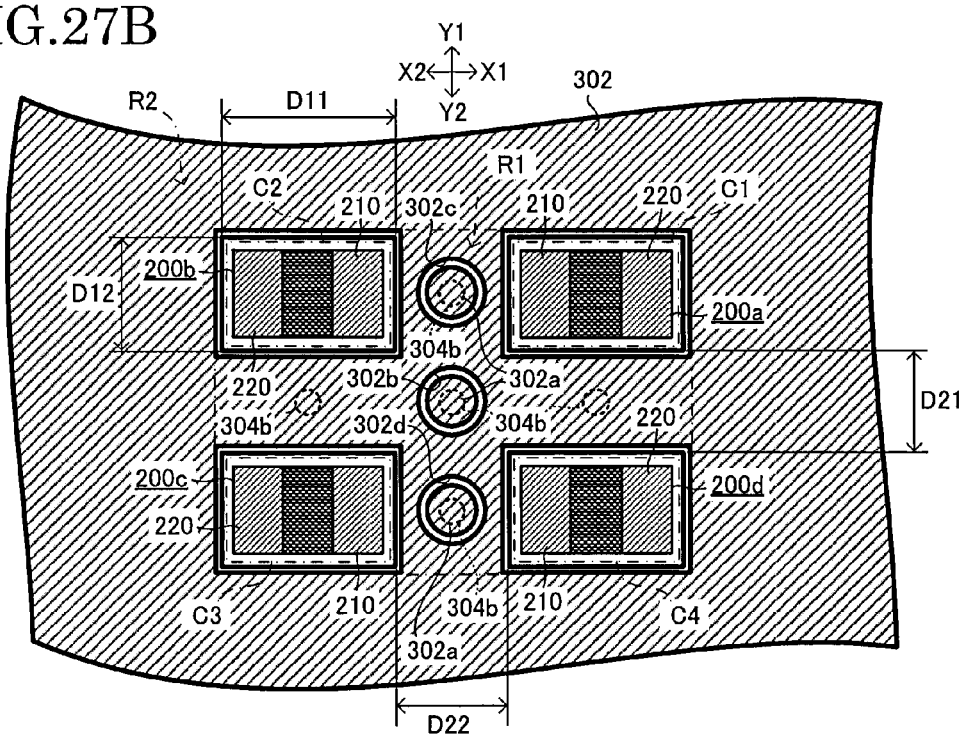
FIG. 27B is a plan view seen from the second-surface side of the core section of the wiring board according to the second embodiment of the present invention.

FIG. 27A shows a structure of the core section of wiring board 20 (in particular, the section with built-in electronic devices) seen from the first-surface (F1) side (or the third-surface (F3) side). Also, FIG. 27B shows a structure of the core section of wiring board 20 (in particular, the section with built-in electronic components) seen from the second-surface (F2) side (or the fourth-surface (F4) side). Moreover, FIGS. 28A and 28B are the enlargement of boundary section (R1) shown in FIGS. 27A and 27B.

As shown in FIGS. 27A and 27B, cavities (C1~C4) are also formed at a predetermined distance in substrate 100 (core substrate) of wiring board 20 according to the present embodiment, the same as wiring board 10 according to the first embodiment. Accordingly, boundary section (R1) with a substantially cruciform planar shape (X-Y plane) is formed between those cavities, and peripheral section (R2) is formed on the periphery of cavities (C1~C4) to be integrated with boundary section (R1).

A substantially cruciform conductive pattern is formed on boundary section (R1) having a cruciform planar shape (X-Y plane). A planar conductive pattern is formed on peripheral section (R2) of substrate 100. Such a planar conductive pattern is formed on substantially the entire region of substrate 100, for example. In addition, a substantially cruciform conductive pattern of boundary section (R1) and a planar conductive pattern on peripheral section (R2) formed to be integrated with the conductive pattern of the boundary section are included in conductive layer 301 or 302, for example (see FIG. 26).

Figure 28A:
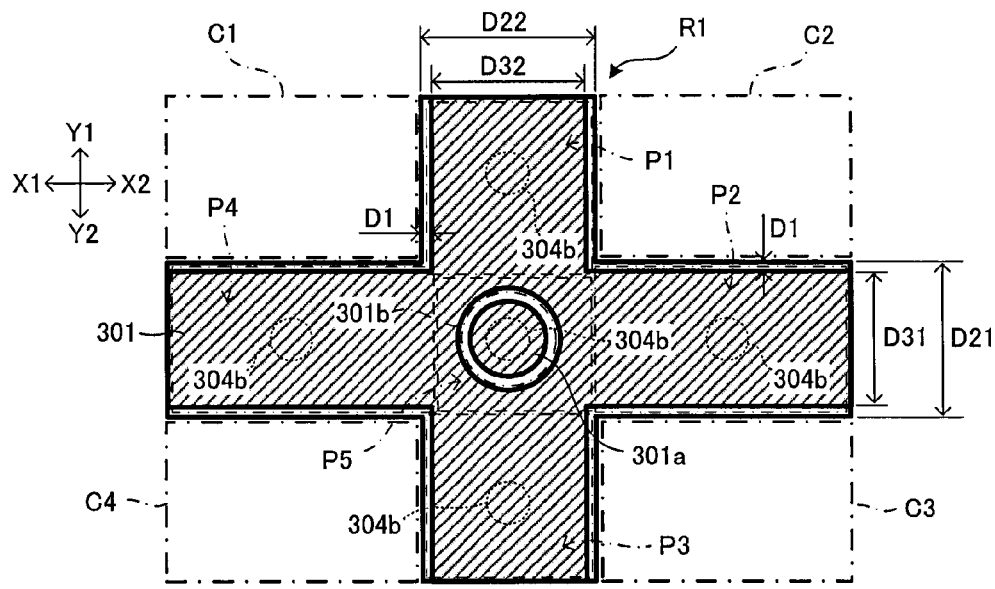
FIG. 28A is a magnified view showing the boundary section of the core section shown in FIG. 27A.
Figure 28B:
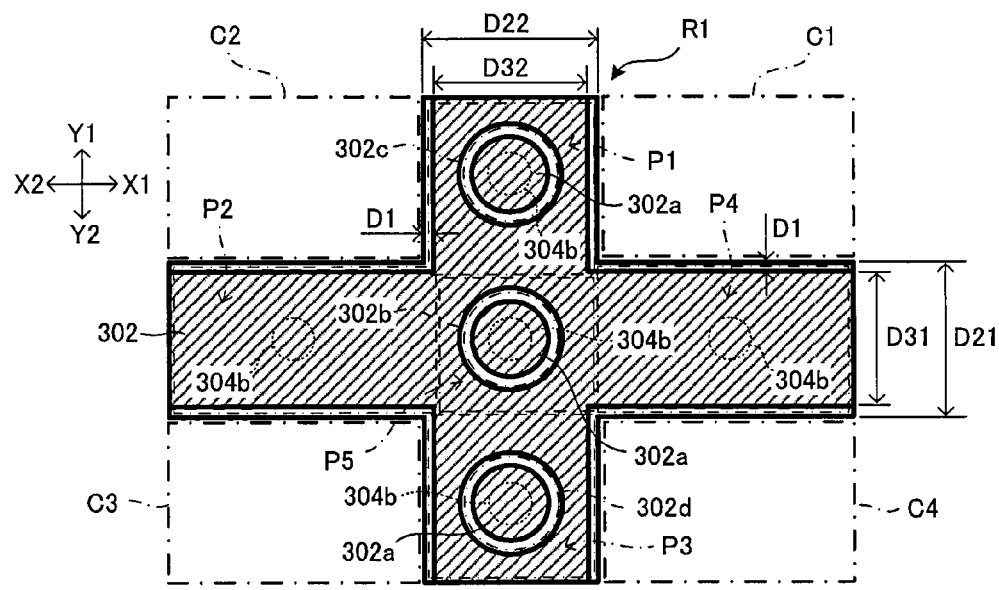
FIG. 28B is a magnified view showing the boundary section of the core section shown in FIG. 27B.

Boundary section (R1) of substrate 100 according to the present embodiment is formed with first boundary portion (P1), second boundary portion (P2), third boundary portion (P3), fourth boundary portion (P4) and intersection (P5) as shown in FIGS. 28A and 28B, for example. However, in wiring board 20 of the present embodiment, through-hole conductors (304b) penetrating through substrate 100 are respectively formed between cavity (C1) and cavity (C2) (first boundary portion (P1)), between cavity (C2) and cavity (C3) (second boundary portion (P2)), between cavity (C3) and cavity (C4) (third boundary portion (P3)), between cavity (C4) and cavity (C1) (fourth boundary portion (P4)), and intersection (P5), as shown in FIGS. 27A~28B. In the present embodiment, through-hole conductors are formed on two lines forming the substantially cruciform boundary section (R1).

Opening portion (301b) is formed in the conductive pattern (conductive layer 301) on first surface (F1) of intersection (P5), and opening portion (302b) is formed in the conductive pattern (conductive layer 302) on second surface (F2) of intersection (P5). Through-hole conductor (304b) which penetrates through substrate 100 is formed in positions corresponding to opening portions (301b, 302b) of substrate 100. Lands (301a, 302a) connected to both ends of through-hole conductor (304b) are respectively positioned in opening portions (301b, 302b), and are insulated from the substantially cruciform conductive patterns on surrounding boundary section (R1) (on first surface (F1) and second surface (F2)).

Also, opening portion (302c) is formed in the conductive pattern (conductive layer 302) on second surface (F2) of first boundary portion (P1), and opening portion (302d) is formed in the conductive pattern (conductive layer 302) on second surface (F2) of third boundary portion (P3). Through-hole conductor (304b) of first boundary portion (P1) and through-hole conductor (304b) of third boundary portion (P3) are formed in positions corresponding to opening portions (302c, 302d) of substrate 100 respectively. Lands (302a) connected to the ends (the second-surface (F2) side) of through-hole conductors (304b) are positioned respectively in opening portions (302c, 302d), and are insulated from the substantially cruciform conductive pattern on second surface (F2) of surrounding boundary section (R1). In addition, each of the other ends (the first-surface (F1) side) of through-hole conductor (304b) is connected to the substantially cruciform conductive pattern on first surface (F1) of boundary section (R1).

Each end (the first surface (F1) side) of through-hole conductor (304b) in second boundary portion (P2) and through-hole conductor (304b) in fourth boundary portion (P4) is connected to the substantially cruciform conductive pattern on first surface (F1) of boundary section (R1), and the other end (the second surface (F2) side) is connected to the substantially cruciform conductive pattern on second surface (F2) of boundary section (R1). Namely, the substantially cruciform conductive pattern on first surface (F1) of boundary section (R1) and the substantially cruciform conductive pattern on second surface (F2) of boundary section (R1) are electrically connected to each other by through-hole conductor (304b) in second boundary portion (P2) and through-hole conductor (304b) in fourth boundary portion (P4).

In the present embodiment, through-hole conductor (304b) in first boundary portion (P1), through-hole conductor (304b) in second boundary portion (P2), through-hole conductor (304b) in third boundary portion (P3) and through-hole conductor (304b) in fourth boundary portion (P4) are electrically connected to each other by a substantially cruciform conductive pattern on first surface (F1) of boundary section (R1).

In the present embodiment, via conductors (314b, 324b) are stacked on all through-hole conductors (304b). However, the present embodiment is not limited to such, and it is also an option for via conductors (314b, 324b) not to be stacked on all through-hole conductors (304b) (for example, they may be stacked only on through-hole conductor (304b) on intersection (P5)).

Electronic components (200a~200d) are positioned respectively in cavities (C1~C4).

Figure 29A:
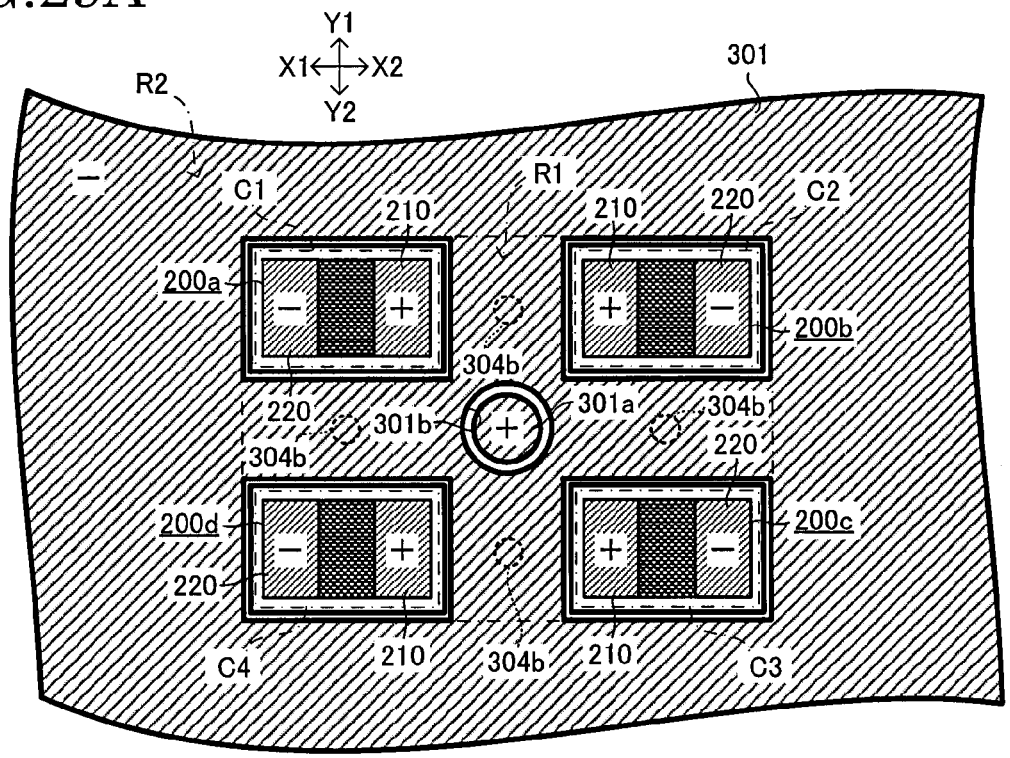
FIG. 29A is a view showing the polarity of each conductive pattern in the core section shown in FIG. 27A.
Figure 29B:
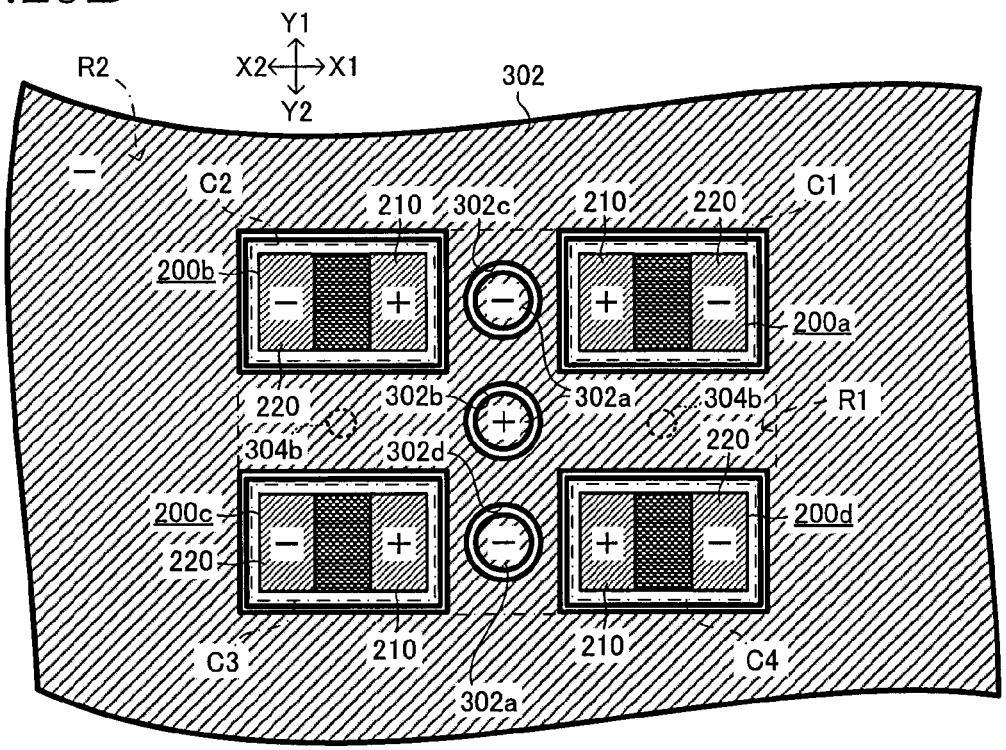
FIG. 29B is a view showing the polarity of each conductive pattern in the core section shown in FIG. 27B.

As shown in FIGS. 29A and 29B, the substantially cruciform conductive pattern on first surface (F1) of boundary section (R1) and the substantially cruciform conductive pattern on second surface (F2) of boundary section (R1) have the same polarity as each other in the present embodiment. Specifically, the substantially cruciform conductive pattern on first surface (F1) of boundary section (R1) and the substantially cruciform conductive pattern on second surface (F2) of boundary section (R1), as well as through-hole conductor (304b) in second boundary portion (P2) and through-hole conductor (304b) in fourth boundary portion (P4) which connect those conductive patterns to each other, each have a negative (−) polarity, for example. Also, through-hole conductor (304b) in first boundary portion (P1) and through-hole conductor (304b) in third boundary portion (P3) which are connected to the substantially cruciform conductive pattern on first surface (F1) of boundary section (R1) each have a negative (−) polarity, for example. On the other hand, through-hole conductor (304b) and its lands (301a, 302a), which are positioned in opening portions (301b, 302b) and are insulated from substantially cruciform conductive patterns on surrounding boundary section (R1) (on first surface (F1) and on second surface (F2)), have a positive (+) polarity, for example.

The substantially cruciform conductive patterns formed respectively on first surface (F1) and second surface (F2) of boundary section (R1), the planar conductive patterns on peripheral section (R2) integrated with their respective substantially cruciform conductive patterns, and through-hole conductors (304b) formed in first to fourth boundary portions (P1~P4) are each electrically connected to ground terminals (electrodes 220) of electronic components (200a~200d). Through-hole conductor (304b) in opening portions (301b, 302b) formed in intersection (P5) is electrically connected to each power-source terminal (electrode 210) of electronic components (200a~200d). However, that is not the only option; for example, the polarities of electrodes 210 and electrodes 220 may be reversed.

In wiring board 20 of the present embodiment, the substantially cruciform planar shape of boundary section (R1) is preferred to be made by two lines which have a width approximately 0.2 mm or greater and approximately 2.0 mm or less and intersect at substantially right angles. Namely, width (D21) of line X and width (D22) of line Y (see FIGS. 27A~28B) are each preferred to be in the range of approximately 0.2 mm to approximately 2.0 mm. By setting the widths of boundary section (R1) as above, it is suitable for miniaturizing wiring boards, while enhancing the strength of boundary section (R1) and securing the space for insulating between adjacent electronic components and for forming through-hole conductors.

Other dimensions (widths (D11, D12) of cavities (C1~C4), for example) are set the same as those in the first embodiment, for example.

Figure 30A:
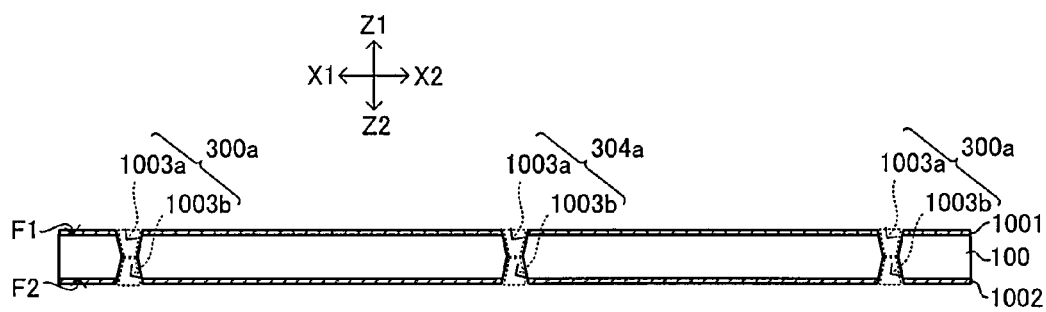
FIG. 30A, in a method for manufacturing a wiring board according to the second embodiment of the present invention, is a view illustrating a first step for forming through-hole conductors in the substrate and conductive layers on the substrate.

Wiring board 20 of the present embodiment is also manufactured by the procedures shown in FIG. 9, for example, the same as wiring board 10 of the first embodiment. However, wiring board 20 of the present embodiment includes through-hole conductors (304b). Thus, after double-sided copper-clad laminate 1000 (see FIG. 10) is prepared in step (S11) of FIG. 9, a $CO_2$ laser, for example, is used in subsequent step (S12) of FIG. 9 to form through hole (300a) made up of holes (1003a, 1003b) along with through hole (304a) made up of holes (1003a, 1003b) as shown in FIG. 30A. The boundary between hole (1003a) and hole (1003b) corresponds to narrowed portion (304c) (FIG. 26) of through hole (304a). Laser irradiation on first surface (F1) and laser irradiation on second surface (F2) may be performed at the same time or separately, one surface at a time. After through hole (304a) is formed, desmearing is preferred to be conducted on through hole (304a). Unwanted conduction (short circuiting) is suppressed by desmearing. Through hole (304a) may be formed using a drill or by etching instead of using a laser. However, it is easier to achieve fine processing using a laser.

Figure 30B:
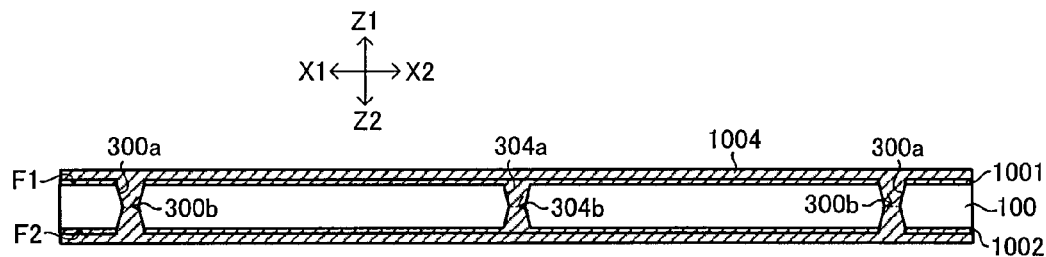
FIG. 30B is a view illustrating a second step subsequent to the step in FIG. 30A.

Using a panel plating method, for example, substantially the same as in the first embodiment, copper plating 1004, for example, is formed on metal foils (1001, 1002), in through hole (300a) and through hole (304a) as shown in FIG. 30B. Accordingly, plating 1004 is filled in through hole (300a) to form through-hole conductor (300b), and plating 1004 is filled in through hole (304a) to form through-hole conductor (304b).

Figure 31A:
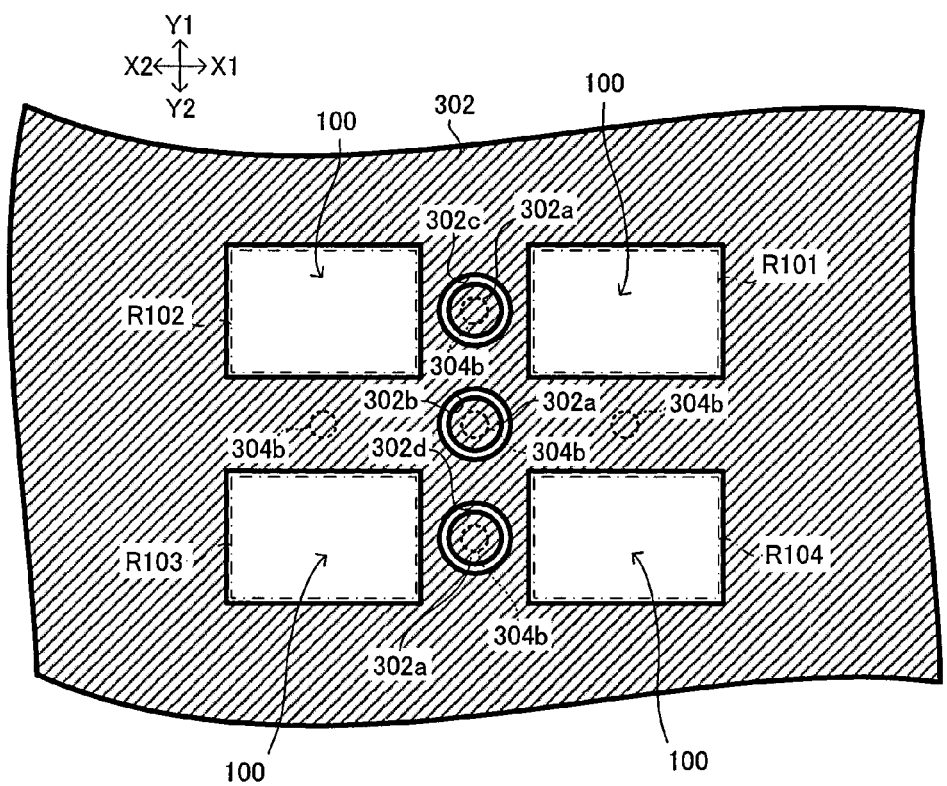
FIG. 31A, in the method for manufacturing a wiring board according to the second embodiment of the present invention, is a view showing the core section prior to forming cavities.
Figure 31B:
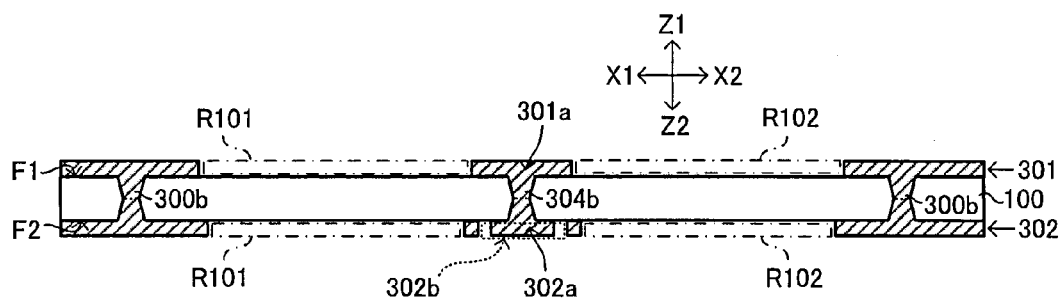
FIG. 31B is a cross-sectional view showing the core section shown in FIG. 31A.

Each conductive layer is covered by etching resist having a pattern corresponding to conductive layer 301 or 302, for example, and the portions of each conductive layer not covered by the etching resist are etched away. In doing so, conductive layers (301, 302) are respectively formed on first surface (F1) and second surface (F2) of substrate 100 as shown in FIGS. 31A and 31B. Opening portions (R101~R104) corresponding to cavities (C1~C4) are formed in conductive layers (301, 302). Accordingly, a planar conductive pattern is formed on an outer side, and a substantially cruciform conductive pattern integrated with the outer planar conductive pattern is formed on its inner side.

Opening portions (301b, 302b) are formed in intersections of substantially cruciform conductive patterns (FIG. 31A shows only opening portion (302b)). Then, lands (301a, 302a) of through-hole conductor (304b) are formed in opening portions (301b, 302b) (FIG. 31A shows only land (302a)). Through-hole conductor (304b) is formed in a position corresponding to opening portions (301b, 302b) of substrate 100.

As shown in FIG. 31A, opening portion (302c) is formed in the conductive pattern between opening portion (R101) and opening portion (R102) (conductive layer 302). Then, land (302a) of through-hole conductor (304b) is formed in opening portion (302c). Namely, through-hole conductor (304b) is formed in a position corresponding to opening portion (302c) of substrate 100.

As shown in FIG. 31A, opening portion (302d) is formed in the conductive pattern between opening portion (R103) and opening portion (R104) (conductive layer 302). Then, land (302a) of through-hole conductor (304b) is formed in opening portion (302d). Namely, through-hole conductor (304b) is formed in a position corresponding to opening portion (302d) of substrate 100.

Figure 32A:
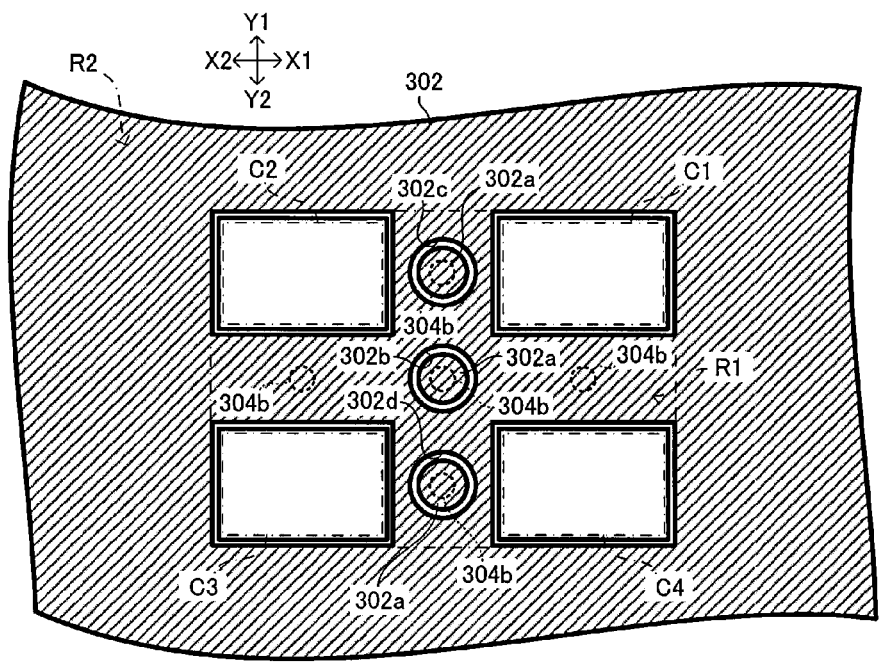
FIG. 32A, in the method for manufacturing a wiring board according to the second embodiment of the present invention, is a view showing the core section after cavities are formed.
Figure 32B:
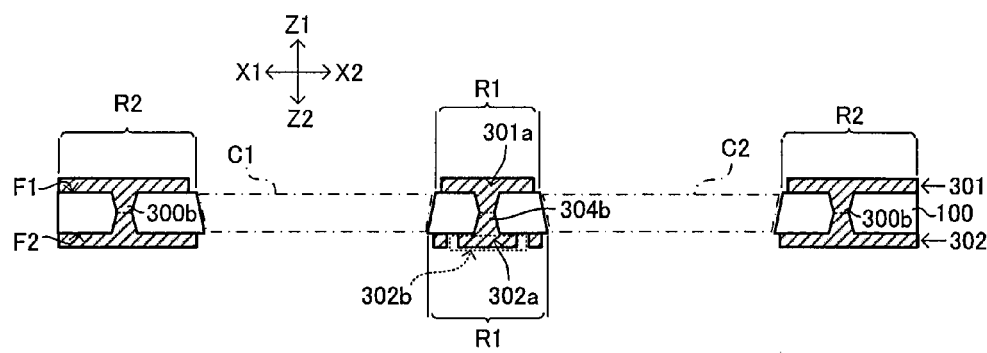
FIG. 32B is a cross-sectional view of the core section shown in FIG. 32A.

In step (S13) of FIG. 9, cavities (C1~C4) are formed through laser irradiation substantially the same as that in the first embodiment (see FIGS. 13A and 13B), for example, as shown in FIGS. 32A and 32B. Accordingly, peripheral section (R2) is formed along with boundary section (R1) integrated with it.

Then, using a method substantially the same as in the first embodiment, for example, electronic components (200a~200d) are positioned respectively in cavities (C1~C4) of substrate 100, insulation layers (101, 102) are formed on the core section, and insulator (101a) is filled in the gap between an electronic component in each cavity and substrate 100 (see FIG. 26). In addition, via conductors (313b, 314b, 321b~324b) made of copper plating, for example, are formed in insulation layers (101, 102) (see FIG. 26). Via conductors (314b, 324b) are each stacked on through-hole conductor (304b).

Using a method substantially the same as in the first embodiment, for example, conductive layers (110, 120) are formed respectively on insulation layers (101, 102) (see FIG. 26). Furthermore, using a method substantially the same as in the first embodiment, for example, solder resist 11 having opening portions (11a) is formed on insulation layer 101 and conductive layer 110, and solder resist 12 having opening portions (12a) is formed on insulation layer 102 and conductive layer 120 (see FIG. 26). Accordingly, wiring board 20 of the present embodiment is completed.

In wiring board 20 of the present embodiment, through-hole conductors (304b) are formed in boundary section (R1), and conductive patterns on both surfaces of boundary section (R1) are connected to each other by through-hole conductors (304b). In particular, land (301a) in opening portion (301b) and land (302a) in opening portion (302b) are connected to each other by through-hole conductor (304b) in intersection (P5); the substantially cruciform conductive pattern on first surface (F1) of boundary section (R1) and the substantially cruciform conductive pattern on second surface (F2) of boundary section (R1) are connected to each other by through-hole conductors (304b) in second boundary portion (P2) and fourth boundary portion (P4); and the substantially cruciform conductive pattern on first surface (F1) of boundary section (R1) and lands (302a) in opening portions (302c, 302d) are connected to each other by through-hole conductors (304b) in first boundary portion (P1) and third boundary portion (P3). When such a structure is employed, the strength or heat dissipation of boundary section (R1) tends to be improved.

In wiring board 20 of the present embodiment, opening portion (302b) is formed in intersection (P5) of the substantially cruciform conductive pattern of boundary section (R1), and through-hole conductor (304b) which penetrates through substrate 100 is formed in a position corresponding to opening portion (302b) of intersection (P5). When such a structure is employed, the strength or heat dissipation of boundary section (R1) tends to be improved. In addition, by electrically connecting through-hole conductor (304b) to each electrode 210 of electronic components (200a~200d), wiring is shortened and the loop inductance is easily reduced.

Also, in the present embodiment, regarding the structure and the treatments which are the same as those in the first embodiment, substantially the same effects are achieved as those described previously in the first embodiment.

Other Embodiments

Figure 33:
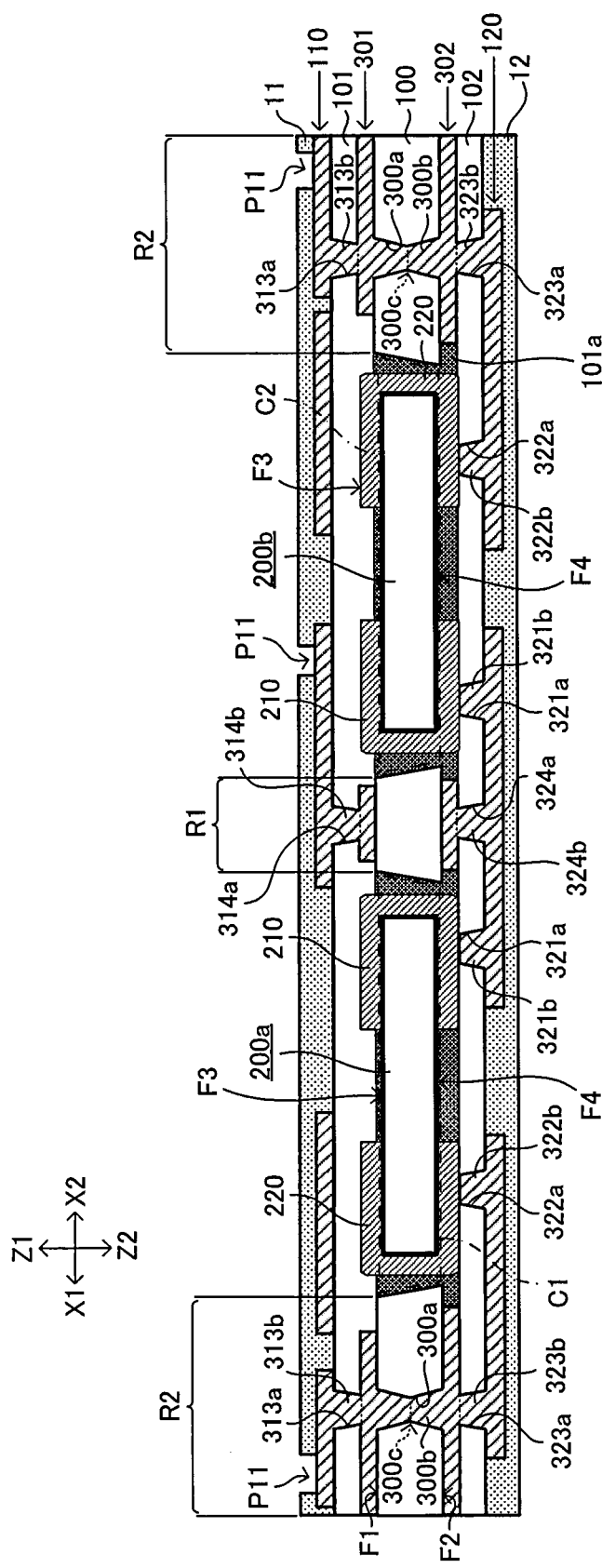
FIG. 33, in another embodiment of the present invention, is a cross-sectional view of an example in which a through-hole conductor between opening portions (cavities) is omitted from the wiring board shown in FIGS. 27A and 27B.
Figure 34A:
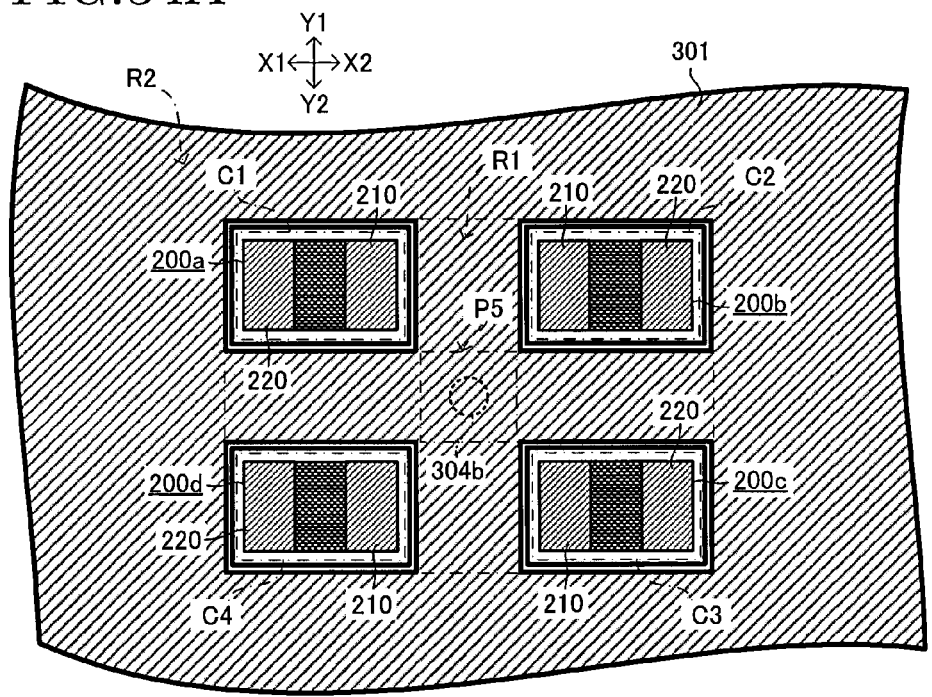
FIG. 34A is a plan view seen from the first-surface side of a core section of the wiring board shown in FIG. 33.
Figure 34B:
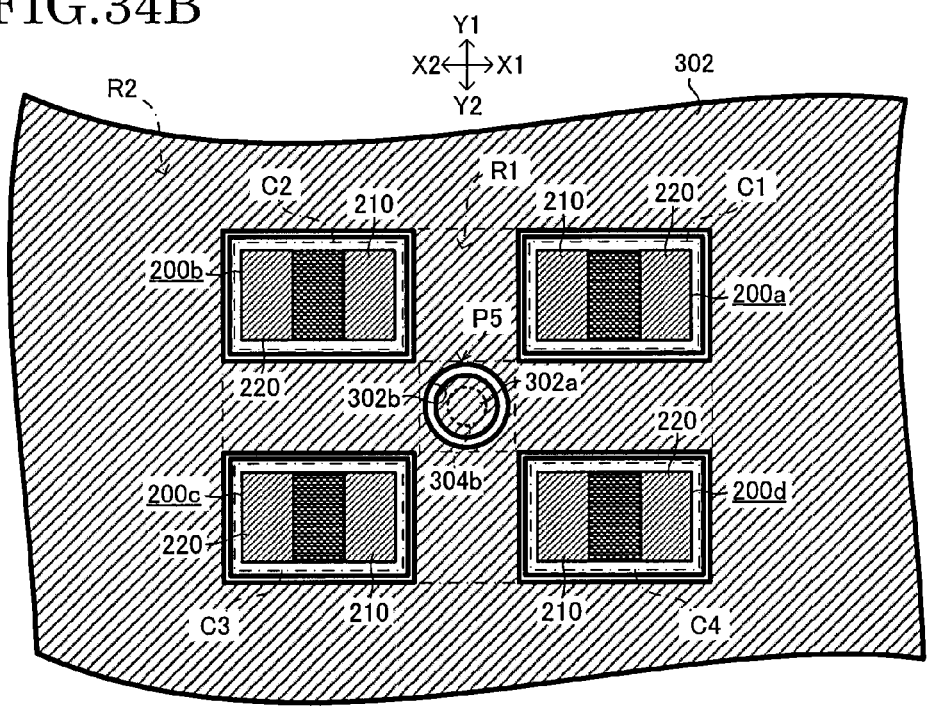
FIG. 34B is a plan view seen from the second-surface side of the core section of the wiring board shown in FIG. 33.

In wiring board 20 of the second embodiment, through-hole conductors (304b) in first boundary portion (P1), second boundary portion (P2), third boundary portion (P3) and fourth boundary portion (P4) may be omitted as shown in FIGS. 33, 34A and 34B.

In the example shown in FIGS. 34A and 34B, through-hole conductor (304b) is formed in intersection (P5). Also, opening portion (302b) is formed in the conductive pattern (conductive layer 302) on second surface (F2) of intersection (P5). Land (302a) (conductive layer 302) in intersection (P5) connected to an end (the second-surface (F2) side) of through-hole conductor (304b) is positioned in opening portion (302b) and is insulated from the substantially cruciform conductive pattern on second surface (F2) of surrounding boundary section (R1). Also, the other end (the first-surface (F1) side) of through-hole conductor (304b) in intersection (P5) is connected to the substantially cruciform conductive pattern on first surface (F1) of boundary section (R1).

Figure 35A:
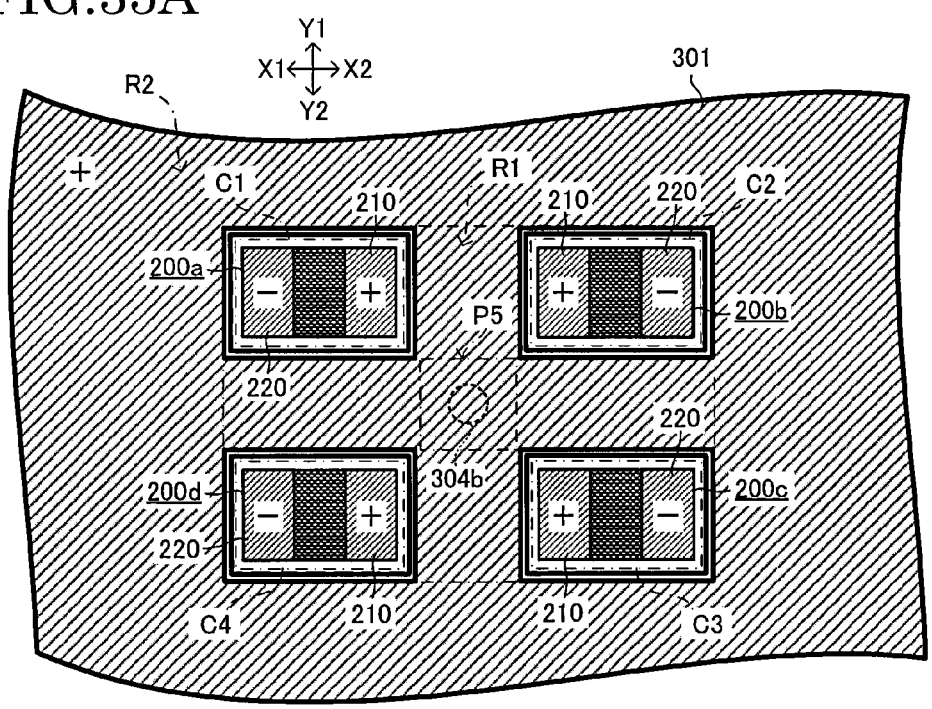
FIG. 35A is a view showing the polarity of each conductive pattern of the core section shown in FIG. 34A.
Figure 35B:
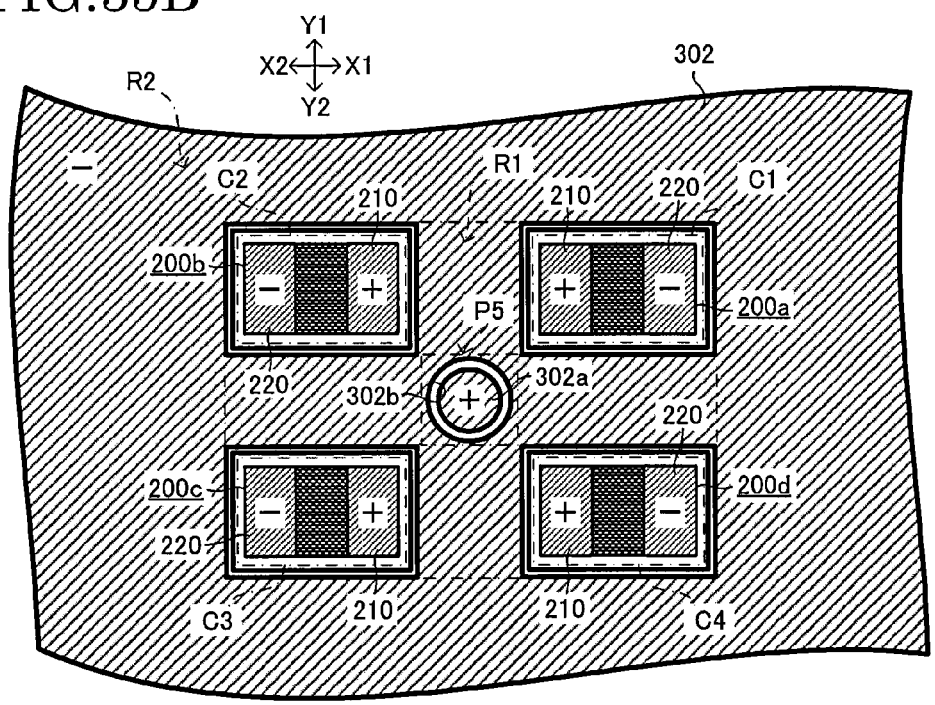
FIG. 35B is a view showing the polarity of each conductive pattern of the core section shown in FIG. 34B.

As shown in FIGS. 35A and 35B, the substantially cruciform conductive pattern on first surface (F1) of boundary section (R1) may have a different polarity from the substantially cruciform conductive pattern on second surface (F2) of boundary section (R1). In the example shown in FIGS. 35A and 35B, the substantially cruciform conductive pattern on first surface (F1) of boundary section (R1) and the planar conductive pattern on peripheral section (R2) integrated with that conductive pattern have a positive (+) polarity, and the substantially cruciform conductive pattern on second surface (F2) of boundary section (R1) and the planar conductive pattern on peripheral section (R2) integrated with that conductive pattern have a negative (−) polarity. In addition, through-hole conductor (304b) in intersection (P5) connected to the substantially cruciform conductive pattern on first surface (F1) of boundary section (R1) has a positive (+) polarity.

A conductive pattern having a positive (+) polarity is connected to each power-source terminal (such as electrode 210) of electronic components (200a~200d), for example, and a conductive pattern having a negative (−) polarity is connected to each ground terminal (such as electrode 210) of electronic components (200a~200d), for example. Here, their polarities may be reversed.

Figure 36:
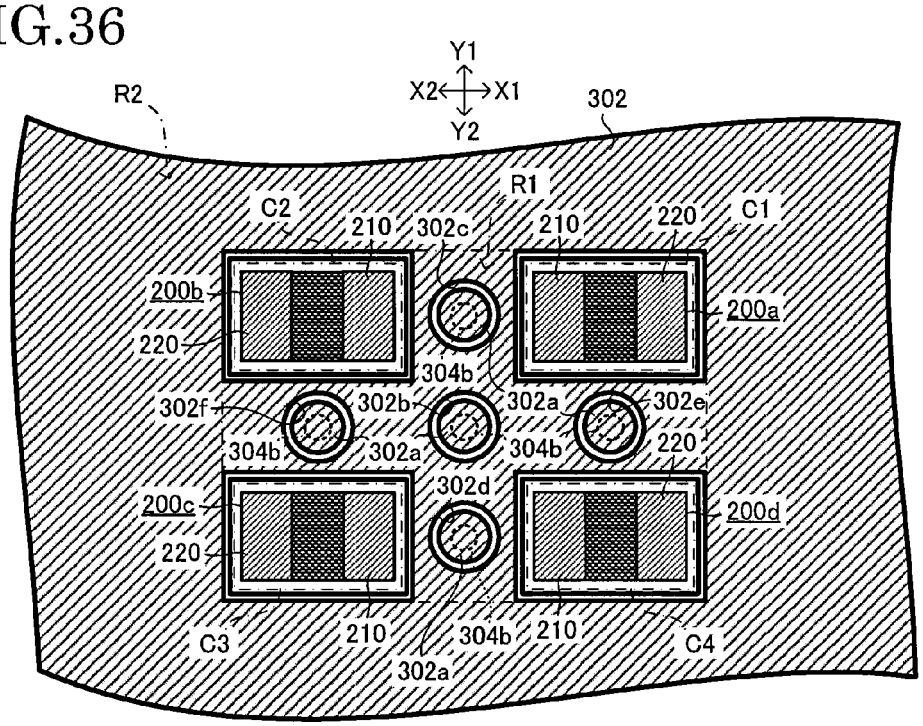
FIG. 36, in yet another embodiment of the present invention, is a view showing an example in which through-hole conductors (and their lands) formed in the boundary section of the substrate are all positioned in opening portions.

Regarding wiring board 20 of the second embodiment, it is an option to further form opening portion (302e) between cavity (C1) (first opening portion) and cavity (C4) (fourth opening portion) and opening portion (302f) between cavity (C2) (second opening portion) and cavity (C3) (third opening portion) as shown in FIG. 36, for example. Then, through-hole conductors (304b) may also be formed respectively in such opening portions (302e, 302f).

Regarding each through-hole conductor (304b), only an end may be electrically connected to a substantially cruciform conductive pattern on boundary section (R1); both of its ends may be electrically connected to the substantially cruciform conductive patterns on boundary section (R1); or both of its ends may be insulated from the substantially cruciform conductive patterns on boundary section (R1).

Figure 37:
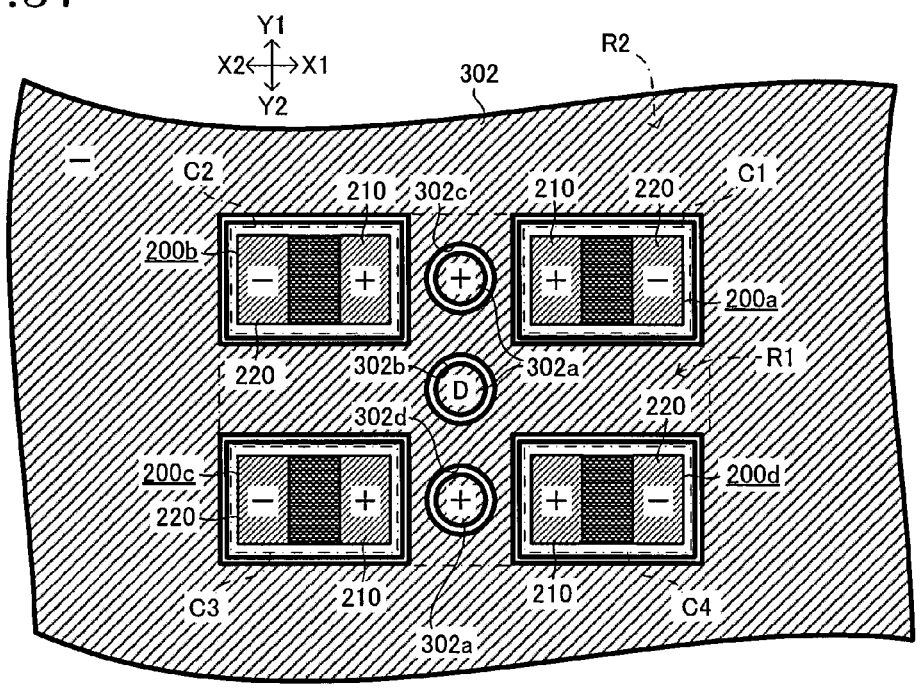
FIG. 37, in yet another embodiment of the present invention, is a view showing an example in which one of the through-hole conductors formed in the boundary section of the substrate is not electrically connected to a terminal of an electronic device.

Regarding wiring board 20 of the second embodiment or its modified examples, one of through-hole conductors (304b) in opening portions (302b, 302c, 302d) may be set not to be electrically connected to the terminals of electronic components. For example, as shown in FIG. 37, through-hole conductor (304b) in intersection (P5) may be dummy conductor (D) which is not electrically connected to any terminal of electronic devices. Dummy conductors are effective for improving heat dissipation. The number of dummy conductors is not limited specifically, and it may be more than one. For example, through-hole conductors (304b) in opening portions (302b, 302c, 302d, 302e, 302f) may all be dummy conductors.

Figure 38:
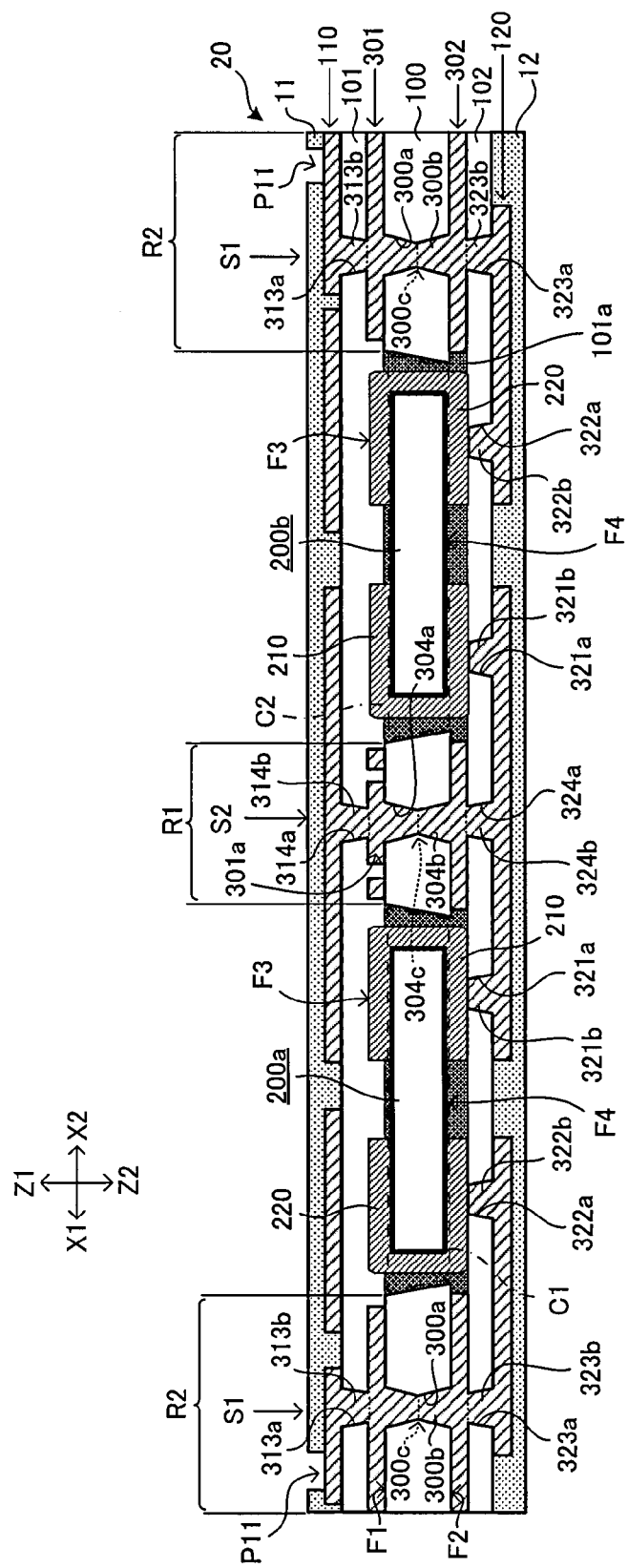
FIG. 38, in yet another embodiment of the present invention, is a view showing a wiring board in which an electrode of a built-in electronic device is electrically connected to a through-hole conductor formed in the boundary section by way of a first via conductor connected to a conductive pattern on the boundary section and a second via conductor connected to the electrode of the electronic device.

An electrode of an electronic device (one of electronic components (200a~200d), for example) built into a cavity (opening portion) formed in the substrate may be electrically connected to a through-hole conductor formed in a boundary portion between cavities by way of a first via conductor connected to a conductive pattern on the boundary section and a second via conductor connected to the electrode of the electronic device. For example, as shown in FIG. 38, it is an option for electrodes 210 of electronic components (200a, 200b) to be electrically connected to through-hole conductor (304b) formed in boundary section (R1) by way of via conductor (324b), via conductors (321b, 321b) and conductive layer 120. In the example shown in FIG. 38, via conductor (324b) is formed in insulation layer 102 and is connected to the substantially cruciform conductive pattern on second surface (F2) of boundary section (R1). Via conductors (321b, 321b) are each formed in insulation layer 102 and are connected to electrode 210 of electronic component (200a) or (200b). Conductive layer 120 is formed on insulation layer 102 and electrically connects via conductor (324b) and via conductors (321b, 321b) to each other. Via conductor (324b) is stacked on through-hole conductor (304b).

Figure 39:
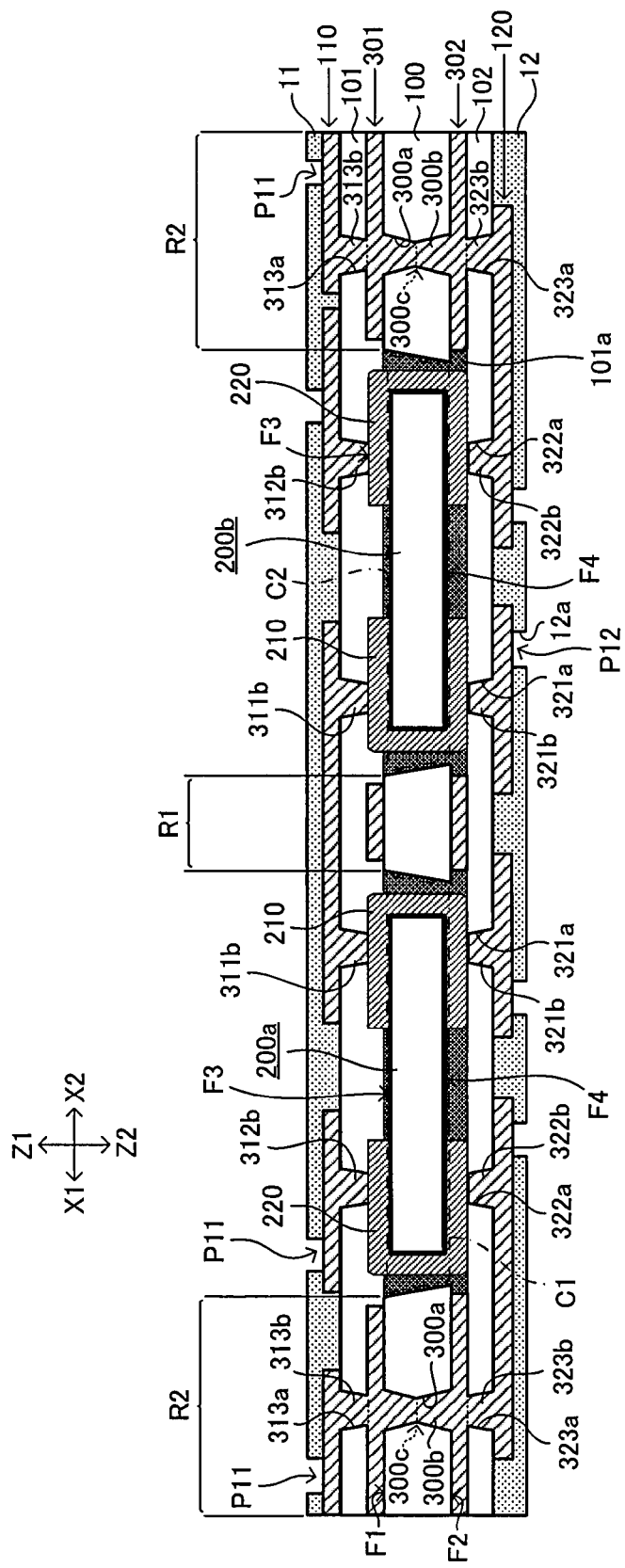
FIG. 39, in yet another embodiment of the present invention, is a view showing a wiring board with a double-sided via structure.

As shown in FIG. 39, both surfaces (third surfaces (F3) and fourth surfaces (F4)) of electronic components (200a~200d) may be connected to via conductors. In the example shown in FIG. 39, third surface (F3) of electrode 210 of each electronic component is connected to via conductor (311b), and third surface (F3) of electrode 220 of each electronic component is connected to via conductor (312b), fourth surface (F4) of electrode 210 of each electronic component is connected to via conductor (321b), and fourth surface (F4) of electrode 220 of each electronic component is connected to via conductor (322b).

Figure 40:
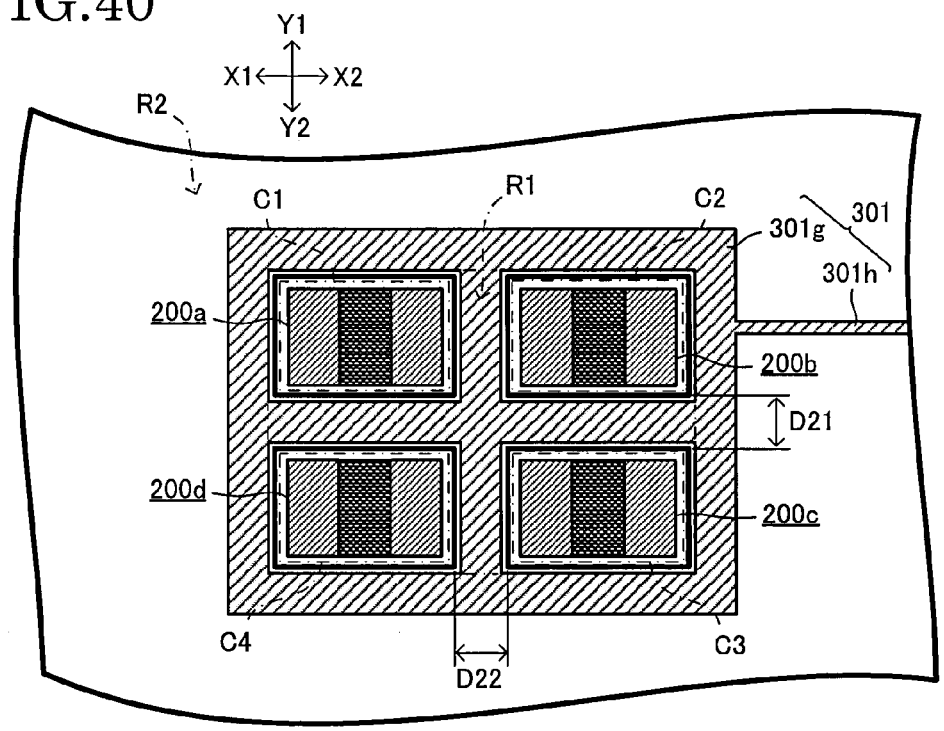
FIG. 40, in yet another embodiment of the present invention, is a view showing an example in which a conductive pattern formed on the peripheral section is made of a linear conductive pattern.

The shape of the conductive patterns formed on peripheral section (R2) is not limited to being planar. For example, as shown in FIG. 40, it may be linear conductive pattern (301g) (such as a frame) that surrounds cavity (C1) (first opening portion), cavity (C2) (second opening portion), cavity (C3) (third opening portion) and cavity (C4) (fourth opening portion). Also, to electrically connect such a linear conductive pattern (such as conductive pattern (301g)) to another conductive pattern (such as a circuit), wiring (301h) (conductive pattern) may be formed to be integrated with the linear conductive pattern (such as conductive pattern (301g)) as shown in FIG. 40, for example. Conductive pattern (301g) and wiring (301h) may be formed as conductive layer 301, for example.

Figure 41:
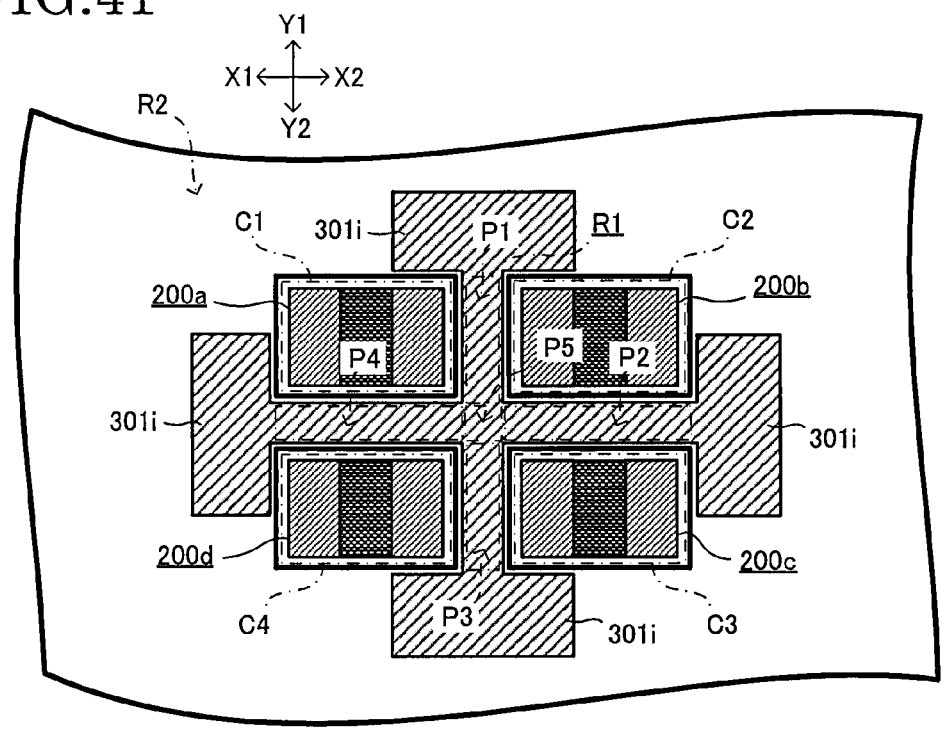
FIG. 41, in yet another embodiment of the present invention, is a view showing an example in which conductive patterns formed on the peripheral section do not surround cavities.

The conductive patterns formed on peripheral section (R2) are not required to surround cavity (C1) (first opening portion), cavity (C2) (second opening portion), cavity (C3) (third opening portion) and cavity (C4) (fourth opening portion). For example, as shown in FIG. 41, multiple planar conductive patterns (301i) may be formed to be integrated with the substantially cruciform conductive patterns on boundary section (R1). In the example shown in FIG. 41, planar conductive pattern (301i) is connected to each tip of the substantially cruciform conductive pattern of boundary section (R1) (in particular, four portions extending in four directions from the intersection of the cross).

Figure 42:
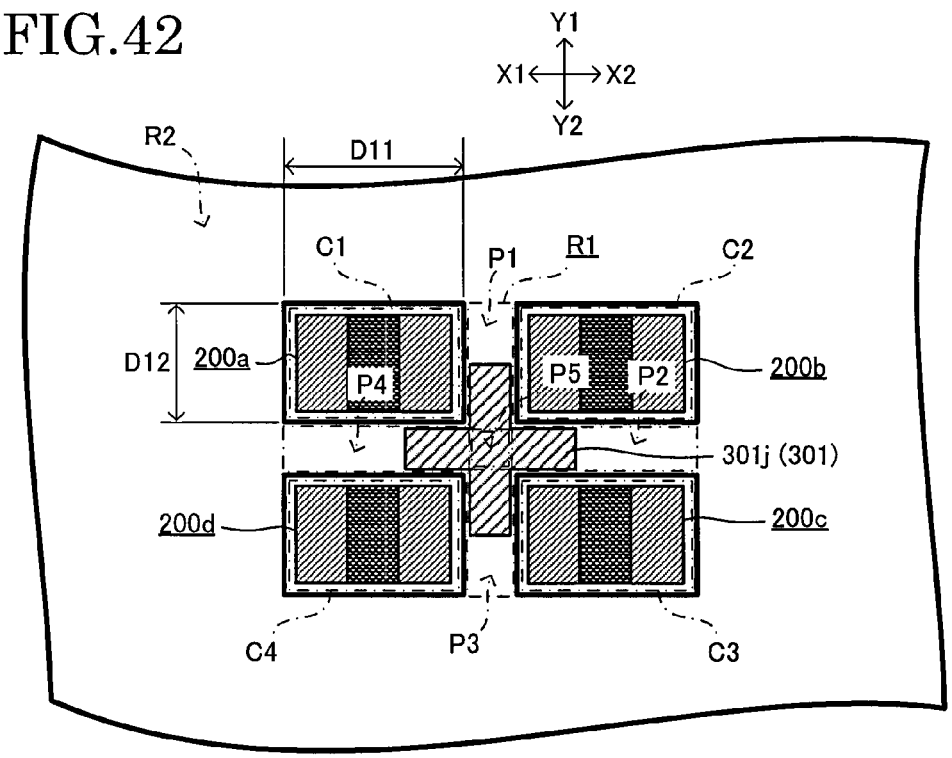
FIG. 42, in yet another embodiment of the present invention, is a view showing an example in which a conductive pattern is formed on only part of each boundary portion (not formed on the entire boundary section)

In each of the above embodiments, a conductive pattern is formed in substantially the entire region of first boundary portion (P1), second boundary portion (P2), third boundary portion (P3) or fourth boundary portion (P4). However, that is not the only option. For example, as shown in substantially cruciform conductive pattern (301j) (conductive layer 301) in FIG. 42, it is also an option for four portions (the conductive pattern on each boundary portion) extending in four directions (directions X1, X2, Y1, Y2) from the intersection of the cross to have a length that does not reach the end of each cavity (a length shorter than width (D11) or (D12) of each cavity). In conductive pattern (301j) shown in FIG. 42, a conductive pattern is formed on substantially the entire region of intersection (P5), while conductive patterns are formed only on part of first boundary portion (P1), second boundary portion (P2), third boundary portion (P3) and fourth boundary portion (P4).

Figure 43:
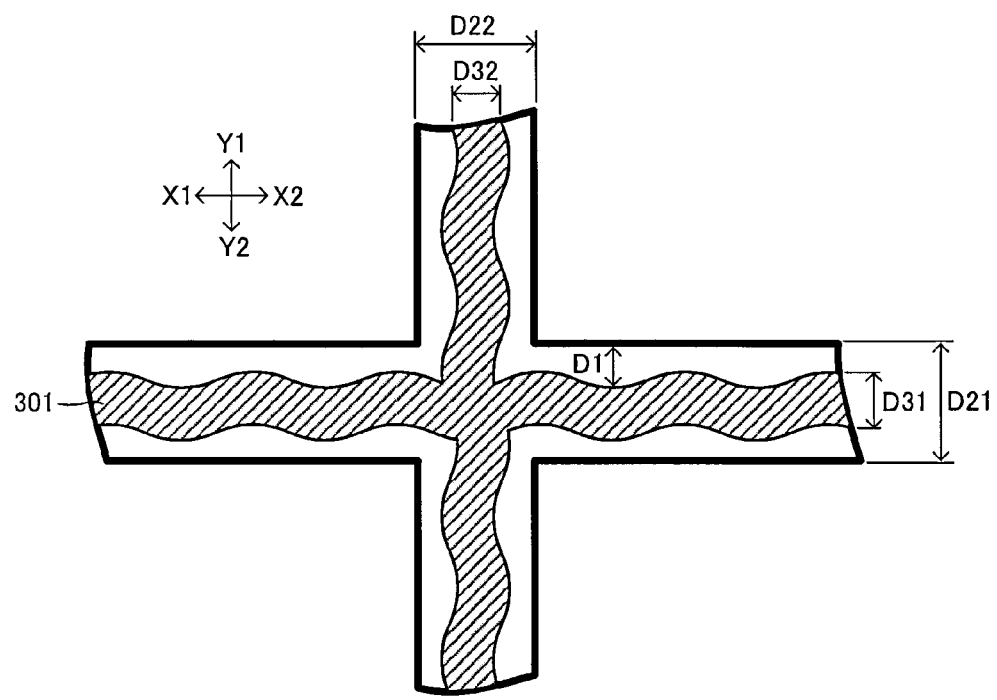
FIG. 43, in yet another embodiment of the present invention, is a view showing an example in which a wavy conductive pattern is formed on the boundary section.

The conductive pattern on boundary section (R1) (for example, on each portion extending from the intersection of the cross) is not limited to being linear. For example, as shown in FIG. 43, it may be a wavy conductive pattern. In the example shown in FIG. 43, distance (D1) is not constant.

The conductive pattern on boundary section (R1) may be set thicker than the other conductive pattern in the same layer (conductive layer 301 or 302, for example).

The conductive pattern on boundary section (R1) may be formed only on one surface of substrate 100 (first surface (F1) or second surface (F2).

Figure 44:
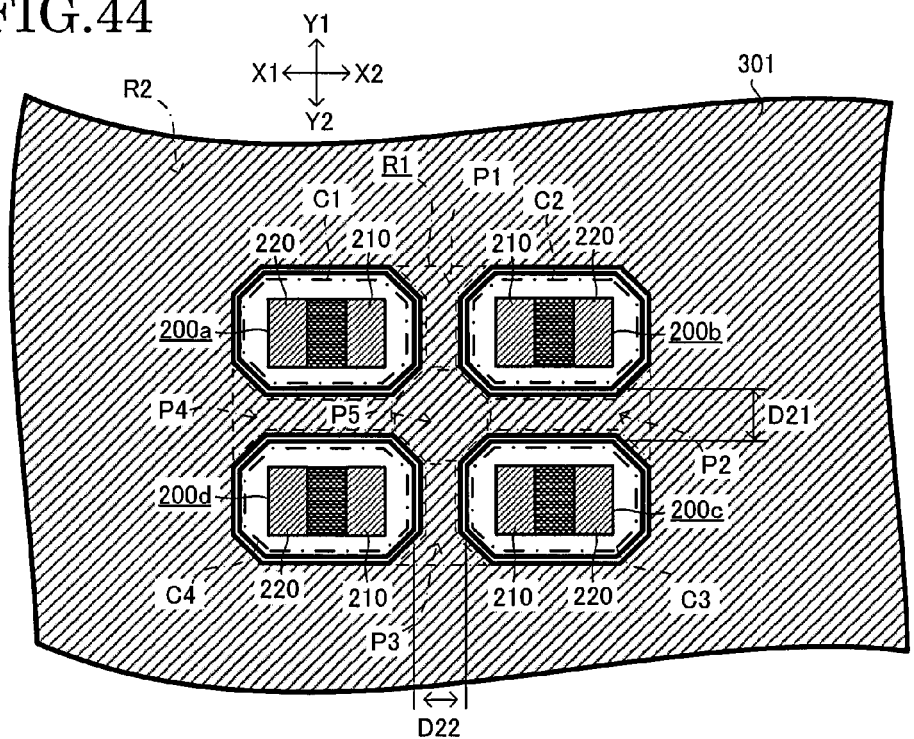
FIG. 44, in yet another embodiment of the present invention, is a view showing an example in which the boundary section (in particular, each portion extending in four directions from the intersection) has irregular width.

As shown in FIG. 44, corners of cavities (C1~C4) (first through fourth opening portions) may be set round. In the example shown in FIG. 44, cavities (C1~C4) each have a polygonal (such as substantially octagonal) planar shape (on the X-Y plane) which is almost circular rather than rectangular. In addition, corresponding to such a shape, each base portion and tip portion of the four portions extending in four directions from the intersection of the substantially cruciform conductive pattern on boundary section (R1) may be widened as shown in FIG. 44. Here, when the widths of two lines that form the substantially cruciform planar shape on boundary section (R1) are not constant as in the example of FIG. 44, setting the minimum widths (widths (D21, D22) in FIG. 44) to be approximately 0.05 mm or greater and approximately 2.00 mm or less is suitable for miniaturization of wiring boards while securing the strength or the like of wiring boards. In addition, to miniaturize wiring boards while securing the region or the like to form through-hole conductors, it is suitable for the minimum widths (widths (D21, D22) in FIG. 44) to be set approximately 0.2 mm or greater and approximately 2.0 mm or less.

Figure 45:
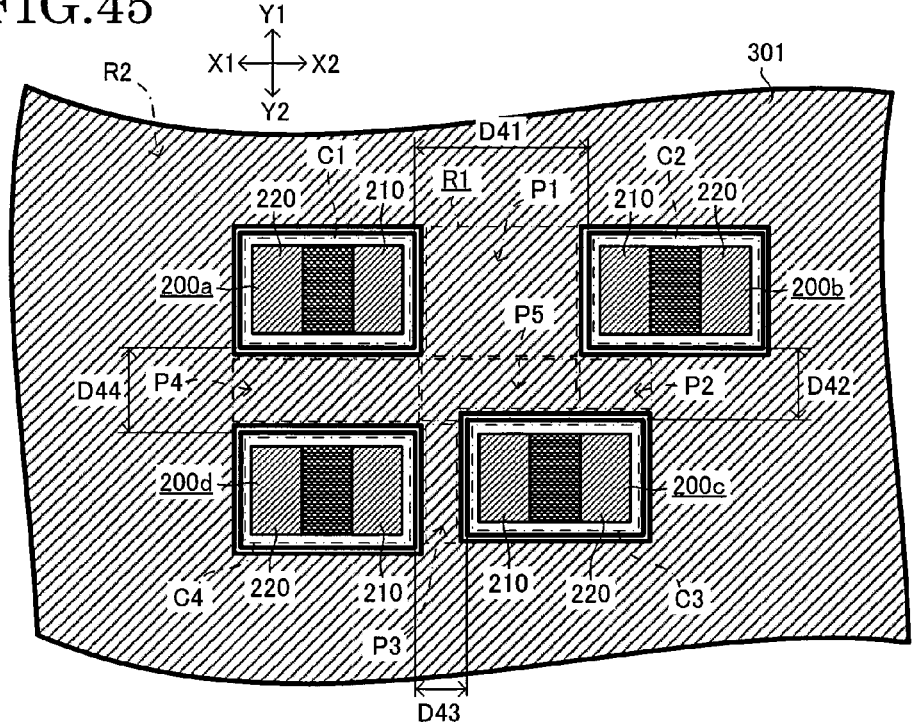
FIG. 45, in yet another embodiment of the present invention, is a view showing an example in which the boundary section (in particular, four portions extending in four directions from the intersection) has widths that are different from each other.

As shown in FIG. 45, width (D41) of first boundary portion (P1), width (D42) of second boundary portion (P2), width (D43) of third boundary portion (P3) and width (D44) of fourth boundary portion (P4) may be different from each other. The conductive pattern shown in FIG. 45 is included in a substantially cruciform conductive pattern, since it is formed with intersection (P5) and first boundary portion (P1), second boundary portion (P2), third boundary portion (P3) and fourth boundary portion (P4) extending in four directions (directions X1, X2, Y1, Y2) from intersection (P5).

The number and positioning of cavities are not limited to four or being rectangular, and any other options may be employed.

Figure 46A:
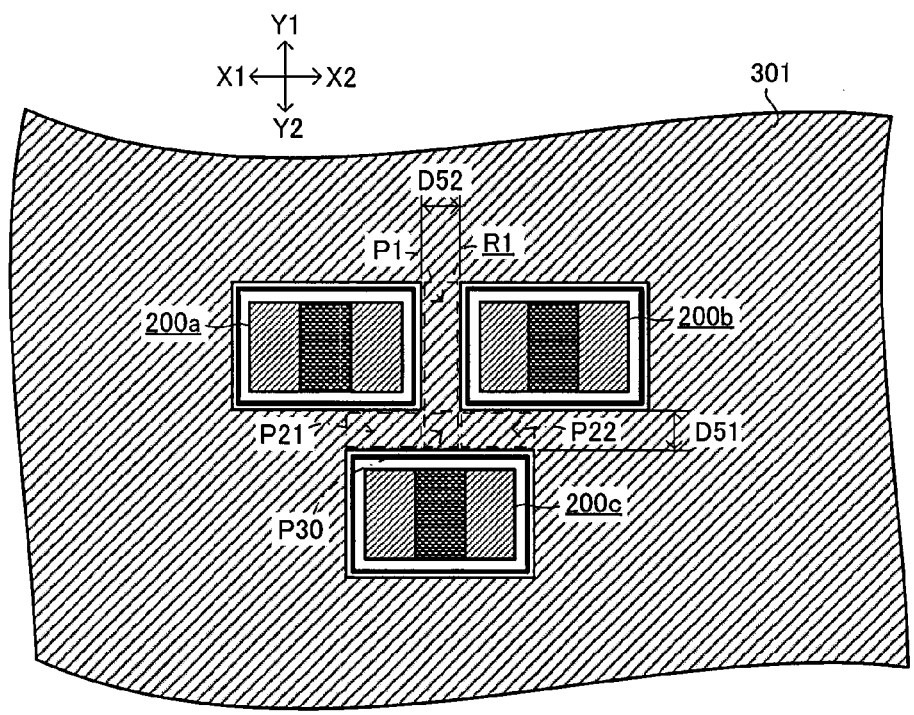
Figure 46B:
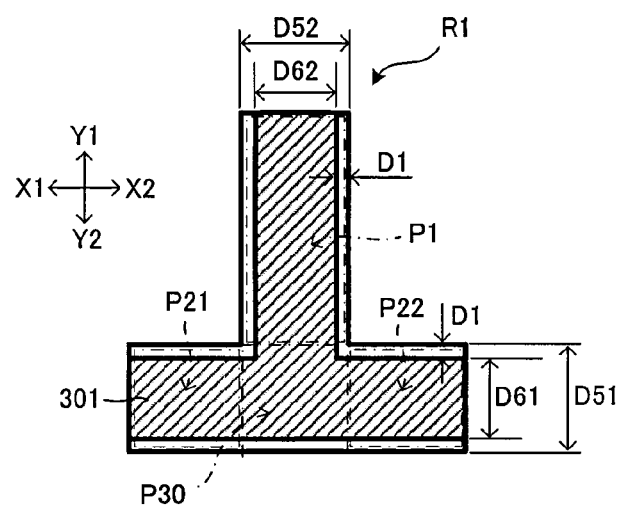
FIG. 46B is a magnified view showing the boundary section of the core section shown in FIG. 46A.

As shown in FIGS. 46A and 46B, for example, cavity (C1) (and electronic component (200a) accommodated in it), cavity (C2) (and electronic component (200b) accommodated in it) and cavity (C3) (and electronic component (200c) accommodated in it) may be positioned in a triangular shape. In the example shown in FIGS. 46A and 46B, cavity (C3) (third opening portion) faces both cavity (C1) (first opening portion) and cavity (C2) (second opening portion) with second boundary portions (P21, P22) placed in between. Also, boundary section (R1) is formed with first boundary portion (P1), second boundary portions (P21, P22) and intersection (P30). First boundary portion (P1), second boundary portions (P21, P22) and intersection (P30) are formed to be integrated with each other and are in a substantially T-shaped planar shape. The substantially T-shaped planar shape of boundary section (R1) is formed with a line having width (D51) in direction X (hereinafter referred to as line X) and a line having width (D52) in direction Y (hereinafter referred to as line Y), which intersect at substantially right angles. Second boundary portions (P21, P22) each form line X, and first boundary portion (P1) forms line Y. Line X and line Y intersect at intersection (P30).

The wiring board shown in FIGS. 46A and 46B includes a substantially T-shaped conductive pattern on boundary section (R1). A planar conductive pattern, for example, is formed on peripheral section (R2) of cavity (C1), cavity (C2) and cavity (C3). The substantially T-shaped conductive pattern on boundary section (R1) is formed to be integrated with the planar conductive pattern formed on peripheral section (R2), for example. The substantially T-shaped conductive pattern on boundary section (R1) and the planar conductive pattern on peripheral section (R2) formed to be integrated with that conductive pattern are included in conductive layer 301 or 302, for example (FIGS. 46A and 46B show only conductive layer 301).

In the wiring board shown in FIGS. 46A and 46B, the substantially T-shaped planar shape of first boundary portion (P1), second boundary portions (P21, P22) and intersection (P30) is preferred to be formed with two lines having widths approximately 0.05 mm or greater and approximately 2.00 mm or less, which intersect at substantially right angles. Setting the widths of boundary section (R1) in such a range is suitable for miniaturization of wiring boards, while enhancing the strength of boundary section (R1) and securing insulation between adjacent electronic components. Width (D51) of line X and width (D52) of line Y are each set at approximately 320 μm, for example. Width (D61) of the conductive pattern on second boundary portions (P21, P22) and width (D62) of the conductive pattern on first boundary portion (P1) are each set at approximately 200 for example.

A conductive pattern is formed in peripheral section (R2) of cavity (C1), cavity (C2) and cavity (C3) on substrate 100 in the wiring board shown in FIGS. 46A and 46B. The conductive pattern formed in peripheral section (R2) and the substantially T-shaped conductive pattern formed to be integrated with that conductive pattern are electrically connected to power source or ground.

Figure 47A:
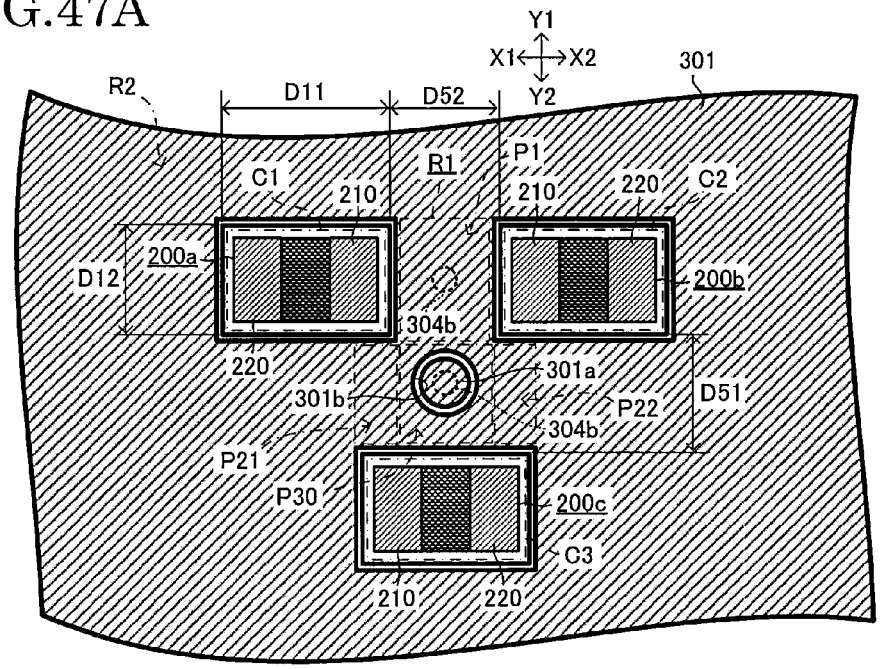
FIG. 47A, in yet another embodiment of the present invention, is a plan view seen from the first-surface side of the core section of a wiring board where substantially T-shaped through-hole conductors are formed in a boundary section.
Figure 47B:
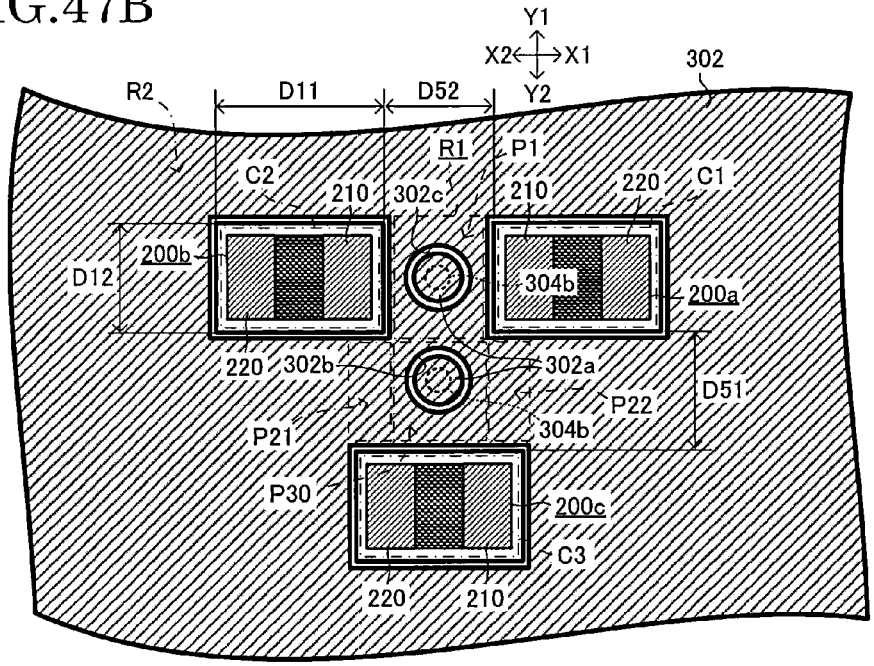
FIG. 47B, in yet another embodiment of the present invention, is a plan view seen from the second-surface side of the core section of a wiring board where substantially T-shaped through-hole conductors are formed in the boundary section.

In a wiring board having substantially T-shaped boundary section (R1), a through-hole conductor penetrating through substrate 100 may be formed at least in one of first boundary portion (P1), second boundary portions (P21, P22) and intersection (P30) of boundary section (R1). For example, through-hole conductors (304b) penetrating through substrate 100 are formed between cavity (C1) and cavity (C2) (first boundary portion (P1)) and in intersection (P5) as shown in FIGS. 47A and 47B. Forming through-hole conductor (304b) in intersection (P30) means that it is formed in each of two lines that make substantially T-shaped boundary section (R1).

Opening portion (301b) is formed in the conductive pattern (conductive layer 301) on first surface (F1) of intersection (P30) as shown in FIG. 47A, and opening portion (302b) is formed in the conductive pattern (conductive layer 302) on second surface (F2) of intersection (P30) as shown in FIG. 47B. Through-hole conductor (304b) penetrating through substrate 100 is formed in a position corresponding to opening portions (301b, 302b) of substrate 100. Lands (301a, 302a) connected to both ends of through-hole conductor (304b) are positioned respectively in opening portions (301b, 302b), and are insulated from the substantially T-shaped conductive patterns on surrounding boundary section (R1) (on first surface (F1) and second surface (F2)).

Also, opening portion (302c) is formed in the conductive pattern (conductive layer 302) on second surface (F2) of first boundary portion (P1) as shown in FIG. 47B. Through-hole conductor (304b) in first boundary portion (P1) is formed in a position corresponding to opening portion (302c) of substrate 100. Land (302a) connected to an end (the second-surface (F2) side) of through-hole conductor (304b) is positioned in opening portion (302c), and is insulated from the substantially T-shaped conductive pattern on second surface (F2) of surrounding boundary section (R1). In addition, the other end (the first-surface (F1) side) of through-hole conductor (304b) is connected to the substantially T-shaped conductive pattern on first surface (F1) of boundary section (R1).

In a wiring board having through-hole conductor (304b) in boundary section (R1) as shown in FIGS. 47A and 47B, the substantially T-shaped planar shape of boundary section (R1) is preferred to be formed with two lines which have a width approximately 0.2 mm or greater and approximately 2.0 mm or less and intersect at substantially right angles. Namely, width (D51) of line X and width (D52) of line Y are each preferred to be in the range of approximately 0.2 to approximately 2.0 mm or less. Setting the widths of boundary section (R1) in such a range is suitable for miniaturization of wiring boards, while enhancing the strength of boundary section (R1) and securing the space for insulating adjacent electronic components and for forming through-hole conductors.

The wiring board shown in FIGS. 47A and 47B has the cross-sectional structure shown in FIG. 38, for example. Namely, in the wiring board shown in FIGS. 47A and 47B, via conductor (314b) (first via conductor) electrically connected to the substantially T-shaped conductive pattern is formed in insulation layer 101. Via conductor (314b) is stacked on through-hole conductor (304b), for example. Electrodes 210 of electronic components (200a, 200b) are each electrically connected to through-hole conductor (304b) formed in boundary section (R1) by way of via conductor (314b), via conductors (311b, 311b) and conductive layer 110, for example.

The substantially T-shaped conductive patterns formed on first surface (F1) and second surface (F2) of boundary section (R1), the planar conductive patterns on peripheral section (R2) formed to be integrated with their respective substantially T-shaped conductive patterns, and through-hole conductor (304b) formed in first boundary portion (P1) are electrically connected to each ground terminal (electrode 220) of electronic components (200a~200c), for example. Through-hole conductor (304b) in opening portions (301b, 302b) formed in intersection (P30) is electrically connected to each power-source terminal (electrode 210) of electronic components (200a~200c), for example. Here, the polarities of electrodes 210 and electrodes 220 may be reversed.

Also, a through-hole conductor (dummy conductor) that is not electrically connected to any terminal of electronic components (200a~200c) (first through third electronic devices) may be formed in substantially T-shaped boundary section (R1). Dummy conductors are effective to enhance heat dissipation. The number of dummy conductors is not limited specifically, and it may be more than one.

Figure 48:
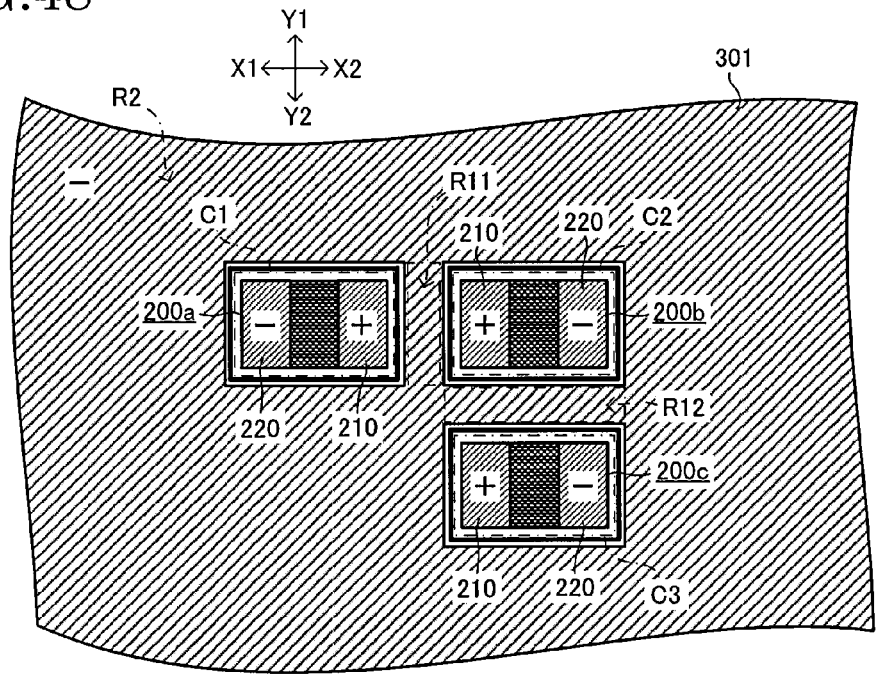
FIG. 48, in yet another embodiment of the present invention, is a view showing a first example in which opening portions for placing electronic devices are positioned in an L shape.
Figure 49:
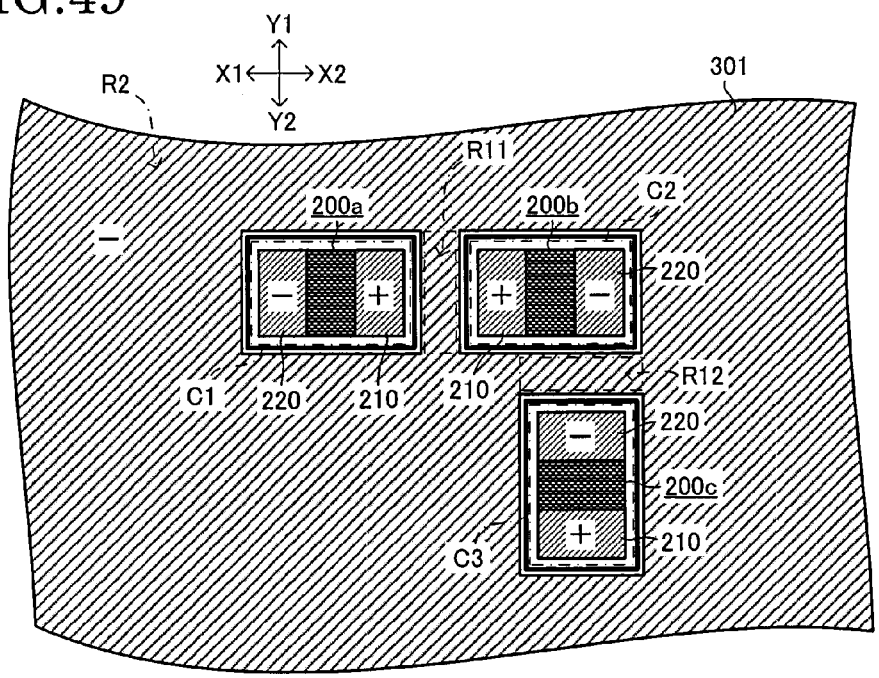
FIG. 49, in yet another embodiment of the present invention, is a view showing a second example in which opening portions for placing electronic devices are positioned in an L shape.

As shown in FIG. 48 or 49, cavity (C1) (and electronic component (200a) accommodated in it), cavity (C2) (and electronic component (200b) accommodated in it) and cavity (C3) (and electronic component (200c) accommodated in it) may be positioned in an L shape. Also, as shown in FIG. 48 or 49, multiple boundary portions (boundary portions (R11, R12)) may be formed to be separated from each other. In the example shown in FIG. 48 or 49, boundary section (R11) is positioned between cavity (C1) and cavity (C2), and boundary section (R12) is positioned between cavity (C2) and cavity (C3).

In the example shown in FIG. 48, fourth side portion (210e) of electrode 210 of electronic component (200b) faces third side portion (210d) of electrode 210 of electronic component (200c), and sixth side portion (220e) of electrode 220 of electronic component (200b) faces fifth side portion (220d) of electrode 220 of electronic component (200c) (see FIG. 5B). Also, in the example shown in FIG. 49, sixth side portion (220e) of electrode 220 of electronic component (200b) faces second side portion (220b) of electrode 220 of electronic component (200c) (see FIG. 5B).

As shown in FIG. 50, cavity (C1) (and electronic component (200a) accommodated in it), cavity (C2) (and electronic component (200b) accommodated in it) and cavity (C3) (and electronic component (200c) accommodated in it) may be positioned linearly.

Figure 52:
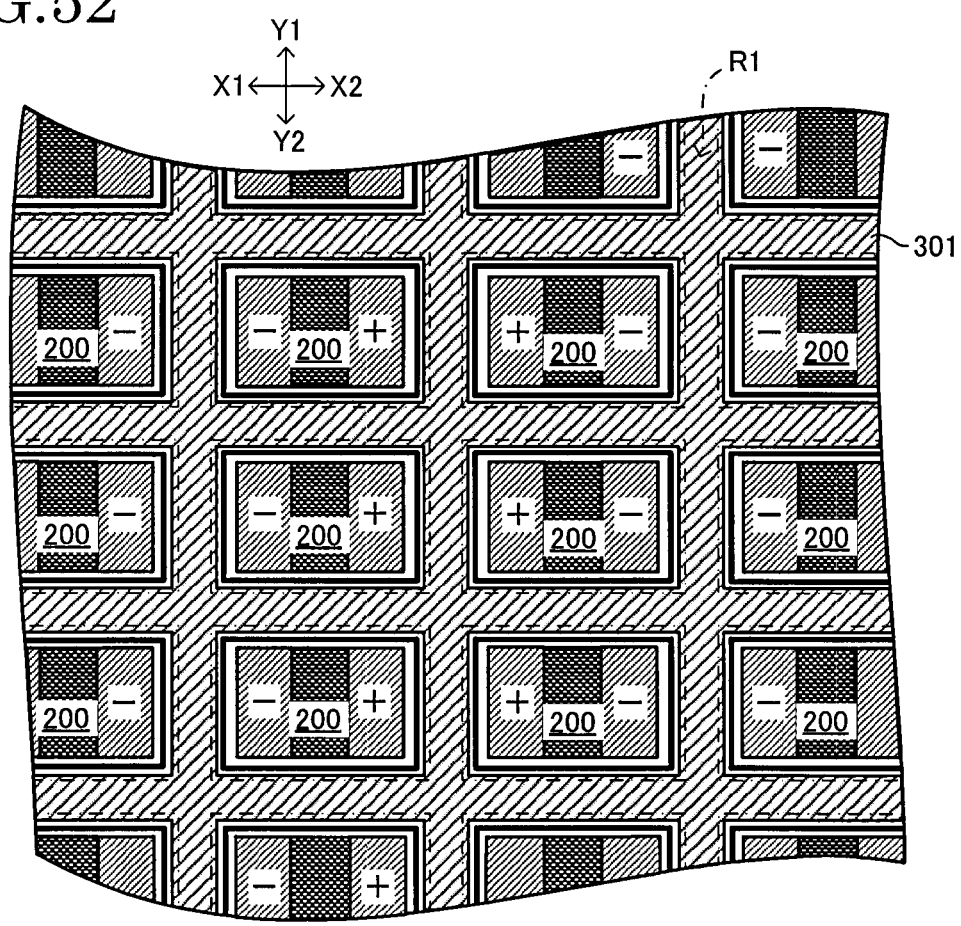
FIG. 52, in yet another embodiment of the present invention, is a view showing an example in which multiple opening portions for placing electronic devices are formed.

As shown in FIG. 51, only cavity (C1) (and electronic component (200a) accommodated in it) and cavity (C2) (and electronic component (200b) accommodated in it) may be positioned adjacent to each other. Alternatively, as shown in FIG. 52, multiple electronic components 200 may be positioned in both longitudinal and lateral directions (directions X and Y). In the example shown in FIG. 52, electronic components 200 (and their cavities) are positioned in the shape of a grid, and boundary sections (R1) between electronic components 200 are formed in the shape of a grid.

As shown in FIG. 48 through FIG. 52, opposing electrodes (or electrodes close to each other) are preferred to have the same polarity. In setting so, it is easier to shorten the wiring between electronic components when electronic components are connected parallel.

Figure 53:
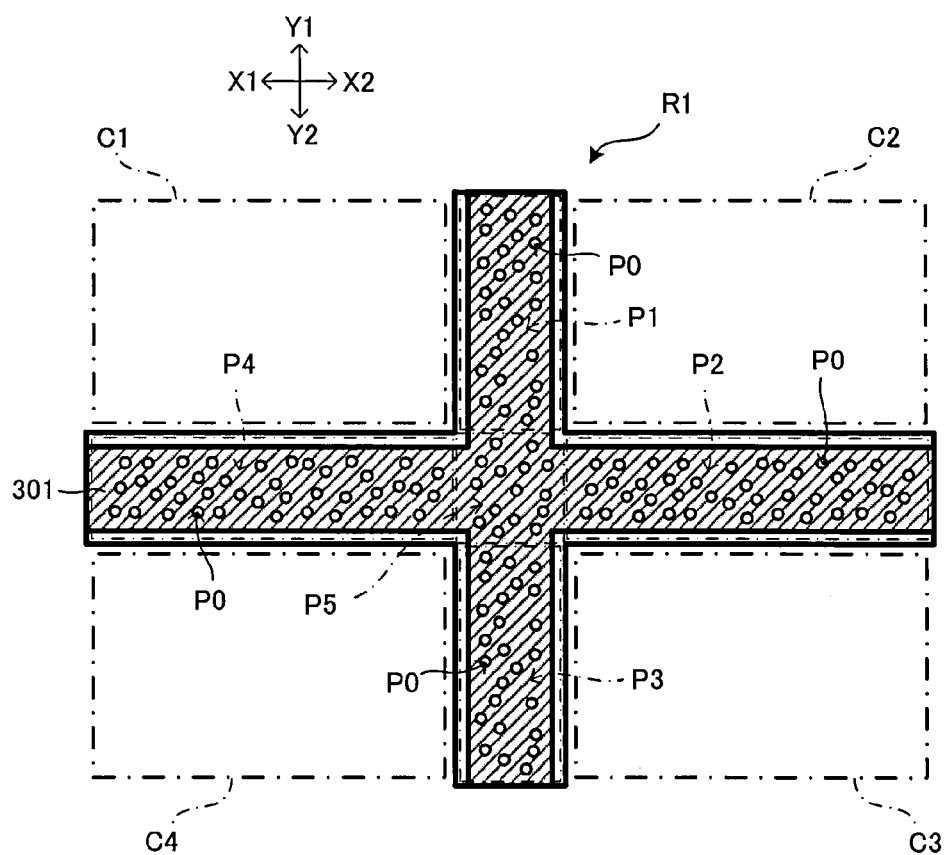
FIG. 53, in yet another embodiment of the present invention, is a view showing a wiring board in which degas holes are formed in a conductive pattern on the boundary section.

As shown in FIG. 53, degas holes (P0) may be formed in the conductive pattern on boundary section (R1). In particular, a required number of fine holes (numerous, for example) that penetrate through a conductive pattern on boundary section (R1) are preferred to be formed in the conductive pattern on boundary section (R1). By forming such degas holes (P0), substrate 100 (especially, boundary section (R1)) and a conductive pattern on the substrate are suppressed from delamination by degassing through degas holes (P0).

The planar shape (on the X-Y plane, for example) of electronic components (200a~200d) (electronic devices), the opening shape of cavities (C1~C4) (on the X-Y plane, for example), and the opening shape of through holes or via holes (on the X-Y plane, for example) are not limited specifically. For example, such shapes may each be substantially a circle (substantially a perfect circle), or may be substantially a polygon such as substantially a square, substantially a hexagon or substantially an octagon instead of substantially a rectangle. Also, the shapes of corners of polygons are not limited specifically. For example, they may be substantially right angles, acute angles, obtuse angles, or even roundish.

Figure 54A:
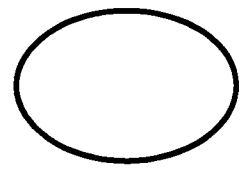
FIG. 54A, in yet another embodiment of the present invention, is a view showing an ellipse as the planar shape of an electronic device, the opening shape of a cavity (opening portion), and the opening shape of a through hole or a via hole.

Alternatively, the above shapes may each be an oval (such as substantially an ellipse) as shown in FIG. 54A, or they may be a rectangle, triangle or the like, for example.

Figure 54B:
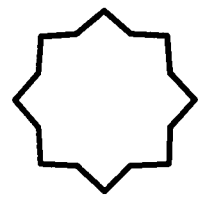
FIG. 54B, in yet another embodiment of the present invention, is a view showing a regular polygonal star as the planar shape of an electronic device, the opening shape of a cavity (opening portion), and the opening shape of a through hole or a via hole.

Yet alternatively, the above shapes may each be a shape that radiates out from the center, such as a regular polygonal star as shown in FIG. 54B, for example.

Figure 55:
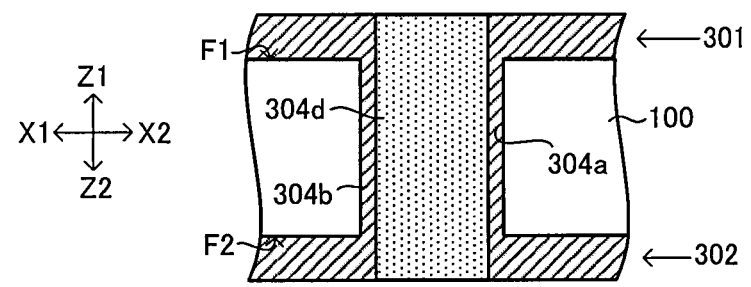
FIG. 55, in yet another embodiment of the present invention, is a view showing a through-hole conductor formed to be a conformal through-hole conductor.

Through-hole conductor (304b) is not limited to being a filled conductor, and it may be a conformal conductor as shown in FIG. 55, for example. In the example shown in FIG. 55, through hole (304a) is shaped substantially in a column, and through-hole conductor (304b) is formed by forming copper-plated film on the wall surface of through hole (304a). Insulator (304d) made of resin or the like, for example, is filled inside through-hole conductor (304b) in through hole (304a).

Figure 56A:
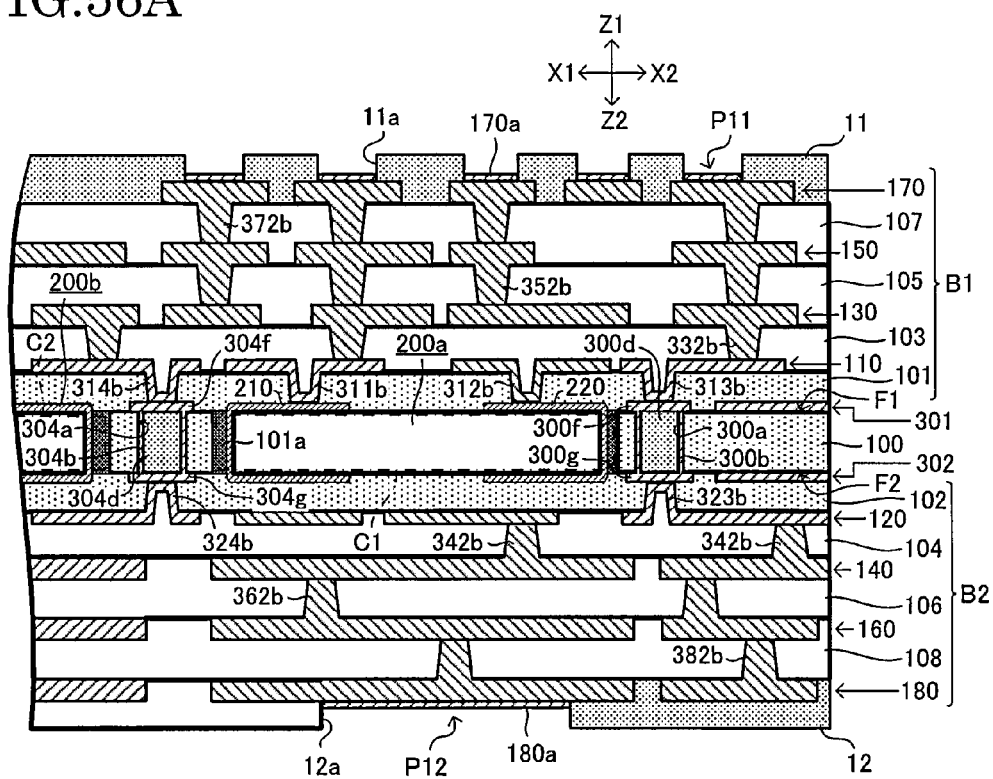
FIG. 56A, in yet another embodiment of the present invention, is a view showing a wiring board having a through-hole conductor, both of whose end openings are covered with a planar conductive pattern.

As shown in FIG. 56A, openings on both ends of through holes (300a, 304a) may be covered by planar conductive patterns (lands (300f, 300g, 304f, 304g), for example). In the following, the wiring board shown in FIG. 56A is described by focusing on differences from each of the above embodiments.

In the example shown in FIG. 56A, four insulation layers (101, 103, 105, 107) (each an interlayer insulation layer) and four conductive layers (110, 130, 150, 170) are alternately laminated to form first buildup section (B1) on the first-surface (F1) side of substrate 100. Also, four insulation layers (102, 104, 106, 108) (each an interlayer insulation layer) and four conductive layers (120, 140, 160, 180) are alternately laminated to form second buildup section (B2) on the second-surface (F2) side of substrate 100. Conductive layer 301 on first surface (F1) of substrate 100 and its upper conductive layers (110, 130, 150, 170) are electrically connected to each other by via conductors (313b, 314b, 332b, 352b, 372b) formed in their respective interlayer insulation layers. Conductive layer 302 on second surface (F2) of substrate 100 and its upper conductive layers (120, 140, 160, 180) are electrically connected to each other by via conductors (323b, 324b, 342b, 362b, 382b) formed in their respective interlayer insulation layers.

Through-hole conductors (300b, 304b) penetrating through substrate 100 are formed in substrate 100. Through-hole conductors (300b, 304b) are each a conformal conductor, and are formed by forming conductive film (such as copper plating) on wall surfaces of substantially columnar through holes (300a, 304a), for example. Insulators (300d, 304d) are filled inside through-hole conductors (300b, 304b) in through holes (300a, 304a). Through holes (300a, 304a) are formed by a drill, for example. The shape of through holes (300a, 304a) is not limited to being substantially columnar, and it may be any other shape.

Figure 56B:
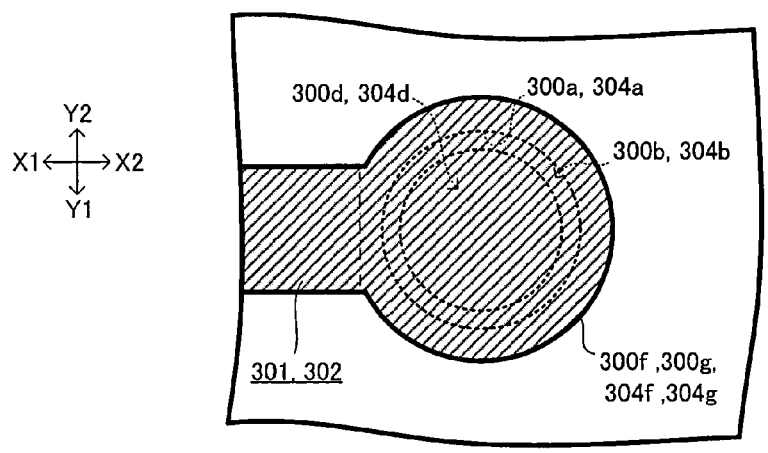
FIG. 56B is a plan view of the through-hole conductor shown in FIG. 56A.

In the example shown in FIG. 56A, the openings at both ends of through holes (300a, 304a) are each covered by a plated planar conductive pattern (cover plating) as shown in FIG. 56B, for example. In particular, the opening at either end of through hole (300a) is covered, for example, by land (300f) on the first-surface (F1) side of through-hole conductor (300b) or land (300g) on the second surface (F2) side (each a planar conductive pattern); and the opening at either end of through hole (304a) is covered, for example, by land (304f) on the first-surface (F1) side of through-hole conductor (304b) or land (304g) on the second surface (F2) side (each a planar conductive pattern).

Insulator (300d) is filled inside through-hole conductor (300b) in through hole (300a) (in particular, the space surrounded by through-hole conductor (300b) and lands (300f, 300g)). Insulator (304d) is filled inside through-hole conductor (304b) in through hole (304a) (in particular, the space surrounded by through-hole conductor (304b) and lands (304f, 304g)).

In the wiring board shown in FIG. 56A, via conductors formed in insulation layers (101, 102) (including via conductors (311b, 312b) connected to electrodes (210, 220) of electronic component (200a), and via conductors (313b, 323b, 314b, 324b) stacked on through-hole conductors (300b, 304b)) are each a conformal conductor made of copper plating, for example. Via conductors (332b, 342b, 352b, 362b, 372b, 382b) formed in the upper layers are each a filled conductor made of copper plating, for example.

In the wiring board shown in FIG. 56A, conductive layer 170 is the outermost conductive layer on the first-surface (F1) side, and conductive layer 180 is the outermost conductive layer on the second-surface (F2) side. Solder resists (11, 12) are respectively formed on conductive layers (170, 180). Opening portions (11a, 12a) are formed respectively in solder resists (11, 12). Therefore, a predetermined portion of conductive layer 170 (a portion positioned at opening portion (11a)) is not covered by solder resist 11 and is exposed to become pad (P11). Also, a predetermined portion of conductive layer 180 (a portion positioned at opening portion (12a)) becomes pad (P12). Pads (P11, P12) respectively have anticorrosion layers (170a, 180a) made of Ni/Au film, for example, on their surfaces. Anticorrosion layers (170a, 180a) are formed by electrolytic plating or sputtering, for example. Alternatively, an OSP (organic solderability preservative) treatment is performed to form anticorrosion layers (170a, 180a) made of organic protective film.

As a preferred example of the wiring board shown in FIG. 56A, substrate 100 is made of glass epoxy, insulation layers (101, 102) are each made of copper film with attached resin (prepreg), insulation layers (103, 104, 105, 106, 107, 108) are each made of ABF (Ajinomoto Buildup Film, made by Ajinomoto Fine Techno Co., Ltd.). ABF is a film made by sandwiching an insulative material with two protective sheets. The thermal expansion coefficient (CTE) of substrate 100 is preferred to be smaller than the thermal expansion coefficient (CTE) of built-in electronic devices (electronic components (200a) and the like).

As a preferred example of the wiring board shown in FIG. 56A, conductive layers (110, 120) are each made of copper foil (lower layer) and copper plating (upper layer), for example, which are formed by a subtractive method, for example. Also, conductive layers (130, 140, 150, 160, 170, 180) are each made of copper plating, for example, which is formed by a semi-additive (SAP) method, for example.

As a preferred example of the wiring board shown in FIG. 56A, the thickness of substrate 100 is 600 µm, the thickness (including electrodes (210, 220)) of built-in electronic components (electronic components (200a) and the like) is 550 µm, the thickness of conductive layers (301, 302) is 35 µm each, and the thickness of conductive layers (110, 120, 130, 140, 150, 160, 170, 180) is 60 µm each.

Figure 57A:
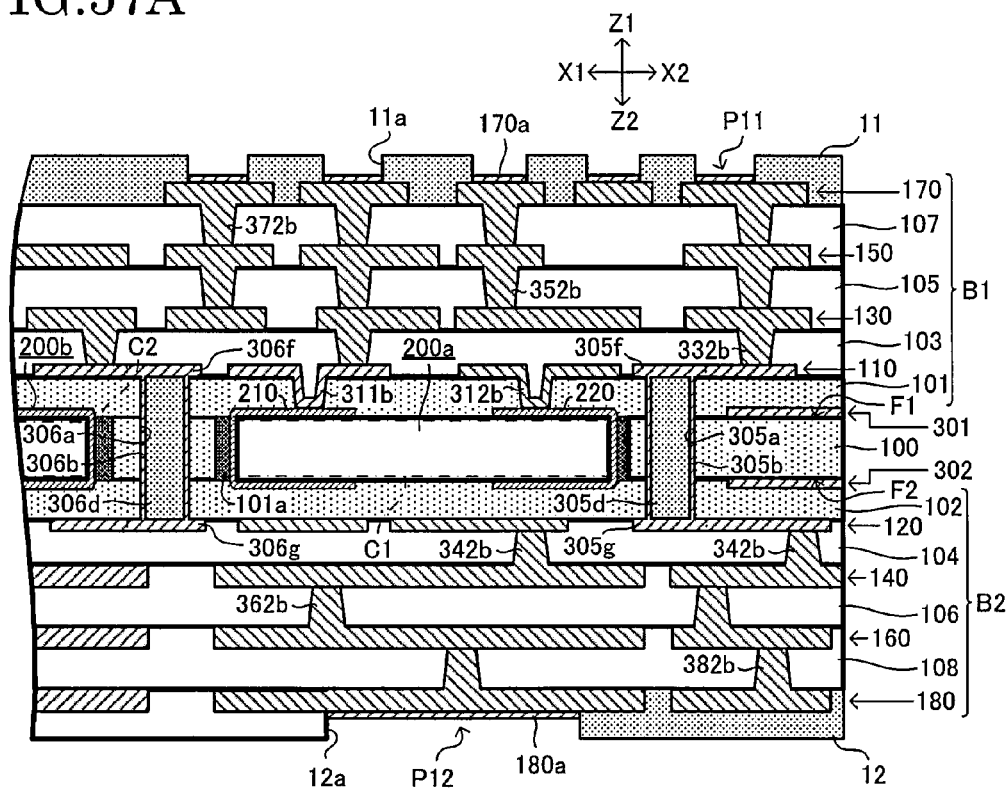
FIG. 57A, in yet another embodiment of the present invention, is a view showing a wiring board having a through-hole conductor that penetrates through the substrate and insulation layers on both of its surfaces.

As shown in FIG. 57A, it is an option to form through-hole conductors (305b, 306b) which electrically connect conductive layer 110 on insulation layer 101 and conductive layer 120 on insulation layer 102. In the following, the wiring board shown in FIG. 57A is described focusing on differences from the wiring board shown in FIG. 56A.

In the wiring board shown in FIG. 57A, through-hole conductors (305b, 306b) are formed to penetrate through substrate 100, insulation layer 101 and insulation layer 102. Through-hole conductors (305b, 306b) are each a conformal conductor, and are formed by forming conductive film (such as copper plating) on wall surfaces of substantially columnar through holes (305a, 306a), for example. Insulators (305d, 306d) are filled inside through-hole conductors (305b, 306b) in through holes (305a, 306a). Through holes (305a, 306a) are formed by a drill, for example. The shape of through holes (305a, 306a) is not limited to being substantially columnar, and it may be any other shape.

Figure 57B:
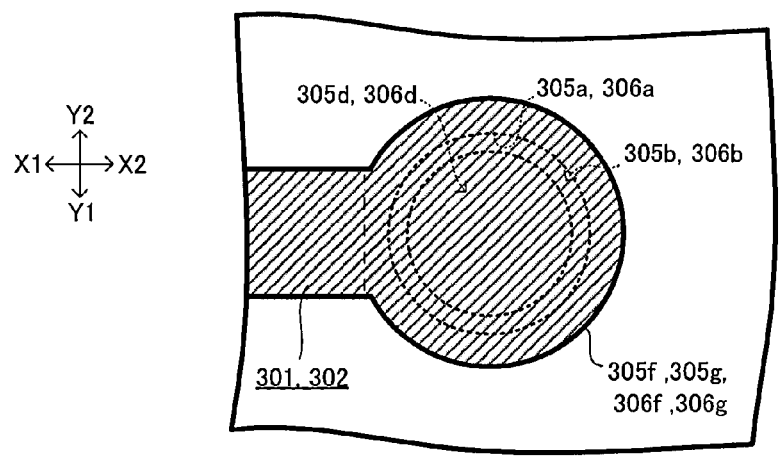
FIG. 57B is a plan view of the through-hole conductor shown in FIG. 57A.

In the example shown in FIG. 57A, the openings at both ends of through holes (305a, 306a) are each covered by a plated planar conductive pattern (cover plating) as shown in FIG. 57B, for example. In particular, the openings at both ends of through hole (305a) are respectively covered by land (305f) on the first-surface (F1) side of through-hole conductor (305b) and land (305g) on the second surface (F2) side (each a planar conductive pattern), for example; and the openings at both ends of through hole (306a) are respectively covered by land (306f) on the first-surface (F1) side of through-hole conductor (306b) and land (306g) on the second surface (F2) side (each a planar conductive pattern), for example.

Figure 58:
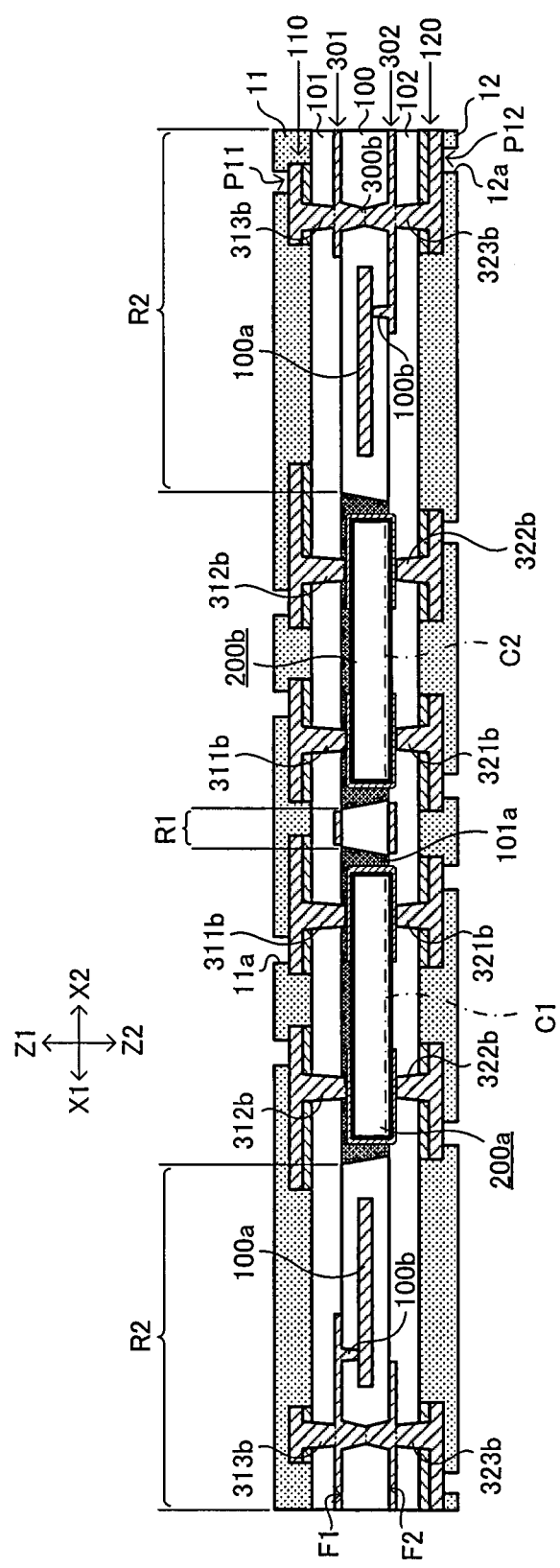
FIG. 58, in yet another embodiment of the present invention, is a view showing a wiring board having a core section with a built-in metal sheet.

As shown in FIG. 58, substrate 100 (core substrate) may be an insulative substrate with built-in metal sheet (100a) (such as copper foil). Heat dissipation improves by metal sheet (100a) in such substrate 100. In the example shown in FIG. 58, via conductors (100b) reaching metal sheet (100a) are formed in substrate 100, and metal sheet (100a) and ground lines (conductive patterns included in conductive layers (301, 302)) are electrically connected to each other by via conductors (100b). The planar shape of metal sheet (100a) (on the X-Y plane) is not limited specifically, and it may be a rectangle or a circle.

In the following, a method for manufacturing substrate 100 (core substrate) shown in FIG. 58 is described by referring to FIGS. 59A and 59B.

Figure 59A:
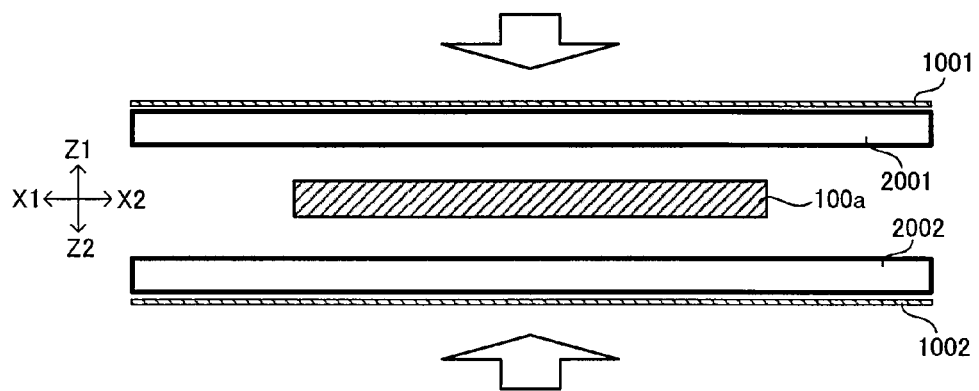
FIG. 59A is a view illustrating a first step for manufacturing a core substrate to be used in the wiring board shown in FIG. 58.
Figure 59B:
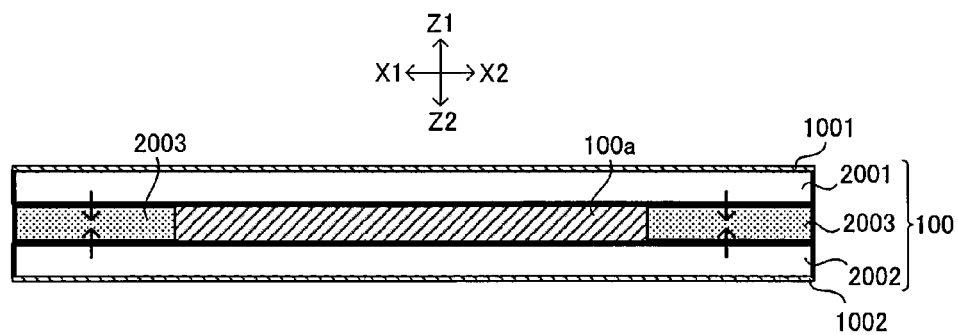
FIG. 59B is a view illustrating a second step subsequent to the step in FIG. 59A.

First, as shown in FIG. 59A, insulation layers (2001, 2002) are positioned to sandwich metal sheet (100a) made of copper foil, for example. Furthermore, metal foil 1001 (such as copper foil) is positioned on insulation layer 2001 and metal foil 1002 (such as copper foil) is positioned on insulation layer 2002. Insulation layers (2001, 2002) are each made of glass-epoxy prepreg, for example.

Pressure is added toward metal sheet (100a) by pressing. By pressing semi-cured insulation layers (2001, 2002), resin flows out from insulation layers (2001, 2002) as shown in FIG. 59B. Accordingly, insulation layer 2003 is formed in side directions of metal sheet (100a). Then, insulation layers (2001, 2002, 2003) are each thermally cured. Accordingly, substrate 100 (core substrate) with built-in metal sheet (100a) is completed.

Figure 60:
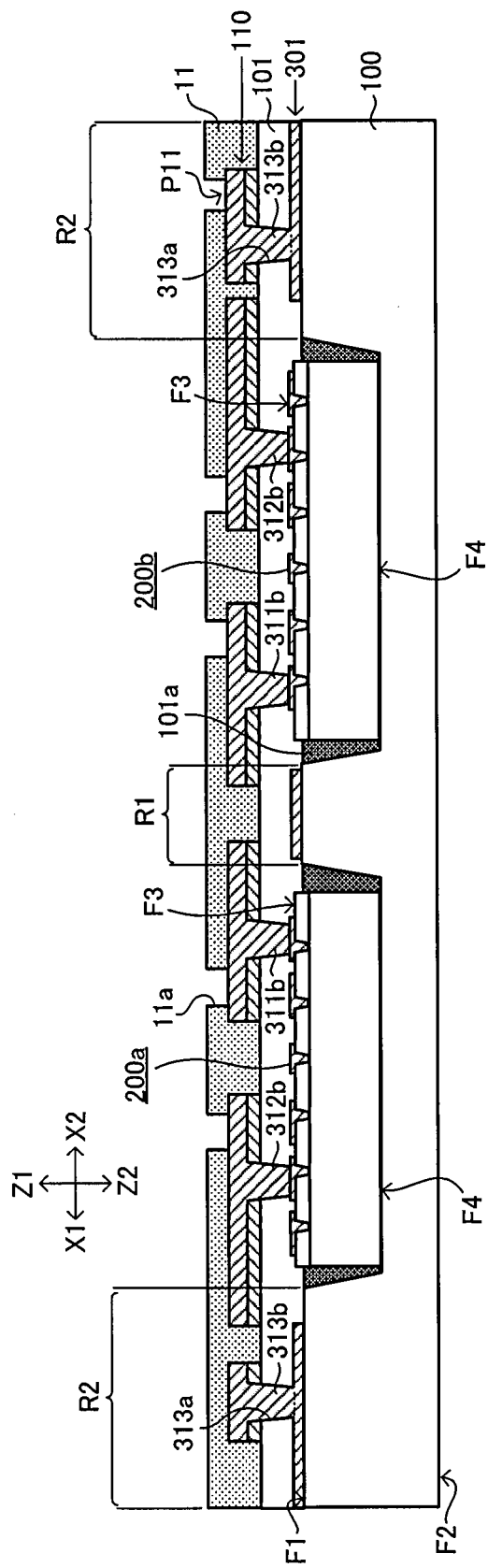
FIG. 60, in yet another embodiment of the present invention, is a view showing a single-sided wiring board.

Electronic devices to be built into a wiring board are not limited to capacitors, and may be any other electronic components. Although each of the above embodiments shows a double-sided wiring board having conductive layers on both sides of a core substrate, that is not the only option. For example, as shown in FIG. 60, it may be a single-sided wiring board having conductive layers only on one side of the core substrate (substrate 100). In the example shown in FIG. 60, electronic components (200a~200d) (only electronic components (200a, 200b) are shown in the drawing) are each an IC chip.

As shown in FIG. 60, for example, cavities (C1~C4) (accommodation spaces for electronic components (200a~200d)) may be holes (recessed portions) that do not penetrate through substrate 100. In the example shown in FIG. 60, boundary section (R1) and peripheral section (R2) formed to be integrated with the boundary section are connected at the lower portion of substrate 100. Accordingly, their connection strength is improved.

Each of the above embodiments shows an example in which the thickness of substrate 100 is substantially the same as the thickness of electronic components (200a~200d). However, that is not the only option. For example, as shown in FIG. 60, the thickness of substrate 100 may be greater than the thickness of electronic components (200a~200d).

The wiring board may have two or more buildup layers on one side of the core substrate. Alternatively, the number of buildup layers may be different on the first-surface (F1) side of substrate 100 and the second-surface (F2) side of substrate 100. However, to mitigate stress, it is preferred to enhance the symmetry of the upper and lower sides by making the number of buildup layers the same on the first-surface (F1) side of substrate 100 and the second-surface (F2) side of substrate 100.

Figure 61A:
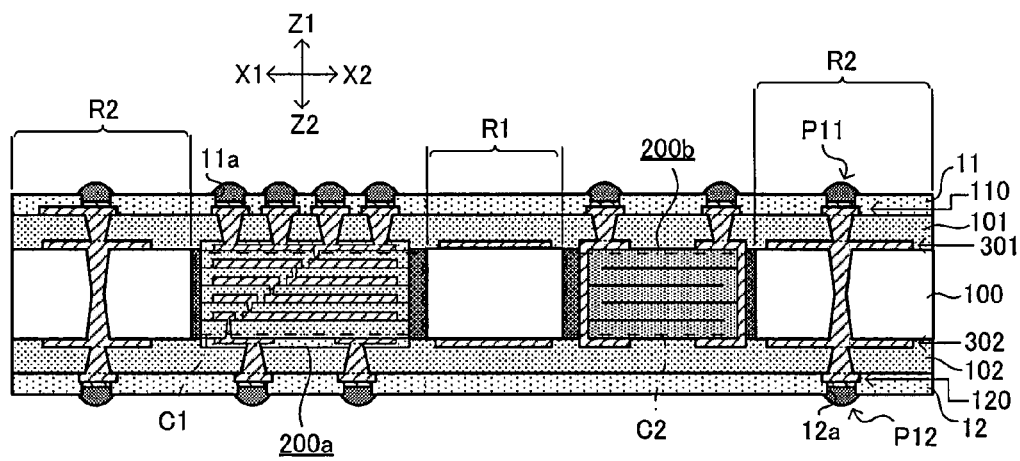
FIG. 61A, in yet another embodiment of the present invention, is a view showing a wiring board with a built-in inductor and capacitor.

As shown in FIG. 61A, among electronic components (200a~200d) built into a wiring board (FIG. 61A shows only electronic components (200a, 200b)), electronic component (200a) may be an inductor.

Figure 61B:
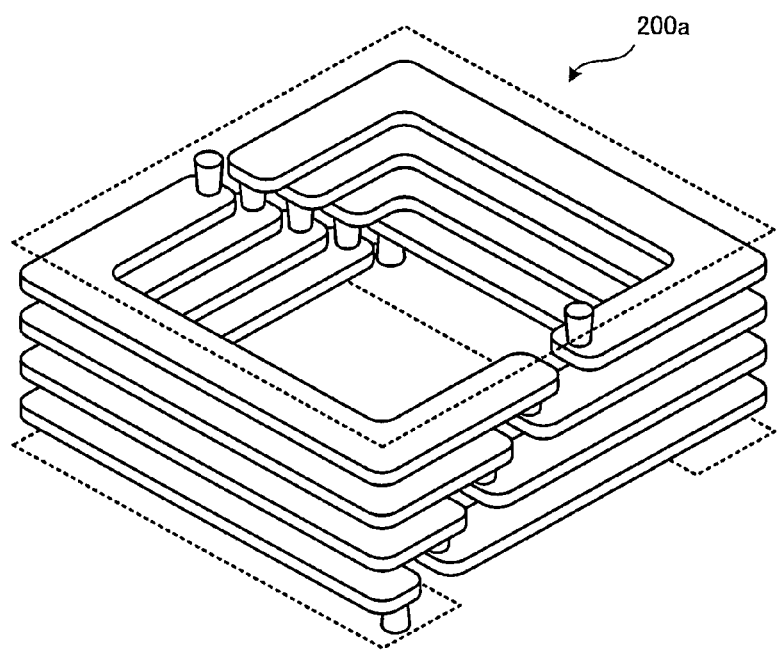
FIG. 61B is a view showing the structure of the inductor built into the wiring board shown in FIG. 61A.

Electronic component (200a) is made of two one-turn inductors as shown in FIG. 61B, for example. In each inductor, four-layer conductive patterns are formed in a spiral shape and are substantially annular when they are seen on a plane (in particular, substantially rectangular). Those inductors are connected parallel to each other.

All the electronic devices built into a wiring board (electronic components (200a~200d), for example) may each be an inductor.

Figure 62:
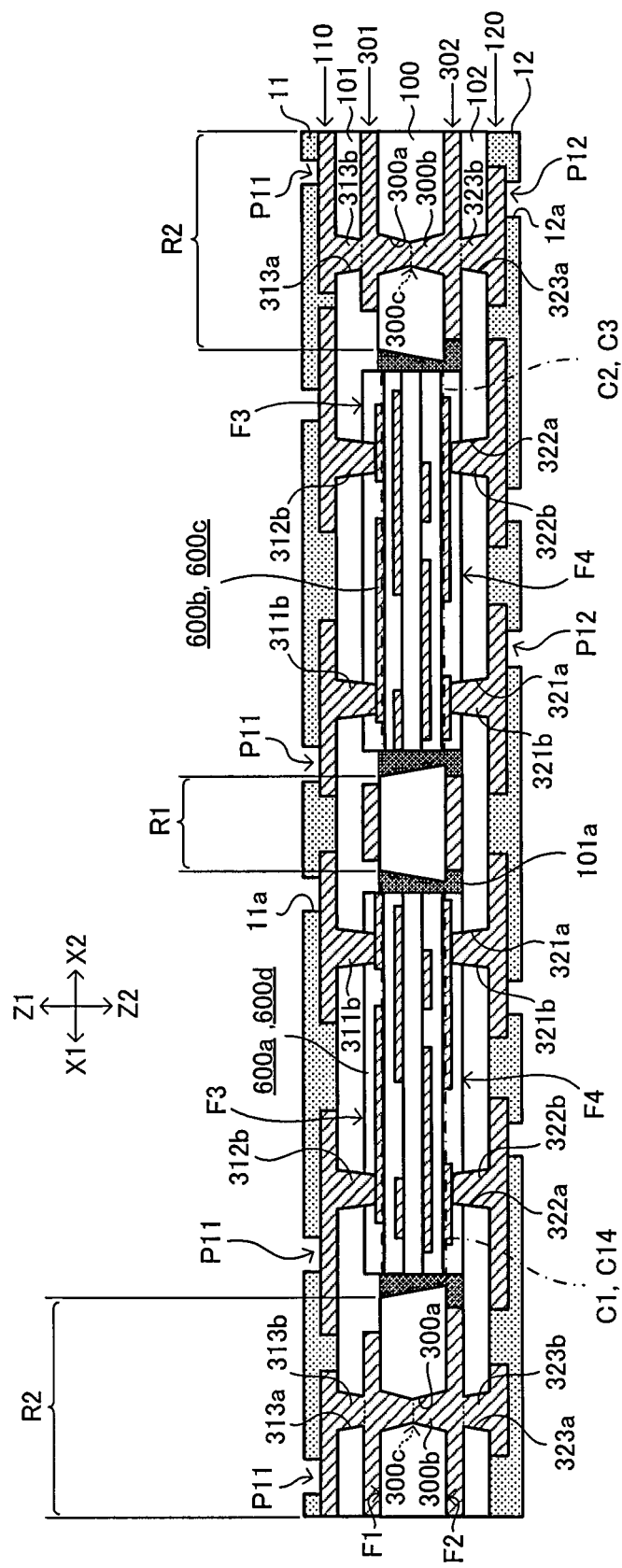
FIG. 62, in yet another embodiment of the present invention, is a view showing a wiring board with other built-in wiring boards instead of electronic components.

Electronic devices built into a wiring board are not limited to electronic components, and may be other wiring boards. For example, as shown in FIG. 62, other wiring boards (600a~600d) may be accommodated in cavities (C1~C4). In the example shown in FIG. 62, pads (external connection terminals) of other wiring boards (600a~600d) are electrically connected to conductive layers (110, 120) by via conductors (311b, 312b, 321b, 322b). Wiring boards (600a~600d) have high-density conductors, for example, by forming fine conductive patterns in each conductive layer or by reducing the thickness of interlayer insulation layers between conductive layers. By building in other wiring boards (600a~600d) with high-density conductors, conductor density of the wiring board is partially heightened.

The structure of a wiring board according to each of the above embodiments (especially, the type, performance, dimensions, material, shape, number of layers, positioning or the like of the structural elements) may be modified freely within a scope that does not deviate from the gist of the present invention.

The cross-sectional shape of the electrodes of chip capacitors positioned in cavities (C1~C4) (opening portions) (see FIG. 4A) is not limited to being U-shaped. For example, it may be a pair of flat-sheet type electrodes sandwiching capacitor body 201.

The electronic devices positioned in cavities (C1~C4) (opening portions) are not limited to a specific type, and any other electronic component, wiring board or the like, for example, active components such as IC circuits, may also be selected in addition to passive components such as capacitors, resistors or coils.

Each via conductor is not limited to being a filled conductor, and it may be a conformal conductor, for example.

It is not always required to mount electronic devices to be positioned in cavities (C1~C4) (opening portions) through via connection (by via conductors), and any other method such as soldering may also be employed.

The method for manufacturing a wiring board is not limited to the order and contents shown in FIG. 9 above. The order and contents may be modified freely within a scope that does not deviate from the gist of the present invention. Also, some step may be omitted according to usage or the like.

Figure 63:
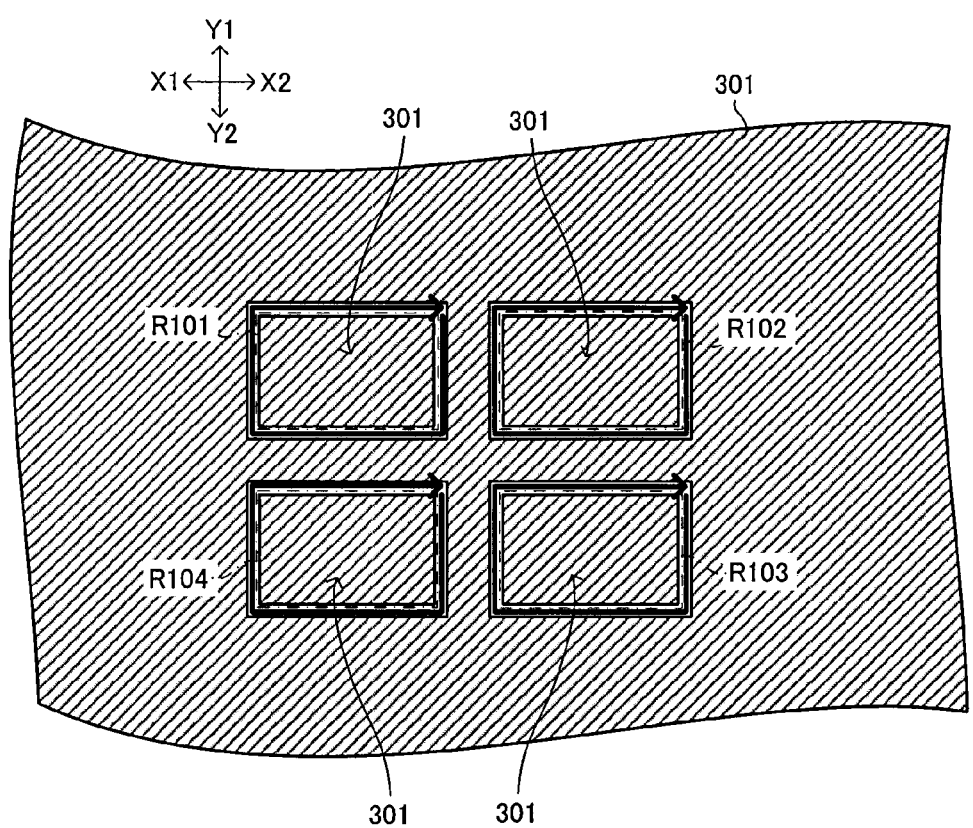
FIG. 63, in a method for manufacturing a wiring board according to yet another embodiment of the present invention, is a view showing an example in which the conductive layer on a substrate is removed along laser irradiation routes prior to irradiating laser light.

In each of the above embodiments, opening portions (R101~R104) having opening shapes similar to the opening shapes of cavities (C1~C4) are formed prior to laser irradiation (see FIG. 12A). However, that is not the only option. For example, as shown in FIG. 63, prior to laser irradiation, portions of conductive layer 301 on substrate 100 may be removed along the laser irradiation path. In doing so, positions and shapes of cavities (C1~C4) are also made clear, making it easier to align laser irradiation.

Forming each conductive layer is not limited to a specific method, for example. Any of the following or a combination of two or more of the following methods may be used in forming conductive layers: panel plating, pattern plating, full additive, semi-additive (SAP), subtractive, transfer and tenting methods, for example.

Alternatively, instead of a laser, wet or dry etching may be used for processing. When etching is used for processing, it is considered preferable that portions not required to be removed be protected in advance by resist or the like.

Each of the above embodiments and their modified examples or the like may be combined freely. It is considered preferable to select an appropriate combination according to usage or the like. For example, in the structure shown in any of FIGS. 48~52, through-hole conductor (304b) (see the second embodiment) may be formed in boundary section (R1).

A wiring board according to an embodiment of the present invention has the following: a substrate which has a first opening portion, a second opening portion, and a first boundary portion that separates the first opening portion and the second opening portion; a first electronic device positioned in the first opening portion; a second electronic device positioned in the second opening portion; an insulation layer formed on the substrate, on the first electronic device and on the second electronic device; and a conductive layer formed on the insulation layer. In such a wiring board, a conductive pattern is formed on the first boundary portion.

A method for manufacturing a wiring board according to another embodiment of the present invention includes the following: preparing a substrate; forming a first opening portion and a second opening portion in the substrate to be separated by a first boundary portion, and forming a conductive pattern on the first boundary portion of the substrate; positioning a first electronic device in the first opening portion and a second electronic device in the second opening portion; forming an insulation layer on the substrate, the conductive pattern, the first electronic device and the second electronic device; and forming a conductive layer on the insulation layer.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board, comprising:
a substrate having an opening structure extending through the substrate such that the opening structure comprises a plurality of opening portions and at least one boundary portion partitioning the opening portions arrayed and penetrating through the substrate;
a through-hole conductor formed in the opening structure such that the through-hole conductor is penetrating through the boundary portion of the opening structure in the substrate;
a plurality of electronic devices positioned in the opening structure such that the plurality of electronic devices is accommodated in the plurality of opening portions of the opening structure, respectively;
a conductive pattern formed on a surface of the boundary portion; and
an insulation layer formed on the substrate such that the insulation layer is covering the conductive pattern on the boundary portion and the plurality of electronic devices in the plurality of opening portions of the opening structure in the substrate,
wherein the conductive pattern on the boundary portion has an opening portion formed in the conductive pattern on the boundary portion, and the through-hole conductor is formed in a position corresponding to the opening portion formed in the conductive pattern on the boundary portion such that the through-hole conductor and the conductive pattern on the boundary portion are electrically insulated from each other.

2. The wiring board according to claim 1, further comprising an opposing conductive pattern formed on an opposite surface of the boundary portion with respect to the conductive pattern on the surface of the boundary portion.

3. The wiring board according to claim 1, wherein the boundary portion has a width which is in a range of approximately 0.2 to approximately 2.0 mm.

4. The wiring board according to claim 1, further comprising a plurality of through-hole conductors formed in the boundary portion such that the through-hole conductors are penetrating through the substrate, wherein at least one of the through-hole conductors is not electrically connected to terminals of the electronic devices.

5. The wiring board according to claim 1, further comprising a first via conductor formed in the insulation layer such that the first via conductor is electrically connected to the conductive pattern on the boundary portion.

6. The wiring board according to claim 1, further comprising:
a first via conductor formed in the insulation layer such that the first via conductor is stacked on the through-hole conductor.

7. The wiring board according to claim 6, further comprising a second via conductor formed in the insulation layer such that the second via conductor is positioned to be connected to an electrode of one of the electronic devices, wherein the electrode of the one of the electronic devices is electrically connected to the through-hole conductor through the first via conductor and the second via conductor.

8. The wiring board according to claim 1, wherein the boundary portion of the substrate has a substantially cruciform planar shape such that the boundary portion forms the plurality of opening portions consisting of four opening portions, and the conductive pattern on the boundary portion is a substantially cruciform conductive pattern formed on the boundary portion.

9. The wiring board according to claim 1, wherein the boundary portion of the substrate has a substantially T-shaped planar shape such that the boundary portion forms the plurality of opening portions consisting of three opening portions, and the conductive pattern on the boundary portion is a substantially T-shaped conductive pattern formed on the boundary portion.

10. The wiring board according to claim 1, wherein the plurality of electronic devices includes a first electronic device and a second electronic device, each of the first electronic device and the second electronic device has a first side electrode on a first side surface and a second side electrode on a second side surface on an opposite side with respect to the first side surface, and the first electronic device and the second electronic device are positioned such that the first and second side electrodes of the first electronic device are arrayed in substantially a straight line with the first and second side electrodes of the second electronic device and that the first side electrode of the first electronic device and the first side electrode of the second electronic device face each other and have substantially a same electric potential.

11. The wiring board according to claim 1, wherein the plurality of opening portions in the substrate forms spaces with respect to the plurality of electronic devices positioned in the plurality of opening portions, respectively, and the spaces are filled with a resin derived from the insulation layer.

12. The wiring board according to claim 1, wherein the plurality of opening portions includes at least one opening portion having tapered surfaces defining a space of the at least one opening portion.

13. The wiring board according to claim 1, wherein the plurality of electronic devices includes a chip capacitor having a dielectric body and an electrode formed on the dielectric body such that the electrode extends from on an upper surface of the dielectric body to a lower surface of the dielectric body through a side surface of the dielectric body.

14. The wiring board according to claim 1, wherein the plurality of electronic devices includes an inductor.

15. The wiring board according to claim 1, wherein the substrate is an insulative substrate having a built-in metal sheet built in the insulative substrate.

16. The wiring board according to claim 1, wherein the conductive pattern on the boundary portion is electrically connected to one of a power-source terminal and a ground terminal of each of the electronic devices, and the through-hole conductor is electrically connected to the other one of the power-source terminal and the ground terminal of each of the electronic devices.

17. The wiring board according to claim 16, further comprising an opposing conductive pattern formed on an opposite surface of the boundary portion with respect to the conductive pattern on the surface of the boundary portion.

18. The wiring board according to claim 16, wherein the boundary portion has a width which is in a range of approximately 0.2 to approximately 2.0 mm.

19. The wiring board according to claim 16, further comprising a plurality of through-hole conductors formed in the boundary portion such that the through-hole conductors are penetrating through the substrate, wherein at least one of the through-hole conductors is not electrically connected to terminals of the electronic devices.

20. The wiring board according to claim 16, further comprising a first via conductor formed in the insulation layer such that the first via conductor is electrically connected to the conductive pattern on the boundary portion.

* * * * *